United States Patent
McArdle et al.

(10) Patent No.: US 6,977,025 B2
(45) Date of Patent: *Dec. 20, 2005

(54) METHOD OF FORMING A MONOLAYER OF PARTICLES HAVING AT LEAST TWO DIFFERENT SIZES, AND PRODUCTS FORMED THEREBY

(75) Inventors: Ciaran Bernard McArdle, Dublin (IE); Rory Brian Barnes, Dublin (IE)

(73) Assignee: Loctite (R&D) Limited, Dublin (IE)

( * ) Notice: Subject to any disclaimer, the term of this patent is extended or adjusted under 35 U.S.C. 154(b) by 183 days.

This patent is subject to a terminal disclaimer.

(21) Appl. No.: 10/388,441

(22) Filed: Mar. 17, 2003

(65) Prior Publication Data

US 2003/0180508 A1 Sep. 25, 2003

Related U.S. Application Data

(63) Continuation-in-part of application No. 10/059,435, filed on Jan. 31, 2002, which is a continuation-in-part of application No. 09/515,687, filed on Feb. 29, 2000, now Pat. No. 6,402,876, which is a continuation of application No. 09/043,879, filed on Mar. 31, 1998, now Pat. No. 6,180,226, and a continuation of application No. 08/693,833, filed on Aug. 1, 1996, now Pat. No. 5,916,641.

(51) Int. Cl.$^7$ ................................ B32B 31/00

(52) U.S. Cl. ................ 156/272.2; 156/272.4; 156/275.5; 156/305; 156/285; 156/274.4; 156/247; 156/275.3; 427/128; 427/130; 427/131; 427/180; 427/487; 427/595; 427/598

(58) Field of Search .................. 156/272.2, 247, 156/272.4, 305, 275.5, 285, 274.4; 427/487, 128, 130, 131, 180, 496, 595, 598

(56) References Cited

U.S. PATENT DOCUMENTS 3,359,145 A  12/1967  Salyer er al. ............... 156/1
3,661,744 A   5/1972  Kehr et al. ............ 204/159.14

(Continued)

FOREIGN PATENT DOCUMENTS

EP   0 208 391   1/1987   ............ H01F/1/28
EP   0 232 127   8/1987   ........... H01R/23/68

(Continued)

OTHER PUBLICATIONS

"Aggregation Processes in Solution", E. Wyn–Jones, J. Gormally Ch. 18, p. 509.

(Continued)

*Primary Examiner*—Merrick Dixon
(74) *Attorney, Agent, or Firm*—Steven C. Bauman

(57) ABSTRACT

The invention provides a method of forming a monolayer of substantive particles including the steps of applying to a substrate a curable composition having substantive particles contained therein, the substantive particles having a particle size on at least one dimension thereof of at least 1 micrometer and being in two or more groups of different sizes; exposing the substantive particle-containing curable composition to a source of energy suitable for effecting polymerization of the curable composition for a sufficient time to effect polymerization of a layer of the curable composition having a thickness of no more than 50% of the height of the largest substantive particles; and optionally, removing uncured curable composition. The invention also provides a method of forming a monolayer of substantive particles in a non-random array where the curable composition comprises a ferrofluid composition. The latter method further comprises the step of subjecting the particle-containing curable ferrofluid composition to a magnetic field for a sufficient time to array the particles in a non-random manner in the composition prior to the exposure.

25 Claims, 15 Drawing Sheets

U.S. PATENT DOCUMENTS

| | | | |
|---|---|---|---|
| 3,898,349 A | 8/1975 | Kehr et al. | 427/36 |
| 3,917,538 A | 11/1975 | Rosensweig | 252/62.51 |
| 4,008,341 A | 2/1977 | Kehr | 427/44 |
| 4,092,376 A | 5/1978 | Douek et al. | 260/884 |
| 4,100,088 A | 7/1978 | Haas et al. | 252/62.52 |
| 4,170,677 A | 10/1979 | Hutcheson | 428/119 |
| 4,215,209 A | 7/1980 | Ray-Chaudhuri | 526/292 |
| 4,368,131 A | 1/1983 | Rosenweig | 252/62.55 |
| 4,430,239 A | 2/1984 | Wyman | 252/62.51 |
| 4,548,862 A | 10/1985 | Hartman | 428/323 |
| 4,604,229 A | 8/1986 | Raj et al. | 252/510 |
| 4,644,101 A | 2/1987 | Jin et al. | 178/18 |
| 4,645,611 A | 2/1987 | Campbell et al. | 252/62.51 |
| 4,698,907 A | 10/1987 | Soszek | 29/846 |
| 4,701,276 A | 10/1987 | Wyman | 252/62.52 |
| 4,737,112 A | 4/1988 | Jin et al. | 439/66 |
| 4,740,657 A | 4/1988 | Tsukagoshi et al. | 174/88 |
| 4,741,850 A | 5/1988 | Wyman | 252/62.52 |
| 4,808,638 A | 2/1989 | Steinkraus et al. | 522/24 |
| 4,846,988 A | 7/1989 | Skjeltorp | 252/62.52 |
| 4,855,079 A | 8/1989 | Wyman | 252/62.52 |
| 4,867,910 A | 9/1989 | Meguro et al. | 252/519 |
| 4,935,147 A | 6/1990 | Ullman et al. | 210/695 |
| 4,938,886 A | 7/1990 | Lindsten et al. | 252/62.51 |
| 4,946,613 A | 8/1990 | Ishikawa | 252/62.52 |
| 4,963,220 A | 10/1990 | Bachmann | 156/307.3 |
| 4,965,007 A | 10/1990 | Yudelson | 252/62.53 |
| 4,992,190 A | 2/1991 | Shtarkman | 252/62.52 |
| 4,997,717 A | 3/1991 | Rembold | 478/413 |
| 5,064,550 A | 11/1991 | Wyman | 252/62.52 |
| 5,075,034 A | 12/1991 | Wanthal | 252/511 |
| 5,076,950 A | 12/1991 | Ullman et al. | 252/62.51 |
| 5,084,490 A | 1/1992 | McArdle et al. | 522/181 |
| 5,085,789 A | 2/1992 | Yokouchi et al. | 252/62.52 |
| 5,124,060 A | 6/1992 | Yokouchi et al. | 252/62.51 |
| 5,128,215 A | 7/1992 | Pendergrass, Jr. | 428/694 |
| 5,141,970 A | 8/1992 | McArdle et al. | 522/170 |
| 5,147,573 A | 9/1992 | Chagnon | 252/62.52 |
| 5,167,850 A | 12/1992 | Shtarkman | 252/62.52 |
| 5,180,888 A | 1/1993 | Sugiyama et al. | 174/94 |
| 5,221,417 A | 6/1993 | Basavanhally | 156/629 |
| 5,346,558 A | 9/1994 | Mathias | 148/23 |
| 5,349,478 A | 9/1994 | Sato et al. | 360/55 |
| 5,366,140 A | 11/1994 | Koskenmaki et al. | 228/246 |
| 5,380,549 A | 1/1995 | Harvison | 427/137 |
| 5,382,373 A | 1/1995 | Carlson et al. | 252/62.55 |
| 5,438,223 A | 8/1995 | Higashi et al. | 257/774 |
| 5,486,427 A | 1/1996 | Koskenmaki et al. | 428/546 |
| 5,769,996 A | 6/1998 | McArdle et al. | 156/272.4 |

FOREIGN PATENT DOCUMENTS

| | | | |
|---|---|---|---|
| EP | 0 299 618 | 1/1989 | H01F/1/08 |
| EP | 0 330 452 | 8/1989 | C09J/7/02 |
| EP | 0 402 546 | 12/1990 | H05K/3/12 |
| EP | 0 549 159 | 6/1993 | H01R/4/04 |
| EP | 0 691 660 | 1/1996 | H01B/1/22 |
| GB | 919502 | 2/1963 | |
| JP | 57-85873 | 5/1982 | C09J/3/14 |
| JP | 61-189607 | 8/1986 | |
| JP | 61-231066 | 10/1986 | C09J/3/00 |
| JP | 61-276873 | 12/1986 | C09J/3/00 |
| JP | 61-277179 | 12/1986 | H01B/5/16 |
| JP | 61-287974 | 12/1986 | C09J/3/00 |
| JP | 62-127194 | 6/1987 | B23K/35/40 |
| JP | 63-164180 | 7/1988 | H01L/21/60 |
| JP | 01-54085 | 3/1989 | C09J/3/00 |
| JP | H3-95298 | 4/1991 | C10M/169/04 |
| JP | 6-122857 | 5/1994 | C09J/9/02 |
| WO | 93/01248 | 1/1993 | C09J/163/00 |
| WO | 95/18476 | 7/1995 | H01R/13/24 |
| WO | 95/20820 | 8/1995 | H01F/1/44 |

OTHER PUBLICATIONS

Babiarz, "Chip Size Packaging", Advanceed Packaging, May/Jun. (1995).

R.N. Berlund et al, "Generation of Monodisperse Aerosol Standards", Environmental Sci. and Tech. 7(2) p. 147 (1973).

T. G. Cardenas, "Synthesis and Molecular Weights of Metal Polyacrylonitriles", *Polymer Bull.*, 26, 611 (1991).

T. G. Cardenas, "Synthesis and Molecular Weights of Metal (Styrene–Methacrylate) Copolymer. III", *Polymer Bull.*, 27, 383 (1992).

Dyno Particles Brochure on Polymer Particles, Oct. 1991.

Ferrofluidics Corporation Technology Note, Date Unknown.

S. W. Charles and J. Popplewell, Ferromagnetic Materials, E. P. Wohlfarth ed., vol. 2, ch.8, p. 509, A. Martinet Elsevier Sci. Publishing Co. (1983).

"Fluid Has World's Highest Magnetic Fl lux Density", J. Elect. Eng., 27 (280, 64–66 (Apr., 1990).

Hitachi Chemical Data Sheet, Specification of Anisolm AC 6073 (May 20, 1991).

P. B. Hogerton, "Development Goals and Present Status of 3M's Adhesive Interconnection Technology", *J. Elect. Man.*, 3, 191–97 (1993).

C. Holman, "Pilot Plant Helps Abtestik in Development of Specialized Tapes", Adhesives Age, 30–31 (Jan. 1995).

K. Holmberg, "Novel Surfactants for Paints", *Surface Coatings Int'l* (12) 481 (1993).

D. D. Thaompson, "Liquid Mangnetic Bubble Display", *IBM Tech. Discl. Bull.*, 17(6), 1842–43 (Nov. 1974).

S. Jin et al, " Anisotropically Conductive Polymer Films With a Uniform Dispersion of Particles", *IEEE Transactions on Components, Hybrids and Man. Tech.*, 16(8) 972–977 (1993).

E. Kim et al, "Two– and Three–Dimensional Crystalization of Polymeric Microspheres by Micromolding in Capillaries", *Adv. Mat.*, 8(3), 245–47 (1996).

K. J. Klabunde et al, "Colloidal Metal Particles Dispersed in Monomeric and Polymeric Styrene and Methyl Methacrylate", *Chemistry of Materials* 1, 481 (1989).

K. Kopcansky et al, "The Observation of Various Structures of Magnetic Particles and Magnetic Holes in Ferrofluids", *Acta Phys. Slov.*, 39(4), 259 (1989).

J. Liu, "Application of Anistropically Conductive Adhesives and Films as Surface Mount Solder Joints Substitute—'a Survey' ", IVF–Internal Report 91/04, 32–36 (1991).

Lyons & Dahringer, *Handbook of Adhesives Technology*, Pizzi & Mittal, eds., p. 578 (1994).

C. McArdle et al, "Novel Uniaxial Conductive Adhesives Polymerisable Ferrofluids and Conductive Magnetic Holes", *Proc. Adh. in Elect.*, Stockholm, Sweden, Jun. 3–5 (1996).

Y. Nakao, "Preparation and Characterization of Noble Metal Solid Sols in Poly(methyl methacrylate)", *J. Chem. Soc. Chem. Commun.*, 826 (1993).

Y. Nakao and K. Kaeriyama, "Preparation of Noble Metals Sols in the Presence of Surfactants and Their Properties", *J. Colloid Interface Sci.*, 110(1), 82 (1986).

A. O. Ogunjimi et al, "A Review of the Impact of Conductive Adhesive Technology on Interconnection", *J. of Elect. Manu.*, 2, 109–118 (1992).

J. Popplewell et al., "Microwave Properties of Ferrofluid Composites", *J. Magnetism and Magnetic Materials*, 54–57, 761 (1986).

A. V. Rao et al., "Evolution of Polymerisable Surfactants", *Paint and Ink Int'l*, 15 (1995).

J. O. Reilly et al., Anisotropic Adhesive Progress Report, Apr. 5, 1993.

P. Rios et al., "Poly(butadiene–acrylic Acid(g)acrylonitrile-(g)acrylic acid)", *Poly Bull.*, 31, 293–96 (1993).

R. E. Rosensweig, "Magnetic Fluids" *Ann. Rev. Fluid Mech.*, 19, 437–63 (1987).

S. J. Shaw, "Epoxy Resin Adhesive" in *Chemistry and Technology of Epoxy Resins*, B. Ellis, ed., ch. 7 p. 206, Blackie Academic and Professional (1993).

N. Shiozawa, "Electric Properties of Connections by Anisotropic Conductive Film", First Int'l Conf. on Adhesive Joining Technology in Electronics Mfr., Berlin, Nov. '94.

A. T. Skeltorp et al., "Condensation and Ordering of Colloidal Spheres Dispersed in a Ferrofluid", *Physica A*, 176, 37 (1991).

A. T. Skjeltorp, "Monodisperse Particles and Ferrofluids: A Fruit–Fly Model System", *J. Magnetism and Magnetic Materials*, 65, 195–203 (1987).

A. T. Skjeltorp, "One– and Two–Dimensional Crystallization of Magnetic Holes", Physical Review Letters, 51(25) 2306–09, (1983).

A. T. Skjeltorp, "Ordering Phenomena of Particles Dispersed in Magnetic Fluids", J. Appl. Phys., 57(1), 3285–89 (1985).

A. T. Skjeltorp, "Colloidal Crystals in Magnetic Fluid", *J. of Appl. Phys.*, 55(6), pt. 2B, 2587–88 (1984).

P. Soszek, "Two Novel Additive Processes to Create Circuitry: Direct Laser Writing and Direct Electrostatic Transfer Deposition", *Circuit World*, 19(4), 12–15 (1993).

ThreeBond Co. Brochure, ThreeBond 3300 Series, Conductive Resin Adhesive, Paste and Coating Material.

ThreeBond Co. Brochure, ThreeBond 3370 Anisotroically Electroconductive Adhesive Film.

D.J. Williams et al, "The Effects of Conducting Particle Distribution on the Behavior of Anistropic Conducting Adhesives: Non–Uniform Conductivity and Shorting Between Connections", *J. of Elect. Manuf.*, 3, 85–94 (1993).

H. F. Wu et al., "Effect of Surfactant Treatments on Interfacial Adhesion in Single Graphite/Epoxy Composites," *Polym. Composites* 12(4), 281 (1993).

METHOD OF FORMING A MONOLAYER OF PARTICLES HAVING AT LEAST TWO DIFFERENT SIZES, AND PRODUCTS FORMED THEREBY

RELATED U.S. APPLICATION DATA

This application is a continuation-in-part of U.S. patent application Ser. No. 10/059,435, filed Jan. 31, 2002, which is a continuation-in-part of U.S. patent application Ser. No. 09/515,687, filed Feb. 29, 2000 (now U.S. Pat. No. 6,402,876, issued Jun. 11, 2002), which is a continuation of U.S. patent application Ser. No. 09/043,879 filed Mar. 31, 1998 (now U.S. Pat. No. 6,180,226 issued Jan. 30, 2001), and is a continuation of U.S. patent application Ser. No. 08/693,833, filed 1 Aug. 1996, (now U.S. Pat. No. 5,916,641, issued Jun. 29, 1999); the disclosure of all of the foregoing is expressly incorporated herein by reference.

BACKGROUND OF THE INVENTION

1. Field of the Invention

This invention relates to a method of forming monolayers, particularly patterned monolayers, of particles in two or more groups of different particle sizes, and to products formed thereby. It is particularly concerned with forming an ordered array of such particles in a monolayer, particularly a patterned monolayer, which may be incorporated into a film. Films formed by the inventive method usually have anisotropic conductive pathways formed by ordered arrays of conductive particles, and are especially useful in interconnection technology in the electronics industry. The invention further relates to a method of forming a film having a monolayer of substantive particles therein, where the particles are in two or more groups of different sizes and particularly where the arrays of particles are arranged in a pattern. When the arrays of particles are arranged in a pattern, the pattern of the particles may be specifically designed according to the end user's requirements.

The invention is also useful in other fields of technology and may be applied to particles, which are not electrically conductive.

2. Brief Description of Related Technology

Anisotropically-conductive adhesives and the ordering of "magnetic holes" in ferrofluids is discussed in International Patent Publication No. WO 95/20820 ("the PCT '820 publication"), the disclosure of which is expressly incorporated herein by reference.

Japanese Patent Document No. JP 62-127 194 of Fujikura Cable Works KK describes the production of anisotropic conductive solder sheets by forming an adhesive coating having a thickness of less than 10 micrometers on a support film, applying soft solder powder having a grain size of 10–50 micrometers onto the adhesive coating, and filling the spaces between granules of the solder with a plastic material. It is stated that the soft solder granules can be evenly dispersed in the plastic material on the film. However, application of particles onto an adhesive film to which the particles adhere on contact is not believed likely to achieve satisfactory dispersion or ordering of the particles in the plane of the film.

European Patent Document No. EP 0 691 660 A1 of Hitachi Chemical Co. Ltd. ("the EP '660 publication") describes an anisotropically electro-conductive film material produced by adhering electro-conductive particles to an adhering layer formed on a support and fixing the particles therein, and then introducing a film-forming resin incompatible with the adhering material between the electro-conductive particles, the film material having electro-conductivity only in the film thickness direction via the electro-conductive particles uniformly dispersed in the plane direction. The particles may be arranged in a grid or zig zag pattern in the plane by means of a film, net or screen having holes therein ("screen"), through which the particles are fixed on the adhering layer. The particles and the screen may be electrostatically charged with different electric charges. However problems exist in the use of such a screen, including difficulty in producing and handling thin screens, and making the desired patterns of holes. An individual screen would be required for each pattern. Also it would be difficult to (1) ensure that all of the holes are filled by particles and (2) guard against clogging of at least some of the holes by the adhesive material. Removal of the screen may also cause disruption of the pattern. The use of electrostatic charging would be a complex procedure involving large electrical fields.

U.S. Pat. No. 5,221,417 (Basavanhally) describes the use of photo-lithographic masking and etching to form a matrix array of mutually isolated ferromagnetic elements. These elements are magnetized and a single layer of conductive ferromagnetic particles is adhered to an upper surface of each of the ferromagnetic elements, so that the conductive particles are in an array. The layer of particles is then contacted with a layer of soft adhesive polymer to cause penetration of the particles into the polymer. The adhesive polymer is then hardened to assure containment of the particles in the polymer. The adhesive polymer containing the conductive particles is used for interconnecting conductor arrays. However, it is believed that this technique may be used only with conductive particles which are ferromagnetic. Such particles may be difficult to obtain in specific shapes, sizes and types (e.g., monodisperse spheres.)

Japanese Patent Document No. JP 3-95298 discloses a conductive and magnetic fluid composition comprising colloid ferromagnetic particles and conductive particles dispersed in a carrier organic solvent.

U.S. Pat. No. 4,737,112 discloses an anisotropically conductive composite layer medium comprising electrically conductive magnetic particles in a non-conductive matrix. The particles are aligned via the interaction of an applied magnetic field with the electrically conductive particles. The invention relies on the use of magnetic particles as the conductors, and so has no utility in the preparation of ordered arrays of non-magnetic and substantially non-magnetic particles or in the preparation of systems in which ordered arrays are transferred from one substrate to another.

In the PCT '820 publication, a composition is described which includes: (i) a ferrofluid of a colloidal suspension of ferromagnetic particles in a non-magnetic carrier liquid, and (ii) electrically-conductive particles having substantially uniform sizes and shapes, dispersed in the ferrofluid.

The average particle size of the electrically conductive particles is at least 10 times that of the colloidal ferromagnetic particles. The non-magnetic carrier liquid may be curable or non-curable. Examples of the liquid include a curable liquid composition, a mixture of a curable liquid composition and a liquid carrier in which the ferromagnetic particles have been suspended, or a non-curable carrier liquid, provided the electrically-conductive particles have a latent adhesive property.

In the PCT '820 publication, a method of making an anisotropically-conductive bond between two sets of conductors is also described. The method includes applying to one set of conductors a layer of an adhesive composition of the composition so described; bringing a second set of conductors against the layer of adhesive composition; exposing the layer of adhesive composition to a substantially uniform magnetic field such that interaction between the ferrofluid and the electrically-conductive particles causes the electrically-conductive particles to form a regular pattern of particles each in electrical contact with an adjacent particle and/or with a conductor in one or both sets whereby conductive pathways are provided from one set of conductors to the other set, each pathway including one or more of the electrically-conductive particles; and curing the composition to maintain the pattern in position and to bond the conductors.

It may not however always be convenient to install a means for creating a magnetic field at the location of assembly of two sets of conductors. Therefore, in European Patent Document No. EP 757 407 ("the EP '407 publication"), the disclosure of which is incorporated herein by reference, other ways are described of achieving the benefits of the invention of the PCT '820 publication.

The EP '407 publication describes an anisotropically-conductive film or a substrate having a surface coated with an anisotropically-conductive coating. The film or coating is formed by solidifying a composition which includes a solidifiable ferrofluid composition and electrically-conductive particles dispersed in the ferrofluid. The ferrofluid includes a colloidal suspension of ferromagnetic particles in a non-magnetic carrier. The electrically-conductive particles having been arrayed in a non-random pattern by application of a substantially uniform magnetic field to the composition in a liquid state and have been locked in position by solidification of the composition.

The EP '407 publication also describes a solid-form anisotropically-conductive film or a substrate having a surface coated with a solid-form anisotropically-conductive coating the film or coating includes a composition containing colloidal ferromagnetic particles and electrically-conductive particles arrayed in a non-random pattern.

The term "ferromagnetic" as used herein includes ferrimagnetic materials such as ferrites.

The term "solidifiable" as used herein means capable of existing as a solid at ambient temperatures (e.g., temperatures less than about 40° C., usually about 20–30° C.). Solidifiable compositions include curable compositions which cure to solid form by heat treatment or otherwise. The word "solid" as used in the EP '407 publication and also herein means stable in shape and includes a gel or polymer network.

The inventions of the PCT '820 publication and the EP '407 publication were a significant breakthrough in the uniform dispersion of conductive particles and address the issue of particle aggregation and the consequences in fine pitch electronic interconnection [cf. U.S. Pat. No. 5,221,417 (Basanvanhally)]. However, the preparation of a curable particle-loaded ferrofluid adhesive composition compromises between the ferrofluid character of the composition, including high magnetization saturation and low viscosity at room temperature for rapid ordering of the particles, and the adhesive character of the composition, including the use of medium to high molecular weight systems having relatively high viscosity, to impart good mechanical properties and functionality to the cured adhesive.

U.S. patent application Ser. No. 09/143,879 filed Aug. 1, 1997 ("the '879 application"; now issued as U.S. Pat. No. 6,180,226) describes methods for producing monolayered random and ordered arrays of particles which are maintained in place by use of a cured tack layer. These methods employ a curable matrix in which the particles are dispersed and the curable matrix is partially cured to form a thin film which maintains the particles in place but does not substantially encase the particles. The methods of the '879 application are also described in U.S. patent application Ser. No. 10/059,435 filed Jan. 31, 2002 ("the '435 application"), which contains Examples 1–27 and FIGS. 1–11(b) of the '879 application. The '435 application describes a further example of the methods of the '879 application for producing monolayered random and ordered arrays of particles in patterns such as in discrete regions on a substrate.

It would be desirable to provide ways in which monolayers, including patterned monolayers, of dispersed or ordered arrays of particles may be prepared as well as films prepared therefrom which are easy, fast and employ readily available, easy to manufacture components and which allow for the reuseability/recovery of materials such as in particular expensive and/or government-regulated materials.

It would be particularly desirable to provide a method for forming monolayers of dispersed or ordered arrays of particles and films containing the arrays which allows for the recovery of unused or unuseable (e.g., in the end-use application of the array) materials such as the particles forming the array for example gold microparticles. The materials employed and in particular the particles used can be relatively expensive and accordingly it would be desirable to provide a method whereby unnecessary waste of such expensive materials and additional recovery costs of the materials is at least reduced, is desirably minimised and ideally avoided.

It would also be desirable to prepare stable monolayers, including patterned monolayers, of particles and arrays of particles and films prepared therefrom which are free or substantially free of ferromagnetic particles and which contain random and ordered arrays of particles with improved physical and performance characteristics, e.g., improved strength and/or adhesiveness as well as transparency or translucency, and the like.

It would also be particularly desirable to produce a substrate such as a film having monolayered random or ordered arrays of particles, including particles arranged in a repeated pattern, for example, repeated geometric shapes such as circular, square, or rectangular arrays of particles.

The '879 application and the '435 application [particularly Example 9 and FIGS. 11(a) and (b) in both applications] describe the application of a particle-containing ferrofluid adhesive formulation to a substrate and the placing of a second substrate over the top of the ferrofluid film. The assembled film is then compressed. Not only does the compression aim to achieve a substantially uniform fluid film, but pressure is applied which produces a fluid layer between the substrates such that the liquid layer is less than two particle diameters in thickness. This situation is referred to as a monolayer of particles.

In the '435 application, more particularly in Example 28, the compression apparatus for forming the monolayer is a laminating nip in which a plastic web (substrate) carrying the particle-loaded ferroadhesive mixture is brought together with another plastic web moving under identical tension and at the same speed. A confined monolayer of particles results due to the pressure of the laminating nip that brings the two webs together.

It is desirable to have a high density of separated substantive particles per unit area of the film. For this purpose, it is also desirable to use particles of small diameter, e.g., in the range from 2–6 micrometers, particularly 3–5 micrometers. However it has been found difficult to obtain a high density when compression is being used, particularly in a continuous lamination process, to achieve a substantially uniform fluid film between two substrates, prior to polymerization of the "tack layer". In particular, when using the initial laminating nip described in the '435 application, it has been found that if the ferroadhesive is overloaded with particles, a build-up of substantive particles forms at the nip that subsequently causes uneven concentrations of particles on the web. For example, when the particles are spheres with a diameter of 5 micrometers, a 35% w/w concentration of particles in the ferroadhesive formulation can cause overloading of the laminating nip.

It is desirable to identify a method of forming a monolayer of particles with an increased density for a specific small particle as compared to that achieved hitherto and/or by use of a lower concentration of particles in the curable composition than was necessary to achieve a desired high density by methods used hitherto.

The '879 application and the '435 application both disclose that particles of two or more groups of different sizes but of substantially uniform size within the group of larger size may be used.

SUMMARY OF THE INVENTION

The invention provides methods for producing monolayered random and ordered arrays of particles which are maintained in place by use of a cured tack layer, where particles of two or more groups of different sizes but of substantially uniform size within the group of larger size are used. These methods employ a curable matrix in which the particles in groups of two or more different sizes are dispersed and the curable matrix is partially cured to form a thin film which maintains the particles in place but does not substantially encase the particles.

The present invention provides a method of forming a monolayer of substantive particles, the method comprising the steps of:

(a) applying to a substrate a curable composition having substantive particles contained therein, the substantive particles having a particle size on at least one dimension thereof of at least 1 micrometer and being in two or more groups of different sizes;

(b) applying a second substrate over the curable composition to confine the curable composition between the substrates;

(c) applying pressure to the assembled substrates to produce a monolayer of particles of the different sizes;

(d) exposing the substantive particle-containing curable composition to a source of energy suitable for effecting polymerization of the curable composition for a sufficient time to effect polymerization of a layer of the curable composition having a thickness of no more than 50% of the height of the largest substantive particles; and (e) optionally, after separation of the substrates, removing uncured curable composition.

Normally the curable composition is exposed to a source of energy on one side of the assembly, the substrate on that side of the assembly being transparent to the energy used for effecting polymerization.

The particles are in at least two groups of different sizes, a group of larger size and a group of smaller size. The "tack layer" formed by curing of the curable composition should have a thickness sufficient to maintain the particles belonging to the group of smaller size in place. Because of the presence of the larger particles, the smaller particles are likely to be spaced from the substrate, whereas the particles of larger size are likely to be substantially in contact with the substrate. Therefore when partial polymerization is initiated from one side of the assembly and a tack layer is formed, a thickness of the tack layer that is sufficient to maintain the smaller particles in place should also lock the larger particles in position.

According to one feature of the invention, the particles of larger size are harder or less compressible than the particles of smaller size. However it is desirable that the particles of larger size can flex somewhat in the laminating nip. For example, when using a spherical particle having a diameter of 4.6 to 5 micrometers, the diameter reduction on compression in the laminating nip may suitably range from about 0.2 to about 1.0 micrometers.

When under pressure, the larger particles should have a size that is less than twice that of the smaller particles so that a monolayer of both groups of particles is formed. For example if both groups of particles are spherical, the diameter of the larger particles should be less than twice the diameter of the smaller particles. In particular embodiments, larger particles of 4.6 or 5.0 micrometers diameter may be used with smaller particles, such as of 3 micrometers diameter, or larger particles, such as of 7.25 micrometers diameter, may be used with smaller particles, such as of 4.6 or 5 micrometers diameter.

Although the invention is not limited by any theory, it is believed that the particles of larger size act as "spacers" during formation of the monolayer by application of pressure, so that a higher loading of the particles of smaller size can be maintained. In particular, when using a laminating nip, the particles of larger size are believed to keep the rollers of the nip spaced sufficiently to allow a high concentration of particles of smaller size to pass through unimpeded. In use of a film carrying particles of different sizes for interconnection, e.g., between electronics components, it is believed that the particles of larger size are crushed or compressed to a height similar to that of the particles of smaller size. The particles of larger size may therefore be regarded not only as "spacers" in the laminating process but also as "sacrificial" particles in end-use.

While the particles in the group of larger size are of substantially uniform size, the particles of smaller size may be in two or more groups or may vary in size within the range below that of the particles of larger size. The particles of larger size may suitably be in the range from about 4 to about 10 micrometers, while the particles of smaller size may suitably be in the range from about 2 to about 5 micrometers (provided that they are smaller than those of the larger size). In preferred embodiments, the particles of larger size are of about 4.5 to about 7.5 micrometers, while the particles of smaller size are of about 3.0 to about 5.0 micrometers. In the case of spherical particles, the above-mentioned measurements refer to the diameter.

The particles of larger size may conveniently be either spherical or non-spherical. Non-spherical particles, for example cylindrical particles or chopped fiber, may be used as inexpensive "spacers" which may be conductive or non-conductive and which can be sacrificed in the end-use.

A particular mode employing larger particles in a sacrificial sense can also be realised by use of uncoated larger particles of lightly crosslinked or uncrosslinked polymeric material that may be subsequently dissolved selectively, for example in on-line processing during removal of uncured material by a solvent spray. In this case such particles serve the function of spacing the laminate during formation of a monolayer of particles whose thickness is determined by the diameter of the larger particle thereby permitting unimpeded access to the smaller particles. After performing this role, the larger uncoated (non-conductive) particles are redundant and may be removed by dissolution. The smaller particles remain in place after solvent development because they are crosslinked and metal coated and therefore insoluble in the developing solvent.

The concentration of substantive particles in the curable matrix may suitably be in the range from about 20 to about 50% w/w, particularly in the range from about 35% to about 50% w/w. The concentration of smaller particles may suitably be in the range from about 20 to about 30% w/w.

The density of particles in a film produced by the "mixed particle" method of the invention using smaller particles of about 3 micrometers diameter may suitably be at least about 15,000 particles/mm$^2$, particularly in the range from about 15,000 to about 30,000 particles/mm$^2$, especially from about 20,000 to about 25,000 particles/mm$^2$.

Particles with a diameter of 3 micrometers are capable of providing high particle density coverage even when used alone, albeit when present at higher concentrations in the curable composition than when used in admixture with larger particles. A possible disadvantage of using such small particles, however, relates to the quality of the parts being assembled. Thus, for example, in chip assembly to conductive glass for flat panel display applications, the glass substrate is very flat to within fractions of one micrometer. The bumps on individual chips or between batches of chips may however vary in height by a micrometer or more. In some cases, therefore, it may be preferable to assemble chips with ACFs comprising particles larger than about 3 micrometer diameters to compensate for variable quality in this substrate.

When using the mixed particle method of the invention with a group of smaller particles of about 4.6 to about 5.0 micrometers diameter, the density achieved is significantly greater than was obtained using these particles alone and may suitably be at least about 9,000 particles/mm$^2$, particularly in the range from about 9,000 to about 12,500 particles/mm$^2$.

The invention is particularly applicable to the methods of the '435 application, which relates to methods for producing monolayered random and ordered arrays of particles in patterns such as in discrete regions on a substrate, for example patterned arrays of particles which are desirably maintained in place by use of a cured tack layer. These methods employ a curable matrix in which the particles are dispersed and the curable matrix is selectively and partially cured to form a thin film in selected regions which maintains the particles in place in those selected regions but does not substantially encase the particles.

While the monolayer itself, if ordered, could be considered to be a pattern (of substantive particles), the '435 application relates to patterning in the sense of having a pattern between loci of the particles. In other words the desire is to have discrete regions where the substantive particles occur and to have those discrete regions occurring in a predetermined format; suitably one which has an overall repetition, so that a pattern of discrete regions is formed, e.g., regions of particles each region being shaped to match that of a component where the regions are separated by regions where substantially no particles occur. In such an instance the separation between regions would usually match the separation of components, with both the components and the regions being in a repeated pattern.

The present invention also provides methods for producing substrates such as films from such particle-containing curable matrices where the particles are in two or more groups of different sizes and are held within a film. In these methods, the monolayers of particles may be backfilled with a film-forming material, which substantially encases and securely maintains in place the particles.

The present invention further provides a method of producing such ordered arrays, including patterned arrays, and films prepared therefrom, by use of a curable ferrofluid exposed to a magnetic field where the so-formed arrays and films are free or substantially free of ferrofluid or ferromagnetic particles. The particles may be selectively transferred from the cured ferrofluid to an adhesive or latent adhesive free of the ferromagnetic particles.

The present invention still further provides for the preparation of ordered arrays, including patterned arrays, and films containing the ordered array of particles by use of standard ferrofluids or ferrofluid waxes, where the ordered array is maintained in place by (1) pressing the patterned ordered array in the ferrofluid or ferrofluid wax and (2) then transferring it under pressure upon the particles, and optionally under heat, to an adhesive, latent adhesive or film-forming material.

In addition, the present invention also provides for monolayer random and ordered arrays of particles and films prepared therefrom in accordance with the methods disclosed herein.

The present invention also provides for an article having a support tape substrate and an ordered/unordered monolayer array, including a patterned array, of transferable particles in two or more groups of different sizes temporarily bound thereto, as well as to an article having a sequential laminae of a first substrate, an adhesive matrix entraining an ordered/unordered monolayer array of particles in two or more groups of different sizes and a second substrate joined to the first substrate by the adhesive matrix.

The invention pertains to a method of forming an anisotropic conducting bond between a first set of conductors and a second set of conductors.

In one aspect, the invention provides a method for the production of monolayered random and ordered arrays of particles in two or more groups of different sizes and a substrate, such as a film for example, having a repeated pattern of particle arrays. The method of forming a monolayer of substantive particles comprises the steps of applying to the substrate a curable composition having substantive particles in two or more groups of different sizes contained therein; selectively exposing discrete regions of the substantive particle-containing curable composition to a source of energy suitable for effecting polymerization of the curable composition such that discrete regions are created where curable composition remains substantially uncured.

Uncured curable composition can then optionally be removed from at least the discrete regions where the composition remains uncured. In particular uncured composition may be present above a tack layer created by the polymerisation and in the regions where the composition remains substantially uncured (no tack layer formed). In other words the method of the invention can be used to create areas where substantive particles are tacked to a substrate by a tack layer in some regions and remain untacked in others. One desired and achievable effect is to pattern the tacked (and untacked) regions to match the pattern of an array of components or such like. Normally the tacked regions would be replicated in a pattern, which matched a pattern of components such as for example where the components are provided on a substrate such as a film or other such substrate at regular spaced apart intervals (patterned). The uncured material can be recovered for re-use, while the substrate has substantive particles in a monolayer (desirably ordered but they may be unordered) array in selected regions on the substrate.

The selective exposure of the curable composition may be achieved by selectively blocking energy from the energy source or by intermittently energising and de-energising the energy source or by a combination of same.

Different patterns of the discrete regions of the tacked particles may be obtained by the method according to the invention. The pattern may be formed by the creation of discrete regions of tacked particles, which comprise for example longitudinal stripes of particle arrays. A substrate having a pattern comprising discrete regions of tacked particles bordered or interrupted, for example surrounded by regions substantially free from uncured curable composition containing untacked particles may be formed by removing uncured curable composition containing untacked particles, following selective exposure of the curable composition. Removal of untacked particles will then create regions substantially free of substantive particles so that areas where the substantive particles remain and areas where there are substantially no particles are created as desired. Once the substantive particles are removed the pattern of areas where there are particles and those where there are not can be repeated.

The selected pattern desirably extends over the substrate. Patterns may be obtained by additionally or alternatively intermittently energising and de-energising the energy source. Intermittent energising and de-energising may be carried out in addition to selectively blocking energy from the energy source. The pattern formed may be one with an uninterrupted array of tacked particles along the substrate (e.g., in the case of the longitudinal stripes above). Alternatively the tacked array may be interrupted with one or more transverse breaks across the substrate. In the case where transverse breaks are formed it is desired that the same pattern of tacked and untacked particles is repeated along the substrate. The number of repetitions can of course be selected, for example, it would be desirable to have at least 5 or more desirably at least 10 repetitions of the pattern and for mass production processes at least 50 if not at least 100 repetitions of the pattern.

Longitudinal breaks in the pattern are easily achievable by masking, e.g., by moving the substrate under a mask. In a system where there is no relative movement between the energy source and the substrate an additional mask or a mask used to create the longitudinal pattern may be employed to mask light traversely across the substrate. Where relative movement of the substrate and the energy source occurs it is more impractical to achieve the desired transverse uncured areas with masking. In such a case it is more readily achievable by "chopping" the energy source. Normally the radiation from the energy source will be arranged in the process so that a selected area of the substrate is exposed at any one time. Selectively blocking the radiation or intermittently interrupting the emission of radiation are possible ways of achieving the desired pattern.

The invention also provides a method for the production of monolayered random and ordered arrays of particles in two or more groups of different sizes where a film having a pattern of discrete regions of arrays of particles in a predetermined arrangement is produced. The method comprises applying to a substrate a curable composition having substantive particles contained therein; optionally selectively exposing at least discrete regions of the substantive particle-containing curable composition to a source of energy suitable for effecting polymerization of the curable composition; optionally removing uncured curable composition; and optionally selectively transferring particles held in the layer of polymerized composition to a second substrate.

The selective transfer may be achieved by selectively pressing particles held in the layer of polymerized composition onto the second substrate (where they are held in the same pattern). For example, the second substrate may contain stripes of adhesive on one surface thereof such that when the first substrate containing tacked particles held in the polymerized (tack) layer is pressed against the surface of the second substrate containing the stripes of adhesive, the tacked particles are removed from the first substrate and selectively transferred to those regions of the second substrate containing the adhesive. The adhesive on the second substrate can thus, as just demonstrated, be arranged in any desired pattern (areas of adhesive and areas with no adhesiveness) for transfer of particles.

The pattern of particle arrays may be selected according to the end user's specific requirements. Usually the pattern will be selected for interconnection technologies. For example, a film having a repeated pattern of particle arrays in a suitable geometric form or other desirable shape, such as a "picture frame format", may be produced. The term "picture frame format" is used to describe a discrete region of particle arrays which comprises the particles arrayed to form a perimeter which encloses a region of substrate which is substantially free from particles. Alternatively patterns of particle arrays comprising arrays of particles forming a partial perimeter around a region of substrate which is substantially free from particles may be achieved. In such cases the particle array may be a semi-circle shape, T-shape, U-shape, C-shape or horse-shoe shape and the like. Optionally the shape is itself segmented.

The method provided herein allows for the formation of a substrate having conductive particle arrays formed in a pattern. The monolayered and transferred particles may be selected by the transfer process such that for example the particles transferred only occupy areas that correspond to a peripheral region under modules to be attached. For example in a pattern comprising a boundary region of particles surrounding a region of substrate substantially free from particles, the boundary region containing the array of particles may be designed such that it fits the arrangement of conductive regions of the module so that conductivity from the particles to the conductive regions of the module is achieved. Conductivity capability is limited to those particular regions of the substrate containing particle arrays. Films containing such patterns are especially useful in interconnection technology, particularly in smart card assembly. For example it may be required to mount a chip module in an assembly such that input/output pads arranged in a peripheral pattern on the chip can be connected by way of the same peripheral format (picture frame format) of conductive particles. In some cases it may be desirable to have uninterrupted access to an active region in the center of the chip on its underside. For example the chip may be an optoelectronic device part of which may be receptive electromagnetic rays such as light. The device may alternatively have the capability of emitting rays from such a zone on the chip body. Conventional, unpatterned ACFs could be used to interconnect devices but the presence of conductive particles under the entire area of the chip body could impede access to electromagnetic radiation. A hole could be punched out of such an ACF to overcome this problem but this is undesirable. This option would lead to suboptimal bonding and protection for the device.

The pattern of the arrays may be designed in a manner to minimise waste when they are extracted from the film. Thus, a more efficient and cost effective process is provided. In short for optimum return and minimum wastage the ordered particles would only occur where they were required in the end-use application.

The methods of selective exposure of the curable composition described herein enable the production of substrates having a monolayer comprising random and ordered arrays of particles, in which the arrays of particles may be arranged in a pattern. The step of selectively blocking energy from the energy source enables the formation of patterns on the substrate comprising longitudinal stripes of arrays of particles (in particular where there is relative movement of the light source and the substrate).

The step of intermittently energising and de-energising the energy source (one method of intermittently irradiating) could be used in the formation of a pattern of arrays of particles which may comprise an uninterrupted array of tacked particles across the substrate. Alternatively the array may be interrupted with one or more transverse breaks across the substrate by combining the steps of selectively blocking energy from the energy source and intermittently irradiating for example by intermittently energising and de-energising the energy source.

Substrates, such as films, having the pattern of particle arrays formed by these methods are suitable for certain end user's requirements, particularly in the area of interconnection technology. In certain applications substrates having patterns comprising discrete regions of particle arrays are preferred. For example in smart card assembly it is desirable to have a film comprising a pattern of particle arrays which will allow limited conductivity in those discrete regions containing the particles. The method of selective transfer described herein allows tacked particles in the layer of polymerised composition on the first substrate to be selectively transferred to a second substrate.

The means of selective transfer may be varied as described above to produce substrates having monolayers comprising a pattern of particle arrays arranged to correspond to an array of components or such like. Selective transfer allows the production of substrates comprising patterns of particle arrays in which the arrays are in any desired shapes such as, for example, circles, squares, rectangles, semi-circles. Filled and unfilled shapes may be employed. In short the transfer method should allow for almost any conceivable shape of a transferred array of particles to be formed. The shape of the particle arrays may be chosen according to end user's specific requirements. Thus, selective transfer allows for a wider variety of types of patterns of particle arrays to be formed on substrates which may not be easily achieved by the methods of selectively blocking energy from the energy source or by alternatively or additionally intermittently energising and de-energising the energy source.

The invention will be more fully understood by a reading of the "Detailed Description of the Invention" together with the drawings.

BRIEF DESCRIPTION OF THE DRAWINGS

FIG. 13(II) shows selective transfer of discrete regions of a particle array on a first substrate to a second substrate by selective pressing.

DETAILED DESCRIPTION OF THE INVENTION

Figure 1:
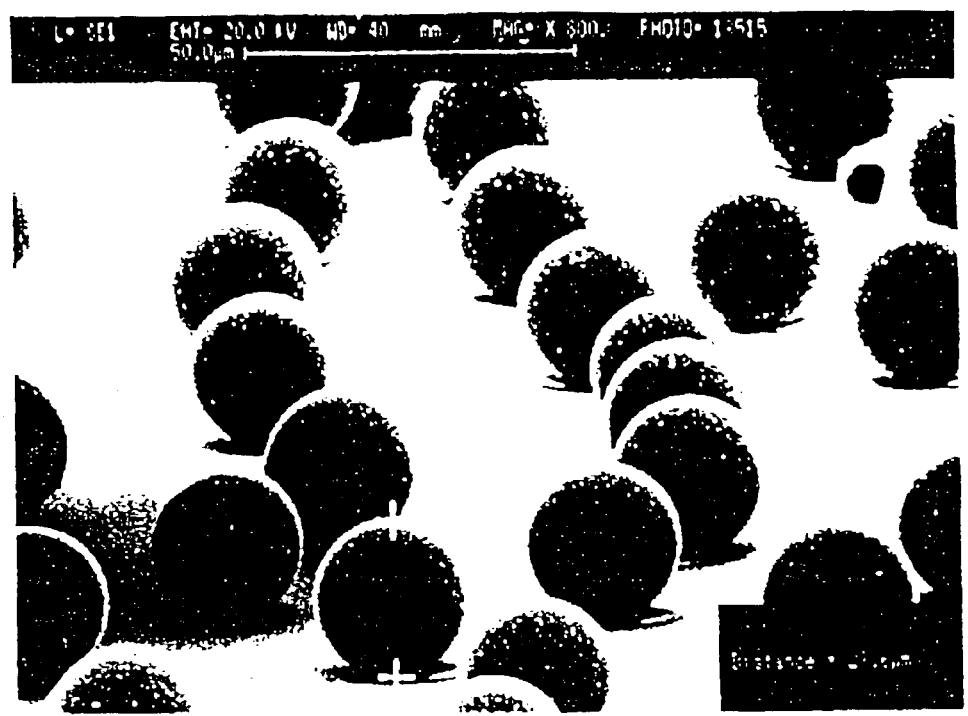
FIG. 1 is an electron micrograph at a magnification×800 of particles having a 25 micrometer diameter on a cured "tack layer" as described in Example 1. The distance between the "+" symbols is 23.6 micrometers.

The present invention provides generally methods of forming a monolayer of particles. The methods described below are particularly useful embodiments but it will be appreciated that the patterning described (if desired) may be achieved by one or more selective exposure methods, one or more selective transfer methods or by any combination of selective exposure methods; selective transfer methods; selective or non-selective exposure methods combined with selective or non-selective transfer methods as appropriate. When patterning is not desired, the methods may be adapted accordingly.

One such method ("method A") includes applying to a substrate a curable composition having substantive particles contained therein having a particle size on at least one dimension thereof of at least 1 micrometer; and selectively exposing discrete regions of the substantive particle-containing curable composition to a source of energy suitable for effecting polymerization of the curable composition for a sufficient time to effect polymerization of a layer of the curable composition in the discrete regions having a thickness of no more than about 50% of the height of the largest substantive particles thus also creating regions where the curable composition remains substantially uncured; optionally, the method also includes removing the uncured curable composition, from the uncured regions and optionally additionally from the cured regions if any remains in the cured regions. Removal of the uncured material is particularly desirable as removal of untacked substantive particles also occurs. It is desirable only particles held in the desired array remain on the substrate.

The source of energy for effecting cure or polymerization may suitably be any source of electromagnetic heat radiation or particularly actinic radiation, including ultraviolet (UV), infra red, visible, X-ray or gamma ray, E-beam or microwave. The time of exposure should be chosen by those persons skilled in the art, depending upon the source of energy, the exposure conditions, the depth of cure desired, the properties of the curable composition (such as, its ability to absorb of the chosen energy) and the structure confining the composition. In the case of UV light, an exposure time of about 0.1 to about 1 seconds may suffice. Desirably, the exposure time should be the minimum required to produce a layer or film of cured material in which the particles are maintained. This layer or film is referred to as the "tack layer", and the tack layer with the particles attached thereto is referred to as the "tacked array", both of which are distinguished from, although may be a part of, the particle containing film, referred to as the "film", which is produced in accordance with the methods of the present invention. It is patterning of the tacked array that is one of the main objectives of the present invention.

The particles employed in the present invention should have a particle size of at least one micrometer on at least one dimension thereof. These particles are referred to as "the substantive particles".

In various aspects, the invention provides:

B. A method of forming a film having a monolayer of particles contained therein. This method includes applying to a substrate a curable composition containing particles having a particle size of at least one dimension thereof of at least 1 micrometer; selectively exposing discrete regions of the particle-containing curable composition to a source of energy suitable for effecting polymerization of the curable composition for a sufficient time to effect polymerization of a layer of the curable composition in the discrete regions having a thickness of no more than about 50% of the height of the largest particles thus also creating regions where the curable composition remains substantially uncured; removing the uncured curable composition; and applying a film-forming material to fill the interstitial spaces between the particles. The so-applied film-forming material may also cover areas of the substrate flanking the particles to a film-thickness similar to that of the particle-containing areas. In addition, the film-forming material may be at least partially solidified, also the so-formed film may be removed from the substrate.

C. A method of forming a monolayer of particles. This method includes applying to a substrate a curable composition containing particles having a particle size of at least one dimension thereof of at least 1 micrometer; selectively exposing discrete regions of the particle-containing curable composition to a source of energy suitable for effecting polymerization of the curable composition for a sufficient time to effect polymerization of a layer of the curable composition in the discrete regions having a thickness of no more than 50% of the height of the largest particles thus also creating regions where the curable composition remains substantially uncured; applying an adhesive film over the surface of the particles, remote from the layer of cured composition; pressing the adhesive film onto the particles; and separating the adhesive film with the particles adhering thereto away from the layer of cured composition. The the film should have an adhesiveness with respect to the particles of at least greater than that of the cured composition. In addition, some of the curable composition remains uncured due to selective exposure of the curable composition to the energy source. This uncured material optionally together with any uncured material from the cured regions may be removed from the substrate. Also any substantial amount of uncured and/or cured composition remaining on the adhesive film or on the particles adhered thereto may be removed.

D. A method of forming a film containing a monolayer of particles. This method includes applying to a substrate a curable composition containing particles having a particle size of at least one dimension thereof of at least 1 micrometer; selectively exposing discrete regions of the particle-containing curable composition to a source of energy suitable for effecting polymerization of the curable composition for a sufficient time to effect polymerization of a layer of the curable composition in the discrete regions having a thickness of no more than about 50% of the height of the largest particles thus also creating regions where the curable composition remains substantially uncured; applying an adhesive film over the surface of the particles held by the layer, remote from the layer of cured composition, pressing the adhesive film onto the particles; separating the adhesive film with the particles adhering thereto away from the layer of cured composition; and optionally, removing any substantial amount of uncured and/or cured curable composition remaining on the adhesive film or on the particles adhered thereto; and applying a film-forming material to fill the interstitial spaces between the particles. The film should have an adhesiveness with respect to the particles held by the polymerised layer of at least greater than that of the cured composition. In addition, to the extent some or most of the curable composition remains uncured, the uncured curable composition may be removed from the substrate. It is desirable that uncured composition from at least the substantially uncured regions is removed before selective transfer of particles held by the layer takes place. The so-applied film forming material may also cover areas of the adhesive film flanking to the particles to a film-thickness similar to that of the particle-containing areas. The film-forming material may also be at least partially solidified.

In the method of A through D above, the particles are desirably dispersed in the curable composition—e.g., as a result of mixing the particles into the composition or by means of dispersion techniques, such as those described in EP 0 691 660 A1, the disclosure of which is hereby incorporated herein by reference. However, some particles may be aggregated in the composition. It is particularly desirable for the particles to be arrayed in the monolayer. The invention in further aspects therefore provides:

E. A method of forming a monolayer non-random array of particles. This method includes applying to a substrate a curable ferrofluid composition containing particles having a particle size on at least one dimension thereof of at least 1 micrometer; subjecting the particle-containing curable ferrofluid composition to a magnetic field for a sufficient time to array the particles in a non-random manner in the composition; and selectively exposing discrete regions of the composition having the particles arrayed therein to a source of energy suitable for effecting polymerization of the curable ferrofluid composition for a sufficient time to effect polymerization of a layer of the curable ferrofluid composition in the discrete regions having a thickness of no more than about 50% of the height of the largest particles thus also creating regions where the curable composition remains substantially uncured. Optionally, the method also includes removing the uncured ferrofluid composition from at least the uncured regions.

F. A method of forming a film having a monolayer non-random array of particles therein. This method includes applying to a substrate a curable ferrofluid composition containing particles having a particle size on at least one dimension thereof of at least 1 micrometer; subjecting the particle-containing curable ferrofluid composition to a magnetic field for a sufficient time to array the particles in a non-random manner in the composition; selectively exposing discrete regions of the composition having the particles arrayed therein to a source of energy suitable for effecting polymerization of the curable ferrofluid composition for a sufficient time to effect polymerization of a layer of the curable ferrofluid composition in the discrete regions having a thickness of no more than about 50% of the height of the largest particles thus also creating regions where the curable composition remains substantially uncured; removing the uncured curable ferrofluid composition from at least the uncured regions; and applying a film-forming material to fill the interstitial spaces between the so-formed array of particles. The so-applied film forming material may also cover areas of the substrate flanking the particles to a film thickness similar to that in the particle containing area. In addition, it may be at least partially solidified. Also the so-formed film may be removed from the substrate.

G. A method of forming a monolayer of a non-random array of particles. The method includes applying to a substrate a curable ferrofluid composition containing particles having a particle size on at least one dimension thereof of at least 1 micrometer; subjecting the particle-containing curable ferrofluid composition to a magnetic field for a sufficient time to array the particles in a non-random manner in the composition; selectively exposing discrete regions of the composition having the particles arrayed therein to a source of energy suitable for effecting polymerization of the curable ferrofluid composition for a sufficient time to effect polymerization of a layer of the curable ferrofluid composition in the discrete regions having a thickness of no more than about 50% of the height of the largest particles thus also creating regions where the curable composition remains substantially uncured; applying an adhesive film over the surface of the arrayed particles held by the polymerised layer, opposite to the layer of cured composition; pressing the adhesive film onto the particles; and separating the adhesive film with the arrayed particles adhered thereto away from the layer of cured ferrofluid composition. The film should have an adhesiveness with respect to the particles held by the polymerised layer at least greater than that of the cured composition. As in the methods above the uncured curable ferrofluid composition may be removed from the substrate.

H. A method of forming a film having a monolayer non-random array of particles therein. This method includes applying to a substrate a curable ferrofluid composition containing particles having a particle size on at least one dimension thereof of at least 1 micrometer; subjecting the particle-containing curable ferrofluid composition to a magnetic field for a sufficient time to array the particles in a non-random manner in the composition; selectively exposing discrete regions of the composition having the particles arrayed therein to a source of energy suitable for effecting polymerization of the curable ferrofluid composition for a sufficient time to effect polymerization of a layer of the curable ferrofluid composition in the discrete regions having a thickness of no more than about 50% of the height of the largest particles thus also creating regions where the curable composition remains substantially uncured; removing the uncured curable ferrofluid composition; and applying an adhesive film over the surface of the arrayed particles, opposite to the layer of cured composition; pressing the adhesive film onto the particles; separating the adhesive film with the arrayed particles adhered thereto away from the layer of cured ferrofluid composition; and applying a film-forming material to fill the interstitial spaces in the array of particles. The film should have an adhesiveness with respect to the particles greater than that of the cured composition over areas of the substrate flanking the particles to a film-thickness similar to that of the particle-containing areas. In addition, to the extent it exists, any substantial amount of uncured curable composition remaining on the adhesive film or on the particles adhered thereto may be removed. Also, the film-forming material may be at least partially solidified.

The substrate may comprise and desirably does comprise a flexible substrate. The flexible substrate may be a continuously moving tape or web of suitable material, for example, polyester. Desirably, the substrate is a tape. Alternatively, the substrate may comprise rigid silicon wafers supported on tape, adhesive coated glass sheets. Selective exposure is desirably carried out while the substrate and the energy source are moved relative to each other. As illustrated in the specific embodiment of FIG. 12, the substrate 1 moves relative to the energy source 3. Selective exposure is achieved by blocking the energy source from the substrate by positioning a mask 4 between the source of energy and the substrate as described below.

In any of the methods above, uncured curable composition (together with the substantive particles) may be removed by washing with a suitable solvent, for example, acetone. The material removed by washing (which includes the substantive particles) can be collected for re-use (as described below with reference to FIG. 12). Recovery of substantive particles in particular is desirable for re-use. Depending of course on the required pattern of discrete regions of monolayered particles, the process of the invention allows for a relatively large amount of the substantive particles to be recovered. If the process is optimised any substantive particles not required in conductive pathway formation can be recovered.

In any of the methods of A to H above, selective exposure of the curable composition to the source of energy may be achieved by selectively irradiating, e.g., selectively blocking energy from the energy source or by intermittently energising and de-energising the energy source or by a combination of same.

The substrate itself upon which the curable composition or curable ferrofluid composition, as appropriate, is applied may have areas that allow for the passage of the energy and areas that block passage of the energy, for example, the substrate could have radiation transmissive regions and radiation non-transmissive regions. In one such arrangement the substrate may be a tape (or indeed any other substrate) and could have a radiation transmissive/radiation opaque regions incorporated into the tape or applied as a backing thereto. In such cases irradiation of the composition through the tape (or other substrate) can achieve the desired effect.

The relative movement of the substrate and the energy source can be considered to result in a scanning process. In that process the image of the radiation falling on the curable composition images the composition. In other words the substrate itself can act as a mask. In such cases the source of the energy is usually positioned on the opposite side of the substrate to the side on which the curable composition is applied. Similarly a second overlaying/underlaying body may be applied to the substrate to achieve the desired effect, for example an overlying tape could be used which provides a desired radiation transmissive/radiation opaque pattern.

The positioning of a shadow mask between the energy source and the substrate results in the formation of a film having a patterned array of conductive particles. The masked regions therefore withhold light from the substrate carrying the particle arrays and prevent particle attachment in these regions. When the particle-carrying substrate is washed, or developed to free polymerisable material that has not photocured, a pattern emerges that is the image of the mask. The mask may comprise commercially available masking tape or any other suitable material. It will be appreciated by those skilled in the art that shadow masks can be designed such that the imaged pattern width coincides with the module size in the desired Smart card assembly process, for example. The versatility of the process according to the invention will be appreciated by those skilled in the art. The product can be designed to suit specific requirements of the consumer.

In one aspect of the invention the substrate comprises a continuously moving web and the mask is positioned parallel to the direction of the moving substrate or 'web'. Substrates having patterns comprising longitudinal stripes of particles in readiness for transfer for example to a host hot melt film/pre-formed film may be obtained according to this method.

Alternatively, the selective exposure step may be achieved by chopping the energy from the source of energy. Chopping the energy source may be achieved by intermittently energising and de-energising the energy source. In such case the output energy is controlled. Masking normally controls the incident energy (incident on the curable composition). The energy source may comprise any suitable source such as a light source, for example. For example, chopping of the light source may be achieved by linking the light source to a function generator that controls an electromagnetic shutter so that the light is intermittent.

Selective exposure may also be achieved by positioning a mask between the energy source and the substrate and additionally chopping the energy source. An otherwise continuous stripe of conductive particles formed by masking alone may be broken down into dashed line patterns by chopping the energy source. The chop frequency can be synchronised such that the repeat pattern of ordered particle arrays coincides with the repeat pattern occurring along the length of infed modules in the TAB format. Thus the frequency of particle arrays within the pattern may be selected to coincide with a pattern of modules to be attached in a continuous feed process. It will be appreciated by those skilled in the art that the frequency of chopping the energy source can be modified in a manner to produce anisotropically conductive films specifically designed to suit the requirements of the end user. Thus films having a pattern of particle arrays comprising discrete regions of particle arrays bordered (surrounded) by discrete regions of film substantially free from particle arrays may be produced.

The films produced according to the invention may be ACFs. It is a feature of the present invention that the ACF produced according to the methods described herein may contain a monolayer of specifically imaged continuous stripes. This minimises production costs and maximises efficiency of particle usage. It further maximises the insulating nature of pure adhesive in regions where electrical conduction is not required. In the methods according to the invention, mask design takes into consideration the subsequent slitting of patterned ACF from a patterned master roll. This ensures that waste is minimised. Slit patterned ACF should be compatible with the module feed tape.

Any one of the methods described herein may further comprise the step of recovering relatively expensive conductive particles that have been prevented from tacking to the substrate. In particular, during patterned particle array formation, expensive conductive particles that have been prevented from tacking to the web by masking, may be recovered from a developing tank from a catchpot located at the tank base.

I. A method is also provided for forming a monolayer of substantive particles. This method includes the steps of applying to a substrate a curable composition having substantive particles contained therein, the substantive particles having a particle size on at least one dimension thereof of at least 1 micrometer; selectively exposing at least discrete regions of the substantive particle-containing curable composition to a source of energy suitable for effecting polymerization of the curable composition for a sufficient time to effect polymerization of a layer of the curable composition in the at least discrete regions having a thickness of no more than 50% of the height of the largest substantive particles; optionally, removing uncured curable composition; and selectively transferring particles held in the layer of polymerized composition to a second substrate.

Figure 12:
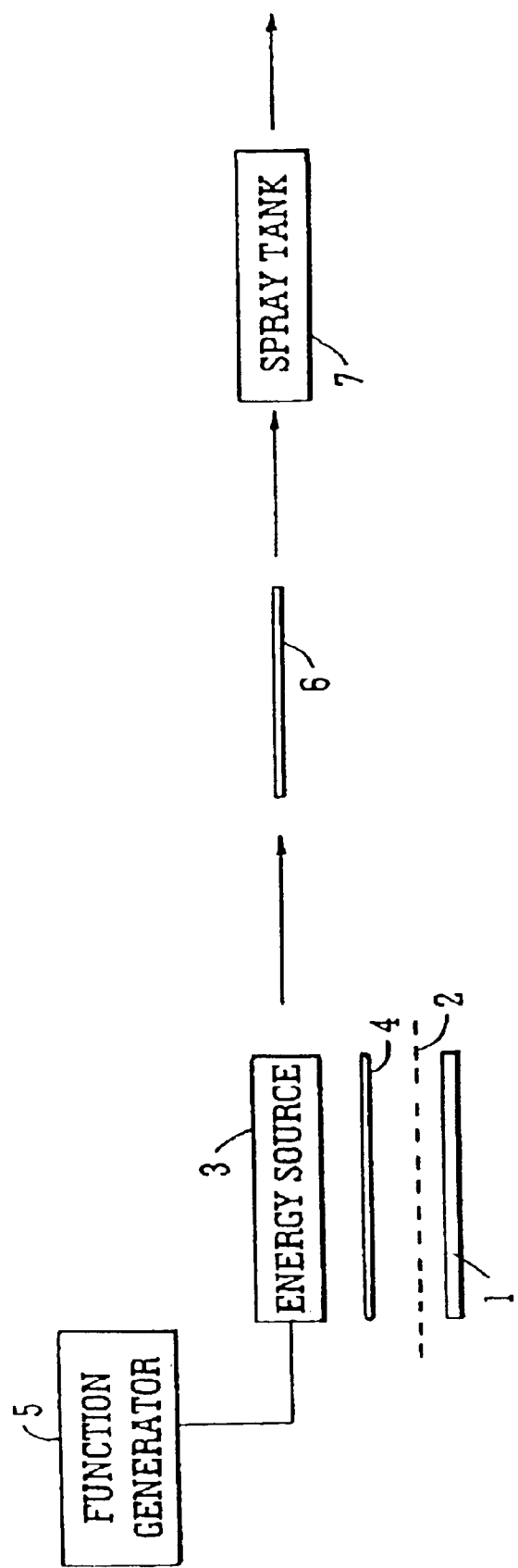
FIG. 12 is a schematic representation of an apparatus and process of one embodiment of the invention illustrating selective blocking of energy from the energy source and in combination with the process of intermittently energising and de-energising the energy source.

As shown in FIG. 12, the substrate 1 to which a curable composition 2 containing substantive particles has been applied is selectively exposed to a UV light source 3 by inserting a mask 4 between the substrate and the light source. As the substrate 1 moves relative to the light source 3, the light is additionally chopped. In FIG. 12, the light source 3 is connected to a function generator 5, which controls an electromagnetic shutter of the light source. The shutter is used to chop the light source intermittently. The area of curable composition 2 exposed to radiation from the light source is at least partly polymerized to form a tacked layer of particle arrays.

In the embodiment of FIG. 12 coated assembly 6 carrying the tacked and untacked substantive particles and cured and uncured material is washed by spraying. Spraying within the spray tank 7 (desirably a fine spray such as an aerosol spray) is used to remove the uncured material including the substantive particles contained therein at least from those discrete areas in which substantially no cure has taken place. Optionally selective transfer may be subsequently carried out.

Figure 13I:
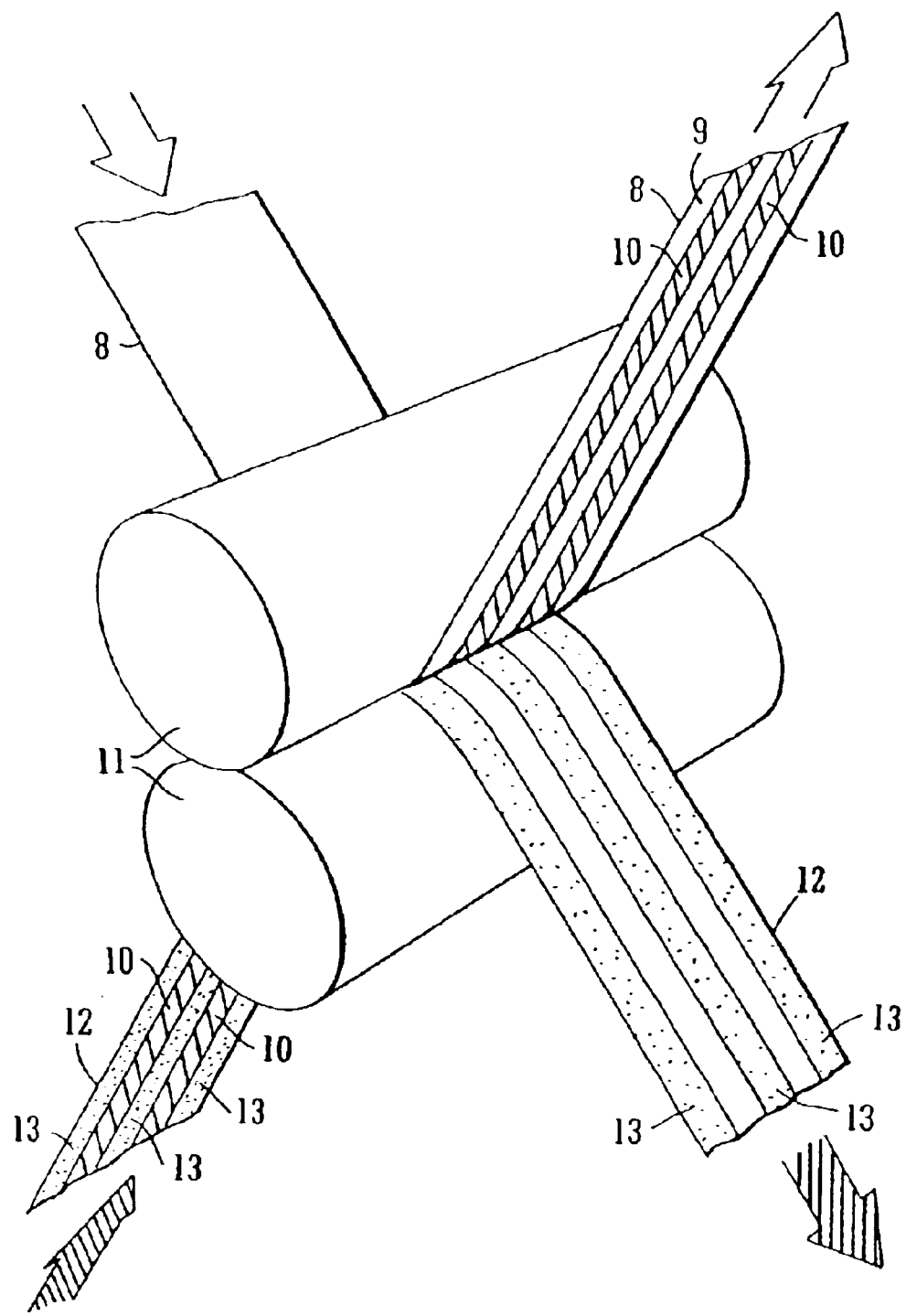
FIG. 13(I) shows non-selective transfer of a striped pattern of discrete regions of the particle array to a second substrate.
Figure 13:
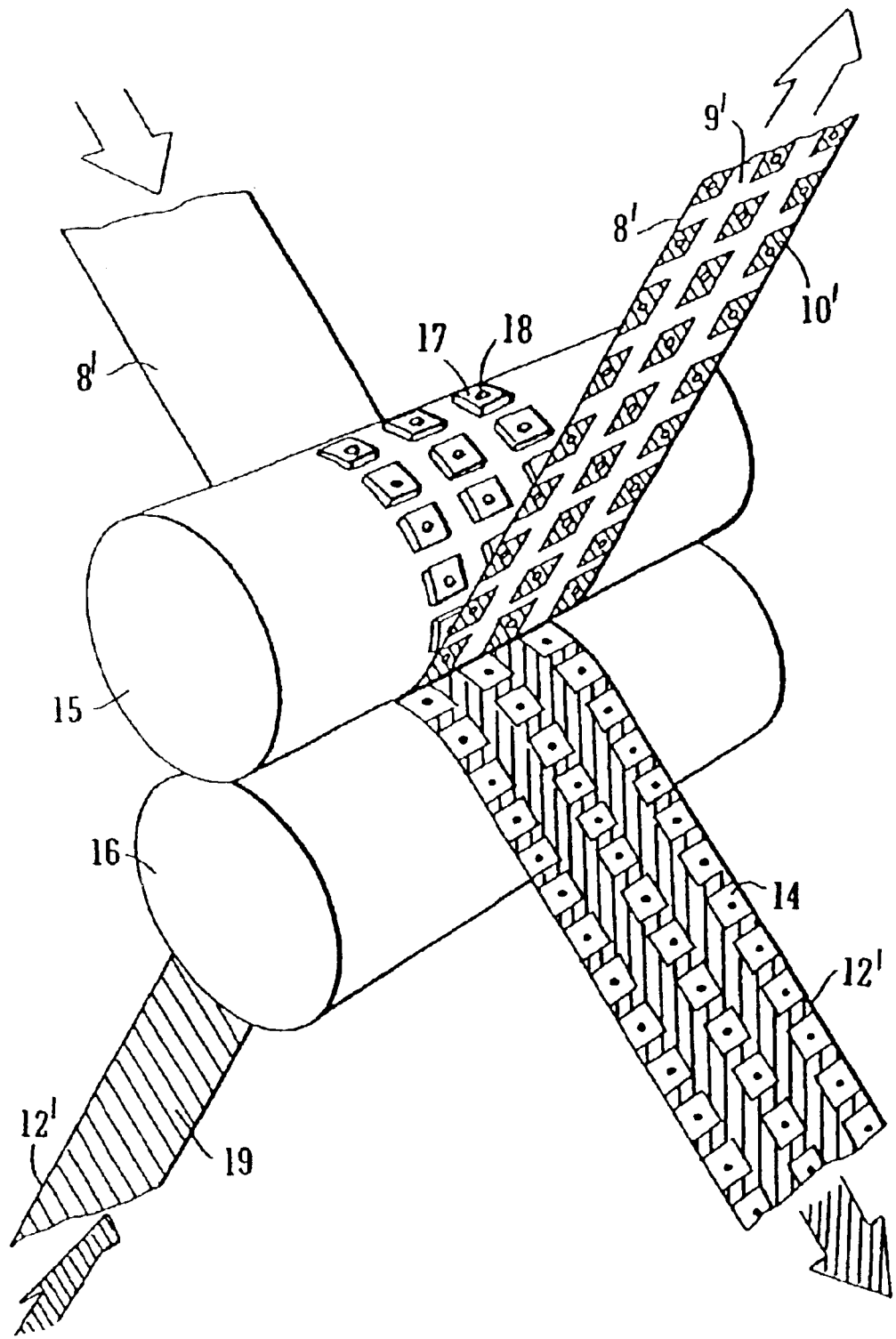
FIG. 13 is a schematic representation illustrating two processes and apparatus for transferring particles to a second substrate, in particular
Figure 14:
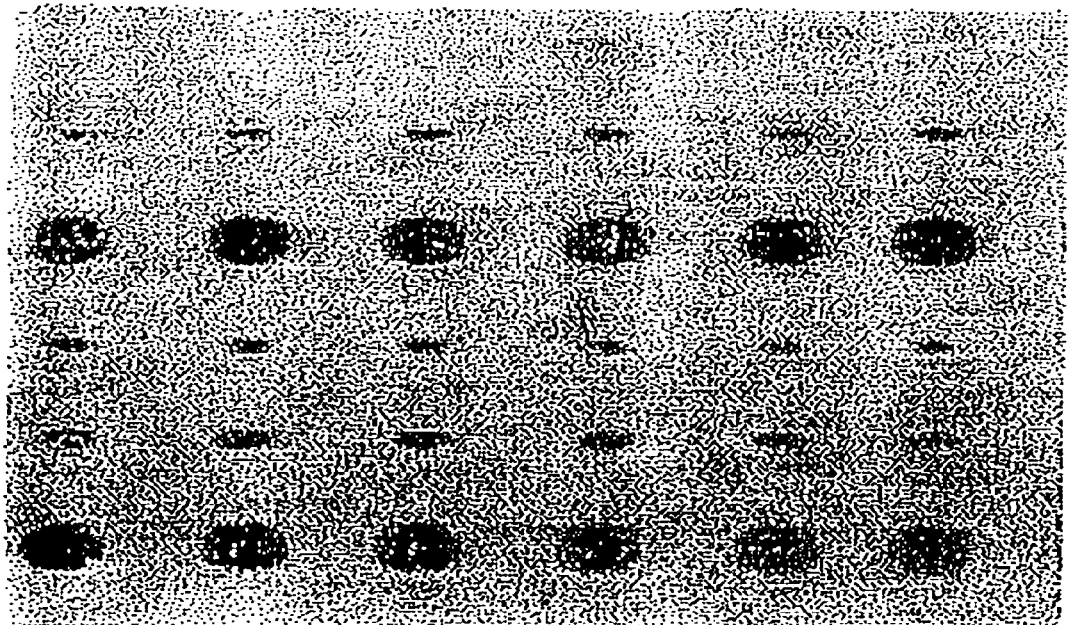
FIG. 14 is an image of a section of a web having photoimaged ACF by the process/apparatus described with reference to FIG. 13(I) and as described in Example 29 below. Each dark area comprises ordered arrays of 7 μm particles (spheres).
Figure 15:
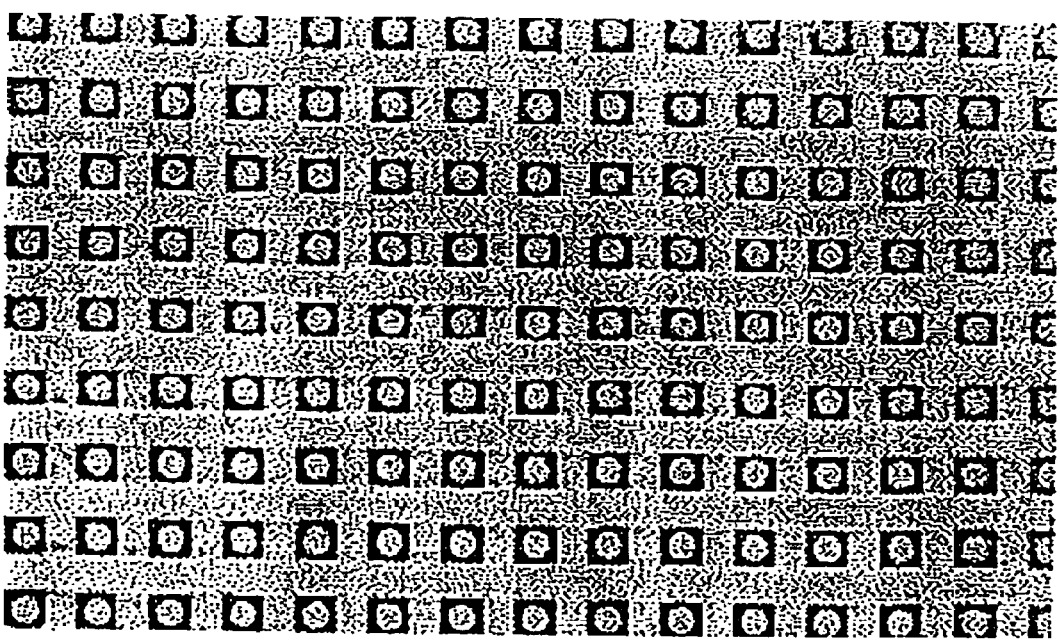
FIG. 15 is an image of a section of a web ACF created by the process/apparatus described with reference to FIG. 13(II) and as described in Example 30 below. Each dark area comprises ordered arrays of 7 μm particles (spheres).

Selective transfer may be achieved by selectively pressing particles held in the layer of polymerized composition onto a second substrate such as is shown in FIGS. 13 [13(I) and 13(II)]. Selective transfer of tacked particles may be achieved in different ways as exemplified in FIGS. 13(I) and 13(II).

FIG. 13(I) illustrates how selective transfer is achieved by transferring particles from a patterned substrate 12. The substrate 12 bears particles only in selected regions—in this embodiment longitudinal stripes 10 of tacked particles (ordered or unordered) along the substrate 12. No particles are found in the juxtaposed stripes 13 as these have been removed by photoimaging with subsequent washing as described with reference to FIG. 12. Selective transfer of the stripes 10 is by way of a set of nip rollers 11. The stripes 10 are transferred to a second substrate in the form of a preformed film 8 such that the particle pattern 10 is replicated into the film 8 to form the preform 9. The substrate 12, which is stripped of its particles after replication is removed as waste. The transfer is achieved as the adhesiveness of adhesive on the film 8 for the particles is greater than the adhesiveness of the tack layer for the particles.

FIG. 13(II) illustrates selective transfer of tacked particles from an unpatterned substrate 12' bearing a uniform random, or preferably non-random, layer 19 of tacked particles, into a preform film 8' by way of a set of nip rollers 15, 16. The roller 15 is embossed having generally square raised surfaces 17 each having a central bore 18. The features in relief (i.e., the area of the raised surfaces 17 about the bore 18) are arranged to exert selective, local pressure to invoke particle transfer. In the particular embodiment shown selective pressing is thus achieved by pressing pressure from a pressing element (the raised square surfaces with central bores) having upraised or depressed surfaces or a combination of both upraised and depressed surfaces.

When (as illustrated) the substrate (film) 12' is fed together with a second substrate in the form of a film 8' through the rollers 15 and 16, the roller 15 imparts selective pressure on the film 8'. Selective replication is then produced resulting in the selective transfer of material to the film 8' forming a patterned preform 9' with particle laden images 10'. The substrate 12' which is partially stripped of particles by selective replication forms an essentially a negative image 14 of the patterned ACF preform 9'. This latter method of selectively patterning ACF is more efficient when used in conjunction with the photoimaging method illustrated in FIG. 13(I) because particles on the waste web of film 12' will be more easily recovered as not all particles will be held in the tack layer. However, the embossing method is capable of delivering complex patterns of regular and irregular shapes in continuous web processing of ACFs. Again the transfer is achieved as the adhesiveness of adhesive on the film 8' for the particles is greater than the adhesiveness of the tack layer for the particles.

During the transfer process an embossed roller is used in the transfer nip such that raised sections invoke particle transfer (such as into a hotmelt or other pre-form film type), whilst roller sections lying at a lower level do not transfer particles onto the second substrate (film). Thus the use of an embossed roller achieves discrete areas of transferred particles on the pre-formed film.

It will be appreciated by those skilled in the art that the embossing pattern on the roller can be designed such that the frequency of the pattern can be matched to a specific end user requirement. This technique can be used in conjunction with upstream masking so that embossed particle transfer only occurs from striped regions of the web carrying the particles. Embossed transfer has the additional advantage in imaging applications in that areas of particle arrays with certain shapes in particular non-rectangular and/or unfilled shapes such as curves or circles for example, can be replicated in an on-line process. This is not easily done with shadow masking alone. The masking and chopping of light during the process enhances the versatility of the process, allowing different patterns of particles to be produced and expensive raw materials, such as untacked gold plated microparticles, to be recovered.

In accordance with the present invention, the curable composition, or curable ferrofluid composition may be applied to the substrate in a pattern, for example by screen or stencil printing, or may be applied by conventional coating techniques.

The particles should be conductive particles, such as electrically-conductive particles. However, thermally conductive or optically-transmissive particles may also be used.

Figure 16:
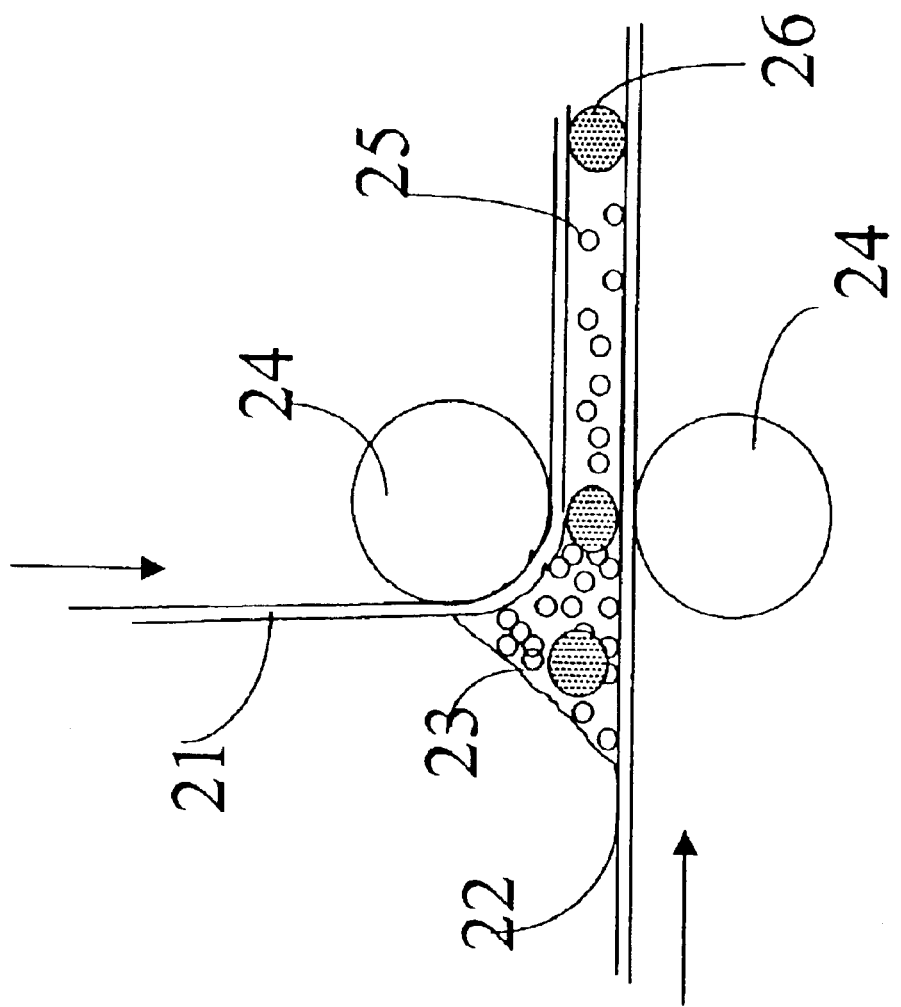
FIG. 16 is a schematic representation in side elevation of laminate formation using two groups of substantive particles of different sizes.

FIG. 16 is a schematic representation of laminate formation between two plastic film substrates (21) and (22) employing laminating rollers (24) (not to scale). Curable ferrofluid composition (23), including small (25) and large (26) substantive particles is applied before the rollers (24) and the laminate is motivated in the direction shown by the arrows (see Example 31).

Figure 17:
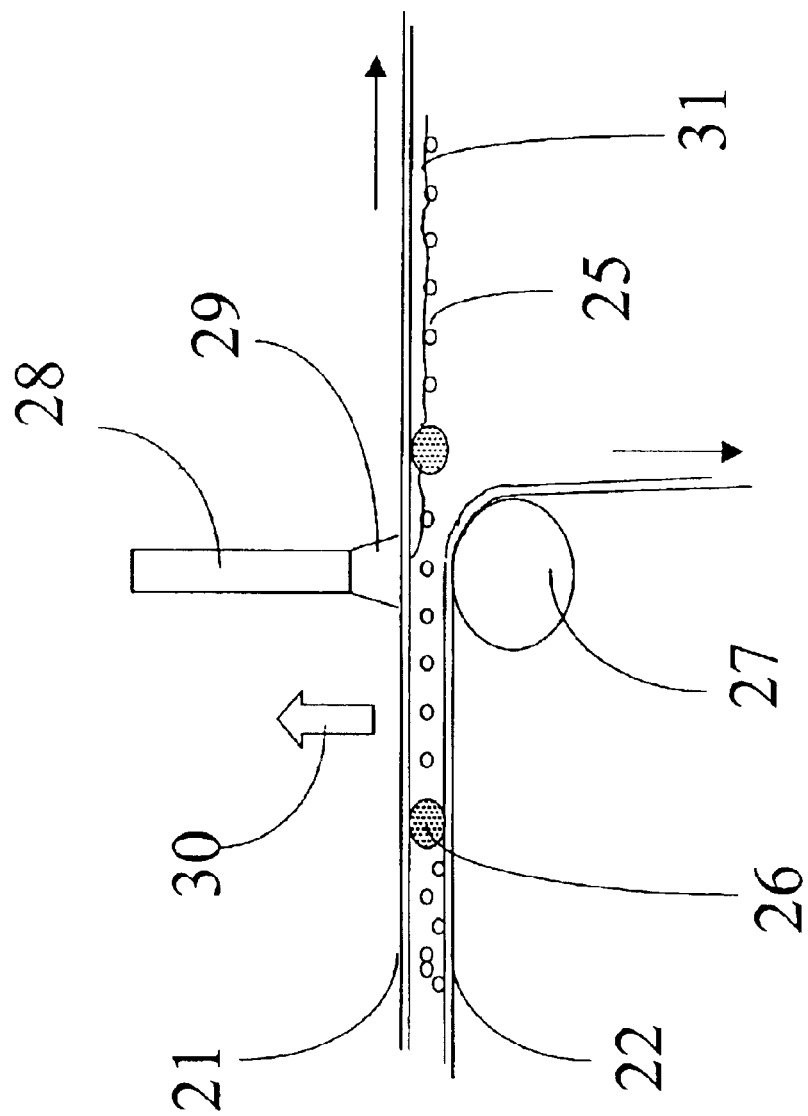
FIG. 17 is a schematic representation in side elevation of particle separation, phototacking and substrate separation applied to a laminate formed as shown in FIG. 16.

FIG. 17 is a schematic representation describing particle separation and photacking onto a plastic film after laminate formation as shown in FIG. 16. Film substrates (21) and (22) move in the direction indicated by black arrows. Small (25) and large (26) substantive particles are separated by a magnetic field (not shown for clarity) applied normal to the film substrates as indicated by block arrow (30). Separated particles are locked in place by partial photocure of the curable ferrofluid composition from light source (28) and emanating light rays (29). Roller (27) enables smooth removal of lower film substrate (22) while upper film substrate (21) carries locked-in-place particles (25) and (26) on a cured film of adhesive (30) sufficiently thick to capture the smaller substantive particles (25) that take up a midline position in the laminate spaced by the larger substantive particles (26) in accordance with the theory of magnetic holes.

In the method of any of E to H above the curable ferrofluid composition suitably comprises either:

(a) a colloidal dispersion of ferromagnetic particles in a curable liquid composition (i.e., the curable composition acts as the carrier of the ferrofluid); or (b) a mixture of a curable liquid composition and a colloidal dispersion of ferromagnetic particles in a liquid carrier.

In the method of B, D, F or H, the film-forming material may be organic or inorganic and may be selected from thermodeformable coatings such as thermosets and/or thermoplastics. The film-forming material should be an adhesive material. A single film-forming material should be sufficient to manufacture the films in accordance with the present invention. In addition, two or more layers of different film-forming materials may also be appropriate to apply to the particles, such as a first layer of film-forming material which may be adhesive (e.g., an elastomer) and a second layer of adhesive film-forming material. The second layer may have been formed with the additional step of separating the film formed by solidification of the film-forming material with the particles therein away from the layer of polymerized curable composition, the tack layer, and then applying a layer of adhesive material over the so-exposed surface of the film.

The invention provides a bi-layer film, which includes a layer of thermoset material and a layer of thermoplastic material. The layer of thermoset material may be either the tack layer with a secondary or latent adhesive cure system (B-stage mechanism) therein, or a layer of thermoset backfill material with a thickness not more than about 50% of the height of the largest particles. The layer of thermoplastic material may be backfill material with a thickness of about 50% or more of the height of the largest particles, so that the total thickness of the film is about equal to the height of the largest particles. The thermoset layer maintains in position the arrayed particles while the thermoplastic layer may be reworked, such as by use of heat. For example, if the bi-layer film is applied with the thermoset layer adhering to an electronic device and the thermoplastic layer adhering to a printed circuit board, the thermoplastic layer allows a reworking function if the parts need to be disassembled for repair or repositioning or re-use, while the ordering of the arrayed particles is maintained. In a reuse operation, a new layer of thermoplastic material need only be applied to the circuit board, not to the electrical device, which is of much smaller size. Alternatively, if further reusability is not desired, a second thermoset material may be applied instead of the thermoplastic material.

The invention also provides a tri-layer film, which includes a layer of thermoset material and two layers of thermoplastic material. In this instance, the two thermoplastic layers sandwich the thermoset layer in which the particles are maintained in place and the tack layer has been removed. Specifically, after removal of the uncured material a first layer of thermoplastic may be backfilled followed, sequentially by a layer of thermoset material and a second layer of thermoplastic. Alternatively, after removing the uncured material, a layer of thermoset material may be backfilled followed by application of a layer of thermoplastic. Then the tack layer may be removed and replaced by a second layer of thermoplastic. This allows for reworkability and/or recovery of the substrate parts being mated with the film, as well as recovery of the film itself.

The depth of the film should ordinarily be no more than about 125%, desirably about 110%, of the height of the largest particles, i.e., the dimension perpendicular to the plane of the film. If the film is thicker than the height of the largest particles, the film material should be such as to allow for or facilitate penetration by the particles and/or elements (particularly conductors) with which the particles are brought into contact during an end-use application of the film.

The height of the tack layer is no greater than about 25%, desirably about 10%, of the dimension of the largest particles perpendicular to the substrate.

The largest particles (the substantive particles) are of substantially uniform size (monodisperse), ordinarily having a diameter of at least 2 micrometers. Alternatively, particles of two or more groups of different sizes but of substantially uniform size within the group of larger size may be used. In accordance with the present invention, the curable composition may also contain one or more fillers having a particle size in the range 0.1 to about 1 micrometers.

In the method of C, D, G or H, the depth of penetration of the particles into the adhesive film is ordinarily no greater than about 25%, desirably about 10%, of the height of the largest particles, i.e., the dimension perpendicular to the plane of the adhesive film.

When the particles are of substantially uniform size, the height of the cured layer is measured in relation to the average diameter of the particles. When the term "diameter" is used herein in relation to non-spherical particles, it refers to the dimension perpendicular to the substrate.

In the method of B, D, F or H above, film-forming material may be applied to areas flanking the particle-containing areas. Flanking strips of adhesive, which may be the same adhesive as the adhesive material in the particle-containing areas, are useful for providing extra strength in a conductive adhesive film. Thus, for example, in edge connection to liquid crystal displays, peel strength is a particularly important property to the extent that a flexible connection attached to the display does not peel away during operation.

In the method of A or E, the further step of forming a solid structure alongside and, optionally, opposite to the monolayer of particles is provided. In this regard, it is particularly useful to array the particles along a microchannel in a solid structure. Particles coated with a chemical or biochemical agent may thus be located in microchannels which function as chromatography columns or patterned test coupons.

The invention further provides:

J. A method of forming a monolayer non-random array of particles. This method includes applying a composition comprising a ferrofluid composition and particles to a substrate having a surface of adhesive material; subjecting the composition to a magnetic field for a sufficient time to array the particles in a non-random manner; selectively pressing the particles onto the adhesive surface of the substrate; and removing the ferrofluid composition.

K. A method of forming a monolayer non-random array of particles. This method includes applying a composition comprising a ferrofluid composition and particles to a substrate which has a surface of latent adhesive material; subjecting the composition to a magnetic field for a sufficient time to array the particles in a non-random manner in the composition; activating the latent adhesive property of the substrate surface material; selectively pressing the particles onto the adhesive surface of the substrate; and removing the ferrofluid composition.

L. A method of forming a film having a monolayer non-random array of particles therein. This method includes applying a composition of ferrofluid composition and particles to a substrate having a surface of adhesive material; subjecting the composition to a magnetic field for a sufficient time to array the particles in a non-random manner; selectively pressing the particles onto the adhesive surface of the substrate; removing the ferrofluid composition; and applying a film-forming material to fill the interstitial spaces between the particles and optionally to cover areas of the adhesive material flanking the particles to a film-thickness similar to that of the particle-containing areas. In addition, the film-forming material may be at least partially solidified. Also the so-formed film may be removed from the adhesive material.

M. A method of forming a film having a monolayer non-random array of particles therein. This method includes applying a composition of a ferrofluid composition and particles to a substrate which has a surface of latent adhesive material; subjecting the composition to a magnetic field for a sufficient time to array the particles in a non-random manner in the composition; activating the latent adhesive property of the substrate surface material; selectively pressing the particles onto the adhesive surface of the substrate; removing the ferrofluid composition; and applying a film-forming material to fill the interstitial spaces between the particles and optionally to cover areas of the adhesive surface flanking the particles to a film-thickness similar to that of the particle-containing areas. In addition, the film forming material may be at least partially solidified. Also, the so-formed film may be removed from the adhesive surface.

In the method of J, K, L or M, a conventional ferrofluid composition may be used accordingly, whether the composition is made curable is the choice of the user.

A film or tacked array formed by a method of the invention may be formed in situ on a substrate on which it be used, e.g., an electronic component. In such case, the film or tacked array produced in accordance with the invention forms a coating on the component or other substrate. Thus, the terms film and tacked array as used herein include "coating".

In certain situations, the film may not need adhesive properties. For example, if the film is to be used between two sets of conductors, which are to be assembled temporarily for test purposes but which are not to be bonded. However, generally it is desirable that the film-forming material contains a secondary or latent adhesive/cure system, which is activatable in an end-use application of the film.

Solidification of the film-forming material (and optionally also the curable tack layer composition) generally involves two stages, an A-stage and a B-stage. The A-stage, or primary solidification, has the function of producing a film with the particles maintained in place, which is capable of being handled. The A-stage may involve a primary cure, e.g., by photocure, heat, or E-beam. Solvent evaporation, cooling (in particular from a melt), chemical reaction (e.g., polymerization), physical association phenomena and the like, are also acceptable means of effecting viscosity increases to an effectively solid A-staged condition. The B-stage which occurs during end-use application of the film may use thermoplastic properties of the A-staged film or coating, but desirably involves a cure, for example to a thermoset condition. When the A-stage solidification has been effected by a primary cure, the B-stage cure is a secondary cure which may use the same or a different cure mechanism from that of the A-stage.

In the methods above, where appropriate the curable ferrofluid composition may be applied to the substrate, and then exposed to the magnetic field. The composition may be exposed to the magnetic field while the composition is being applied to the substrate. The composition may be applied continuously or in step-wise manner. Likewise the substrate may pass continuously or in step-wise manner past the apparatus applying the magnetic field.

The composition may be applied to the substrate by stenciling or screen printing using stenciling or screen printing equipment having one or more mounted magnets.

The substrate on which the composition may be applied may be rigid or flexible. A release layer may form the substrate and/or may be applied to the tack layer in order to prevent the tack layer from bonding with the film-forming material. Similarly, it may be applied to the surface of the film, remote from the substrate, so as to allow for stacking or rolling of the films. The release layer itself may be rigid or flexible or may include a coating or film of an appropriate releasing material.

The adhesive films to which the monolayer non-random array of particles are transferred may also be on release-coated substrates. It is desirable for the adhesive films to be either transparent or translucent and to at least partially transmit UV radiation.

The present invention also relates to the monolayered random and ordered arrays of particles and films containing the same produced in accordance therewith. It includes substrates having a film as described above applied thereto or a film or tacked array formed thereon. It also includes articles having a support tape substrate and an ordered monolayer array of patterned transferable particles, the particles ranging from 1 micrometer to about 500 micrometers and the particles temporarily bound to the substrate with the substrate in contact with no more than about 50% of the surface area of the transferable particles. Moreover, the strength of the bond between the particles and the support tape should be less than the cohesive strength of substantially all of the transferable particles. In one such embodiment, the support tape substrate comprises a release coated paper.

These articles may further include an adhesive matrix having more than one cure mechanism. These articles may further include a silicon wafer substrate, an indium tin oxide-coated glass substrate, or any substrate with a patternwise delineation of electrical conductors thereon, to which the array of transferable substantive particles may be adhesively bound, with the strength of the adhesive bond between the substantive particles and the substrate exceeding the strength of the adhesive bond between the substantive particles and the support tape. Optionally, the support tape substrate may contain ferromagnetic particles or contain colloidal ferromagnetic particles.

The invention is further directed to an article sequential laminae of a first substrate, an adhesive matrix entraining an ordered monolayer array of substantive particles of at least 1 micrometer to about 500 micrometers and a second substrate joined to the first substrate by the adhesive matrix, where the adhesive matrix is substantially free of ferromagnetic particles smaller than about 1 micrometer and the monolayer array has patterned regions of arrays of substantive particles. The ordered monolayer array may be induced by a pattern of magnetic flux lines acting on the substantive particles which are supported on a continuously moving substrate taken in a plane extending through a magnetic flux field, desirably a plane extending normal to the flux lines in the flux field, more desirably still, where the flux lines are vertical. The adhesive matrix may further include additional discrete layers of different adhesive compositions.

The invention is further directed to an article having a support tape substrate, and an ordered and patterned monolayer array of transferable substantive particles of at least 1 micrometer to about 500 micrometers bound thereto by an adhesive, the adhesive being substantially free of ferromagnetic particles and the adhesive strength of the adhesive being less than the cohesive strength of the particles and being greater to the support tape substrate than to the transferable particles.

The invention is further directed to a method of forming an anisotropic conducting bond between a first and a second set of conductors. The method includes the steps of forming an assembly by applying a first adhesive to a first set of conductors and further applying an article containing a monolayer ordered and patterned array of particles bound to a support tape substrate to the first set of conductors such that at least some of the ordered monolayer array of transferable substantive particles are in contact with the first set of conductors. The first adhesive is then at least partially cured. The support tape is removed with the ordered monolayer array of transferable substantive particles adhering to the first set of conductors. A second adhesive, optionally the same as the first adhesive, is applied to the ordered monolayer array of transferable substantive particles and a second set of conductors applied to the ordered monolayer array of transferable substantive particles. The second adhesive is then activated.

In one embodiment, the first adhesive is UV curable and the support tape is at least partially UV transparent. Other types of adhesives may be used as well as discussed in several of the examples below.

The first set of conductors can occur on a substrate such as an indium tin oxide coating on glass, metalization on a semiconductor and metalization on an insulator.

The present invention includes an active or passive electronic component having conductors on its surface or periphery and having a film as described above containing electrically conductive particles applied to its conductors or a film or tacked array formed thereon.

The film or tacked array may be formed on an electrically-addressable substrate, such as a silicon wafer including circuitry, or conductive glass, such as indium tin oxide (ITO)-coated glass which has patternwise delineated conductive tracks thereon or alternatively, may be affixed to such substrates via an adhesive. Ceramic, epoxy composite, polyimide films and the like, represent other forms of substrates, which may include conductive tracks.

In the case of ITO-coated glass substrates, the tack layer of the curable composition is suitably rendered susceptible to photopolymerization, and is cured by irradiation through the transparent substrate, with actinic (UV) radiation. Exposure conditions may be selected such that only a layer of the curable composition solidifies. After removal of uncured material, a backfilling material is then applied and cured (primary cure or A-stage).

Alternatively, backfilling is not necessary if a film forming material is to be applied intermediate the ITO-coated glass substrate and the substrate to which it is to be mated concurrently with or prior to mating or if the second substrate has a pre-applied coating of a solidifiable film forming material on its surface. The solidifiable film-forming material should either be a liquid or in a softened or pliable state, such that as the substrates are mated and pressed together, the particles penetrate through the solidifiable film forming materials until contact is made with the surface of the second substrate.

Similar methods are appropriate in the case of substrates which are non-transmissive to UV or visible radiation but which are transmissive to other forms of electromagnetic radiation. In such case, the initiator systems in the curable compositions may require modification. Alternatively, a pre-formed "patch" of film according to the invention may be applied to the electrically-addressable substrate. In either case, the backfill composition contains a latent thermal hardener or other B-stage cure system so that it has latent adhesive properties. The resulting products can be used for device interconnection to flat panel displays of various types, or direct die attachment, using "flip chip" techniques in the case of a coated and subdivided wafer.

The average particle size of the substantive particles should be at least about 10 times that of the colloidal-size ferromagnetic particles, more particularly at least about 100 times, and advantageously at least about 500 times. The substantive particles have an average particle size (measured on the minor dimension in the case of non-symmetrical particles) of at least about 2 micrometers while the colloidal ferromagnetic particles have an average particle size not greater than about 0.1 micrometers, such as about 0.01 micrometers.

For electronic interconnection uses, the interconnection pads generally have a width in the range of about 10 to about 500 micrometers, suitably is about 100 micrometers. The separation between the pads generally is less than about 150 micrometers, such as about 100 micrometers. The present invention facilitates pitch or separation reduction below about 100 micrometers, even to about 10 micrometers or less.

The substantive particles may be arrayed in a regular pattern in a monolayer. The thickness of the uncured curable composition on the substrate should be desirably regulated (e.g., by compression, squeegee, and the like) before cure so that essentially all of the particles (or at least the largest particles) are in substantially the same plane.

The substantive particles should have substantially uniform sizes and shapes. Substantial uniformity is not affected by the presence of smaller than average particles (which may not function as conductive particles in the film) or larger than average particles (which may be compressible and/or otherwise capable of size reduction in the conditions of production of the film or coating, e.g., solder particles which may melt or deform). The size distribution for solder powder particles is defined according to test methods of the Institute for Interconnecting and Packaging Electronic Circuits, Lincolnwood, Ill. 60646-1705, U.S.A. For example, in Table 1 below distributions from test method IPC-TM-650 are presented:

TABLE 1

| | % of Sample by Weight - Nominal Size (micrometres) | | | |
| --- | --- | --- | --- | --- |
| | None Larger Than | Less than 1% Larger than | 90% Minimum Between | 10% Maximum Less Than 1 |
| Type 4 | 40 | 38 | 38–20 | 20 |
| Type 5 | 30 | 25 | 25–15 | 15 |
| Type 6 | 20 | 15 | 15–5 | 5 |

In the method of E to H, the curable composition may be cured or otherwise solidified while the magnetic field is applied or shortly after removal from the field.

Pressure may be applied to the layer of film-forming material before and/or during the primary curing or other solidification step.

The substantive particles should be compliant when pressed upon, either during preparation of the film, or during its end-use application. Such compliancy facilitates greater than single point contact and enables compensations for small variations in particle size or substrate flatness. This is particularly desirable in the preparation of electrically-conductive films.

The thickness of the film should be substantially the same as the average diameter of the substantive particles. In the event the particles are of two or more groups of different sizes, particles belonging to the group of larger particles should be of substantially uniform size and the thickness of the film should be in relation to the average diameter of that largest group of particles. During exposure to the magnetic field, the thickness of the layer of curable ferrofluid composition may be greater than the average diameter of the substantive particles, although ordinarily the thickness should be less than twice the average diameter. In this way, each particle may be surrounded by the carrier liquid and may migrate in the layer of the composition.

After backfilling, pressure may be applied to the material to reduce the thickness so that the substantive particles lie at, or protrude slightly from, both surfaces of the film. Alternatively, the thickness of the film may be reduced by shrinkage during the A-stage, e.g., as a result of cure or drying.

If the particles are compressible spheres, the thickness of the film may be reduced by compression to less than the average diameter of the electrically-conductive particles. In so doing, the particles may be compressed into a non-circular cross-sectional shape and the area of electrical contact on the surface of each particle thereby increased. Compression of individual particles to different degrees of compression may also compensate for some variations in particle size and flatness of the substrate. The compressibility of electrically-conductive particles having a core of polymeric material coated with an electrically-conductive metal will be a degree of dependent upon the extent of cross-linking of the polymer. Gold-coated spherical polystyrene particles [supplied by Sekisui Fine Chemical Co, Osaka, Japan under the name AU 212 (which were found to have an average diameter of 11.5 micrometers) compressed on the Z-axis under 3.3 MPa pressure] were found to have a Z-axis dimension of 10.5 micrometers, i.e., an aspect ratio (Z/X) of 0.79 corresponding to an 8.7% contraction on the Z-axis.

Generally, the uniform magnetic field is applied normal to the layer of the curable composition (i.e., in the Z direction) and the substantive particles form a regular array of particles in a monolayer. With a monolayer, there is primarily single-particle bridging in the Z direction between two sets of conductors (when the film is used between two sets of conductors). The regular pattern improves the reliability of electrical contact. The magnetic field may be applied parallel to the layer of the curable composition (e.g., the X direction) and the substantive particles form parallel chains of particles, each in contact with an adjacent particle or particles of the same chain. The chains are formed to lie parallel to the longitudinal axis of two sets of conductor pins or tracks. Here again, single-particle bridging in the Z-direction is achieved between the two sets of conductors. The particles, however, are also in electrical contact with adjacent particles in the same chain so that reliability is further improved.

In the case where two separate sets of conductor pins or tracks are located on opposite edges of an integrated circuit or other component, the layer of the composition will normally be interrupted at a central area of the component so that no conductive chain of particles extends across the width of the component to connect the two sets of conductors on the same component (unless desired).

In the case of a "quad" component having conductor pins on four edges, with two sets at right angles to the other two sets, the layer of the composition is applied, exposed to the magnetic field and cured in the tack layer in two steps, so that chains of conductive particles are formed in the X-direction and Y-direction with the appropriate alignments and interruptions in the respective areas. Screen printing of the composition and/or the use of masks, for example, may facilitate this operation. With those areas in which particle chains of one direction are desired are screen printed and cured, followed by a second screen printing step and cure for particles in the other direction. Alternatively, those areas in which a different direction or orientation of the particle chains is desired may be masked during curing or polymerization, with subsequent curing or the previously masked area.

Where a magnetic field is used normal to the layer of the composition, no significant alignment in the X-direction or Y-direction occurs, so that no interruption of the layer of the composition or double alignment step is needed.

The colloidal ferromagnetic particles of the ferrofluid may be magnetite but other ferromagnetic particles may also be used as described in U.S. Pat. No. 4,946,613 (Ishikawa), the disclosure of which is hereby expressly incorporated herein by reference. Exemplary ferromagnetic particles include: (i) ferromagnetic oxides, such as manganese ferrites other than magnetite, cobalt ferrites, barium ferrites, metallic composite ferrites (e.g., zinc, nickel and mixtures thereof), and mixtures thereof; and (ii) ferromagnetic metals selected from iron, cobalt, rare earth metals and mixtures thereof. A ferrite is a ceramic iron oxide compound having ferromagnetic properties with a general formula $MFe_2O_4$ where M is generally a metal such as cobalt, nickel or zinc [Chambers Science and Technology Dictionary, W.R. Chambers Ltd. and Cambridge University Press, England, 1988)]. The phenomenon of ferromagnetism is observed in ferrites and similar materials. The diameter of the ferromagnetic particle diameter may be in the range of about 2 nanometers to 0.1 micrometers, with a mean particle size of about 0.01 micrometers. The ferromagnetic particle content may be in the range of about 1 to about 30% by volume of the curable ferrofluid composition. In the case where a monomer forms the carrier of the ferrofluid, the suspension of ferromagnetic particles in the monomer may have a particle content of from about 2 to about 10% by volume.

A surfactant may generally be used to produce stable dispersions of the ferromagnetic particles in the carrier, particularly in curable carriers. Surfactants may be selected from unsaturated fatty acids and salts thereof, where the fatty acid or salt has one or more polar groups such as COOH, $SO_3H$, $PO_3H$ and mixtures thereof. Other surfactants well known in the art such as silicone-type surfactants, fluorine-type surfactants and the like, may also be used. Suitable surfactants include sodium oleate, or oleic acid, silane coupling agents, such as those available under the trademarks SH-6040 from Toray Silicone Co. Ltd., Saloosinate LH from Nikko Chem. Co. Ltd., the fluorine-containing surfactant X C95-470 from Toshiba Silicone Co. Ltd.

Primary surfactants form an adsorbed coating on the surface of the ferromagnetic particles. A secondary surfactant may also be used, to achieve dispersability, particularly an anionic surfactant, for example an acid form of a phosphate ester, particularly an aromatic phosphate ester type surfactant such as GAFAC RE610 from GAF (Great Britain) Limited, Wythenshawe, Manchester, U.K. or RHODAFAC RE610 from Rhone-Poulenc, Chimie, France.

Conventional ferrofluid compositions include colloids of the ferromagnetic particles in a suitable non-magnetic carrier liquid. Such non-magnetic carrier liquids may be chosen from among those described in U.S. Pat. No. 4,946,613 (Ishikawa) and U.S. Pat. No. 3,843,540 (Reimers), and International Patent Publication No. WO 95/20820, the disclosures of each of which are hereby expressly incorporated herein by reference. The carrier may be an organic solvent selected from (a) hydrocarbons, such as kerosene and fuel oils, n-pentane, cyclohexane, petroleum ether, petroleum benzine, benzene, xylene, toluene and mixtures thereof; (b) halogenated hydrocarbons, such as chlorobenzene, dichlorobenzene, bromobenzene and mixtures thereof; (c) alcohols, such as methanol, ethanol, n-propanol, n-butanol, isobutanol, benzylalcohol and mixtures thereof; (d) ethers such as diethyl ether, diisopropyl ether and mixtures thereof; (e) aldehydes, such as furfural and mixtures thereof; (f) ketones, such as acetone, ethyl methyl ketone and mixtures thereof; (g) fatty acids such as acetic acid, acetic anhydride and mixtures thereof and derivatives thereof; and (h) phenols, as well as mixtures of the various solvents. Commercially available ferrofluids, such as those from Ferrofluidics Inc., NH, U.S.A., include dispersed magnetizable particles in suitable carriers, such as water, esters, fluorocarbons, polyphenylethers and hydrocarbons. For a more detailed discussion of ferrofluids, see e.g., Ferromagnetic Materials, Wohlfarth E. P. (Ed.), Vol. 2, Ch. 8, p. 509, North Holland Publishing Co. (1980); Aggregation Processes in Solution, Wyn-Jones, E., Gormally, J., Ch. 18, p. 509, Martinet A Elsevier Sci. Publishing Co. (1983); and R. E. Rosensweig, Ann. Rev. Fluid Mech., 19, 437–63 (1987).

Ferrofluids are normally effective insulators. The resistivity of a ferrofluid adhesive composition should be further increased after curing. If desired, an electrically-conductive filler, such as carbon or metallic powder may be included in the ferrofluid (see EP A 0 208 391). In those embodiments in which the tack layer remains in the final product, including such an electrically-conductive filler results in covering the lower surface of the electrically-conductive particles, and allows for conductivity to be maintained. Ordinarily, the filler itself would itself be ordered in the manner of "magnetic holes". Additional conducting filler may be loaded in the tack layer so that electrical continuity does not persist in the plane of the tack layer for distances greater than a few micrometers.

The curable ferrofluid composition may be an adhesive composition. More specifically, it may be any suitable monomer composition into which the colloidal ferrofluid can be mixed or in which the ferromagnetic particles can be dispersed to form a colloid. A wide variety of polymerizable systems, based on acrylate, epoxide, siloxane, styryloxy, vinyl ether and other monomers, oligomers, prepolymers such as polyimides and cyanate ester resins and/or polymers and hybrids thereof, may be used as the curable tack layer composition and/or as the film-forming material. Conventional anisotropically conductive adhesive films have been described in International Patent Publication No. WO 93/01248, based on cyanate ester resins in conjunction with thermoplastic resin additives. The adhesive may be selected from olefinically unsaturated systems, such as acrylates, methacrylates, styrene, maleate esters, fumarate esters, unsaturated polyester resins, alkyl resins, thiol-ene compositions, and acrylate methacrylate or vinyl-terminated resins, such as silicones and urethanes. Suitable acrylates and methacrylates are those used in polymerizable systems, such as those disclosed in U.S. Pat. No. 4,963,220 (Bachmann) and U.S. Pat. No. 4,215,209 (Ray-Chaudhuri). Other acrylate containing materials useful herein are methylmethacrylate, polyfunctional methacrylates, silicone diacrylates and polyfunctional acrylated urethanes of the type known to be useful in formulating adhesives (e.g., as disclosed in U.S. Pat. No. 4,092,376 (Douek) or a thiol-ene or thiol-nene (e.g., as disclosed in U.S. Pat. Nos. 3,661,744, 3,898,349, 4,008,341 and 4,808,638). Suitable epoxy systems are included among those described in F. T. Shaw, ed., "Chemistry and Technology of Epoxy Resins", B. Ellis, Blackie Academic and Professional, London, 7, P.206ff. (1993). Suitable styryloxy systems are disclosed in U.S. Pat. Nos. 5,543,397, 5,084,490 and 5,141,970. The disclosures of these documents are hereby expressly incorporated herein by reference. In the case where the solidification process involves the resolidification of a molten matrix material, suitable matrices include polyamide hot melt adhesive polymers, such as Uni-Rez(R) 2642 and Uni-Rez(R) 2665, which are commercially available from Union Camp Corporation, Savannah, Ga., and polyester polymers, such as Vitel(R) 1870 and Vitel(R) 3300, which are commercial available from Shell Chemical Co., Akron, Ohio. These materials are disclosed in U.S. Pat. No. 5,346,558 (Mathias) in the context of conventional solderable anisotropically conductive compositions and methods for using the same. The adhesive system for the tack layer should either be compatible with a commercially available ferrofluid or be capable of acting as a carrier for the suitably treated magnetically polarizable particles which are used in the making of a ferrofluid.

The curable tack layer composition, like the film-forming composition, may be one that undergoes a one-step or two-step cure or solidification (or is reversibly solidifiable). In the first step, the tack layer is sufficient to adhere and maintain in place the particles. In the second step, particularly where it is desired to adhere the so-formed tacked array or film to a substrate, a full cure or solidification or resolidification is attained. Such a result may be achieved by use of curable compositions, which include two or more polymerizable systems, a primary cure system and a secondary or latent cure system, or monomers which have two or more reactive or functional groups thereon, e.g., an epoxy and acrylate.

Suitable solidifiable backfilling or film-forming materials may be organic or inorganic and solidification may occur through a variety of mechanisms. Desirable backfilling materials are organic, such as thermosets or thermoplastics, the latter including conventional "commodity" thermoplastics, such as polyolefins, polystyrene and polyvinylchloride, as well as "engineered" thermoplastics, such as polyalkylene terephthalates, polycarbonates, polyetherimides, polyphenylene ethers, polyetheretherketones, and the like. Thermoset materials include, but are not limited to, those materials discussed above as suitable for the tack layer, save the ferrofluid or ferromagnetic particles. Cure or polymerization of the film-forming materials may occur through free radical, anaerobic, photoactivated, air-activated, cationic, anionic, heat-activated, moisture-activated, instant or other cure systems, such as the addition of hardeners to resins. In addition, one cure system may be used in the A-stage or primary solidification, and a second, distinct cure system may be used in the B-stage. Those persons skilled in the art should recognize that other curable or solidifiable monomers, oligomers, pre-polymers and polymer materials and systems may be employed as the film-forming material.

Backfilling may be accomplished by pouring or dispensing the film-forming material onto the tacked layer or the adhesive film. Additionally, backfilling may be accomplished by squeegeeing the film-forming material onto the tacked layer or adhesive film. Alternatively, backfilling may be accomplished by pressing together a carrier film or substrate having a layer of film-forming material disposed thereon and a tacked array or an adhesive film with the particles disposed thereon. The film-forming material should be in a liquid or readily penetrable state. In this way, the particles may penetrate to a depth of at least about 50% of the height of the largest particles, such as least about 95% of the height of the largest particles. For backfilling the layer of film forming material is desirably less than about 125% of the height of the largest particle and desirably of a thickness within the range of from about 95% to about 110% of the height of the largest particle, such as from about 95% to about 100% of the height of the largest particle. These ratios may vary depending upon the depth to which the particles penetrate the tack layer or adhesive film. After cure or A-stage cure, the carrier film or substrate may be removed. Alternatively, the carrier fiber or substrate may be removed just prior to use of the so-formed film in its intended end-use application.

The carrier film may also be a latent adhesive or have a layer of adhesive or latent adhesive material on the face opposite the film-forming material so that in use, the adhesive or latent adhesive is activated to bond the film to a second substrate and the carrier film itself should be sufficiently pliable or penetrable to allow the particles to penetrate therethrough in assembling a device, particularly an electronic device, with the film.

The monomer composition at which the ferrofluid is comprised may include two polymerizable systems, one of which cures wholly or partially in the A-stage or primary solidification, and the second of which cures in the B-stage (accompanied by further curing of the first system, if appropriate). Alternatively or additionally, the monomers themselves may be hybrids having more than one reactive or curable functionality, such as an epoxy acrylate.

The substantive particles may also be magnetic.

Depending upon the end-use application of the products of the present invention, the particles may be conductive or non-conductive. That is the particles may be conductive, whether thermally or electrically conductive, or optically transmissive. Those persons skilled in the art should recognize the wide-range applicability of this invention and should choose appropriate particles for the intended result, e.g., glass or transparent/translucent polymer particles for optical transmission; carbon, carbon black, alumina, zinc oxide, magnesium oxide and ferric oxide for thermal conductivity; and silver, copper, gold, nickel and the like for electric conductivity. Alloy particles, especially solders, may also be used as electrically conductive particles. The '558 patent describes solder powder whose particle size is less than 37 micrometers and preferably less than 15 micrometers. International Patent Publication No. WO 93/1248 describes a superfine solder powder, average diameter 10 micrometers available from Nippon Atomizer.

However, for electronic applications, the substantive particles should be electrically conductive and substantially non-magnetic. The term non-magnetic as used herein means that each particle has no significant net magnetic dipole. A particle with a "non-magnetic" core may have a coating of a metal (such as, nickel) which is ferromagnetic in nature. But in view of the small volume of the coating, the net magnetic moment per unit volume of the particle is not significant. The substantially non-magnetic particles do not typically respond to magnetic fields in environments which themselves are not susceptible to magnetic fields, such as a non-ferromagnetic liquid medium. Suitable particles may be constructed entirely of conductive materials or they may have a non-magnetic non-conductive core, such as of a plastics material like polystyrene, or of glass, coated with an electrically-conductive metal like nickel, silver or gold. A core of conductive material, such as graphite or a metal, may also be used. The core may optionally be hollow, such as a hollow glass sphere with an outer coating of a conductive material. Particles of carbon fibre or solder may also be used.

The substantive particles may suitably have a size in the range of about 1 to about 300 micrometers. Spherical particles are desirable but other spheroidal shapes, elongated shapes, cylindrical shapes, regular shapes, such as cubic or fibrous structures, may also be used. For spherical particles, a diameter in the range of about 2 to about 100 micrometers is desirable, such as about 2 to about 50 micrometers, particularly about 5 to about 30 micrometers or about 5 to about 20 micrometers.

For particles having a major dimension and a minor dimension, the major dimension is desirably in the range of about 2 to about 300 micrometers and the minor dimension is desirably in the range of about 2 to about 100 micrometers, such as 2–50 micrometers, particularly 5–30 micrometers, or 5–20 micrometers, with the aspect ratio being in the range of about 15/1 to about 1/1, more particularly 10/1 to 1/1.

In the case of fibrous structures, an aspect ratio of up to about 50/1 may be acceptable. If used, fibres should be of substantially uniform length (e.g., in the form of cylinders) and arrayed so that their long axes are orthogonal to the substrate.

Application of a magnetic field to the ferrofluid composition creates interactions between the colloidal ferromagnetic particles and the non-magnetic substantive particles. These interactions result in mutual stabilization in a non-random structural pattern (with chain formation where the appropriate dimension of a layer of the composition so permits) due to attractive interactions between particles and repulsive interaction between chains [see Skjeltorp, "One- and Two-Dimensional Crystallization of Magnetic Holes", Physical Review Letters, 51(25) 2306–2309 (19 Dec. 1983)].

The concentration of substantive particles in the composition should be chosen according to the desired spacing between those particles in the ordered array and other factors. With spherical particles of about 2 micrometers diameter, a concentration in a monolayer of about $10^7$ particles per square centimeter may be suitable. A qualitative concentration in the range 0.5–60%, by weight of the composition may also be suitable (see U.S. Pat. No. 5,366,140, the disclosure of which is hereby expressly incorporated herein by reference, particularly column 2, lines 24–28, which describes average densities of about 600–6,000,000 microbeads/$cm^2$, such as 160,000–6,000,000 beads/$cm^2$).

Desirable concentrations of substantive particles depend upon a number of factors that can be determined by those person skilled in the art through routine experimentation and/or mathematical calculations. U.S. Pat. No. 4,846,988 (Skjeltorp) notes that the concentration of magnetic holes in ferrofluids polarized with a magnetic field, determines the distance between them. Shiozawa et. al., 1st International Conference on Adhesive Joining Technology in Electronics Manufacturing, Berlin (November 1994) indicates that contact resistance in traditional anisotropically conductive adhesives decreases as particle count (per unit area) increases. An increasing number of conductive particles increases the current carrying capacity. The current carrying capabilities are not only concentration dependent but also particle type dependent [see Lyons and Dahringer in Handbook of Adhesives Technology, Pizzi and Mittal, eds., Marcel Dekker Inc., p. 578, (1994)].

Thus, the actual concentration of conductive particles should depend on the particle type, density, diameter, electrical pattern, minimum required contact resistance measurements, the spacing between opposing and adjacent conductors, the surface area of the conductors and the like.

Li and Morris, 1st International Conference on Adhesive Joining Technology in Electronics Manufacturing, Berlin (November 1994) describe computer programs, which calculate the minimum pad size for different loading densities and the minimum pad space for different particle sizes of conductive particles in conductive adhesives. In ordering the array of particles, a magnetic field may be applied by a permanent magnet or by electromagnetic means. The magnetic field is described to be in the range of 10 mT to 1000 mT, such as 10 mT to 100 mT, applied for a time in the range 0.1 to 10 minutes, such as 0.5 to 5 minutes. The magnetization saturation of the ferrofluid composition should influence the selection of the magnetic field strength.

Films or coatings according to the present invention containing electrically-conductive particles are intended for use in electrical interconnection of active and/or passive electronic components, for example chip-on-board, chip-on-flex, chip-on-glass and board/flex and flex/glass. The invention is particularly well suited for interconnection of fine-pitch sets of conductors and for flip-chip technology.

The present invention further provides a product in the form of the tack layer following removal of the particles therefrom. The tack layer, free of particles, may inherently produce a result of the separation of an adhesive film with the particles adhering thereto away from the layer of cured curable composition or cured curable ferrofluid composition in the method of C or G above, respectively. The so-formed product includes a layer of cured composition having apertures or recesses therein corresponding to the locations of particles, such as arrayed particles.

The invention also provides an adhesive film having recesses in the adhesive surface layer thereof, produced as a result of removal of particles formerly adhered thereto in the method of C or G above. The removal of particles from the adhesive film should be effected by applying to the particles a second adhesive film having an adhesiveness with respect to the particles greater than that of the first adhesive film. Alternatively, the recesses may be created in the second adhesive film by removal of the particles therefrom by applying a third adhesive film having even stronger adhesiveness with respect to the particles than the second adhesive. This procedure may be repeated in a mastering operation from one adhesive film to another with greater adhesiveness. The adhesive film may be in the form of a pressure sensitive adhesive tape.

The array of craters in the first (or subsequent) adhesive film may be of higher quality than that in the cured tack layer because of possible roughness in the tack layer after removal of uncured curable composition.

The particle array on the first adhesive film may also be used as a master to create a pattern by stamping, or the like, into a substrate capable of producing a smooth surface and retaining the shapes of the recesses created by the particles.

The recesses or "craters" may be circular in outline, or may have non-circular shapes, such as squares or hexagons, depending upon the cross-section of the particles. The craters may have a parabolic or flat base, depending upon the shape of the particles.

The crater arrays may be overcoated with a thin layer of moldable material, such as metal, for example to make a reflector array of parabolic mirrors, or glass, for example to make waveguides with geodesic optical elements incorporated thereon.

The invention also provides a film having apertures therein corresponding to the locations of particles, such as in an arrayed pattern, produced by removing particles from a film produced by the method of C, D, G or H above. The particles may, for example, be removed from the film by treatment with a solvent, which dissolves the particles but not the film, e.g., THF or acetone for dissolving polystyrene spherical particles.

The cratered array may also be prepared from other backfill materials including ceramics or metallics, and highly resistant polymers. Particles may be removed by dissolution, pyrolysis and the like to leave voids in an arrayed configuration in the film, which may be useful for example in membrane applications, mastergrid applications for displays or display elements, confining other species such as liquid crystals, photochromic materials, dyes, photosensitive or emissive materials, or for vibrating plate orifice devices for aerosol production [Berglund, R. N., Environmental Science and Technology, 7, 2, 147 (1973)].

The invention additionally provides a method of making an assembly of two components which includes forming a monolayer of particles in a cured layer of curable composition according to the method of A or E, removing the uncured curable composition, bringing the second component into contact with the particles, and applying a fluid adhesive material into the space between the components and optionally over the assembly. The method is particularly suitable for forming a "globbed" assembly of an electronic device onto a substrate such as a board. The cured tack layer with the particles arrayed therein is created on the substrate and the device is assembled onto the particle array. It may optionally be held in position by a "chipbonder" adhesive in small quantities, or the particles themselves may have adhesive properties, such as is described in the WO '820 publication. The assembly may then be globbed and underfilled simultaneously by applying adhesive over the device and into the space between the two components including the interstitial space between the particles. This method maximizes electrical contact and environmental protection for the particles.

The following examples serve to provide further appreciation of the invention but are not meant in any way to restrict the effective scope thereof:

EXAMPLES

In the Examples, the following abbreviations are used:

Ms=Magnetization saturation

G=Gauss

T=Tesla mPa·s=($10^{-3}Nm^{-2}s$)=centipoise

Example 1

A curable ferroadhesive composition was prepared from the formulation described below:

| Reference Number | Component | Percent w/w |
|---|---|---|
| 1 | Epoxy-Acrylate, resin IRR 282, UCB Chemicals, Drogenbos, Belgium | 36.71 |
| 2 | Bisphenol F, Dow, US | 10.84 |
| 3 | Irgacure 1700, Ciba-Geigy, UK | 3.85 |
| 4 | Butane diol diacrylate | 26.92 |
| 5 | DICY (dicyandiamide) | 5.24 |
| 6 | Benzyl dimethylamine | 0.35 |
| 7 | Au-coated spheres, Sekisui KK, Osaka, Japan | 16.08 |

In order to optimize viscosity and magnetic strength of the formulation, item 1 was derived from an IRR282 based ferrofluid ($M_s$ 115 G; viscosity at 27° C. of 115 mPa·s) and 29.8% of item 4 was derived from a butane diol diacrylate based ferrofluid ($M_s$ 116 G; viscosity at 27° C. of 12 mPa·s). The ferrofluids were prepared by Liquids Research Limited, Unit 3, Mentech, Deinol Road, Bangor, Gwynedd, U.K.

The residual balance of item 4 was derived from pure butane diol diacrylate monomer. The formulation formed a stable colloid when all ingredients were admixed. The magnetic strength of the resulting low viscosity formulation was approximately 50 G. The gold-coated spheres were either exclusively 12, or exclusively 25 micrometers in diameter.

This particle-containing ferroadhesive composition was applied to a microscope slide and confined by placing a glass cover slip on top of the liquid formulation. The liquid film was squeezed gently with even pressure to give a uniform film which was less than two particle diameters in thickness. The sample was poled in a Halbach magnetic cylinder with a uniform magnetic field of 0.6 T for approximately 30 seconds at room temperature (approx. 26° C.). The field direction was perpendicular to the substrate plane. The sample was removed from the poling field and irradiated with UV light from the microscope slide side for 0.2 of a second. The glass cover slip was then prized off with a blade and the upper portion of the sample was seen to be in a substantially uncured liquid form. Inspection under the microscope however revealed that an ordered particle array was still intact following the delamination of the top cover slip, and the gold particles were completely uncovered by material. There was nevertheless some free liquid material still surrounding the particles. The free liquid material was washed from the sample with a jet of acetone. Washings were coloured with ferrofluid. The sample was re-examined under the microscope to reveal an intact array of bright gold particles on a dry surface. No trace of liquid material was observed in the particle interstitial spaces. Electron microscopy revealed that a 23.6 micrometers of a 25 micrometer diameter particle was standing proud on a cured layer of the ferroadhesive composition as shown in FIG. 1 i.e. the cured layer had a thickness of 1.4 micrometers which is 5.6% of the diameter of the particles. This distance could be controlled by adjusting parameters relating to the absorption of the ferrofluid composition, the confining structure and the illumination conditions.

The array of ordered particles standing proud on the surface was backfilled with film-forming adhesive of the composition tabulated above i.e. of identical composition to that from which the ferroadhesive was derived except that it contained no magnetite nor ingredients necessary to disperse same. The backfilling material filled the interstitial spaces between the particles. This backfilled system was confined by a cover slip and again irradiated from the slide side, now for ten seconds, to invoke an A-stage cure as described in the second parent application, Example 7. The A-staged film was peeled free from confining cover slip and substrate sequentially and used in electrical and mechanical tests.

Mechanical testing involved bonding a 36 mm² silicon die onto an FR4 substrate with the above-mentioned film. The bonding conditions (B-stage cure) for both the backfill and the tack layer were: 90 seconds, 100N, and approximately 180° C. in the bondline. The sample was left for one hour at room temperature before die shear testing. Die shear strengths averaging 13 mPa were recorded. Typical values obtained in identical tests for pure ferroadhesives were around 4 mPa.

Electrical testing of the sample prepared according to the invention showed Z-axis contact resistance of 350 mOhms. The backfilling material was an electrical insulator with contact resistance in excess of 200 kOhms.

Example 2

Figure 2:
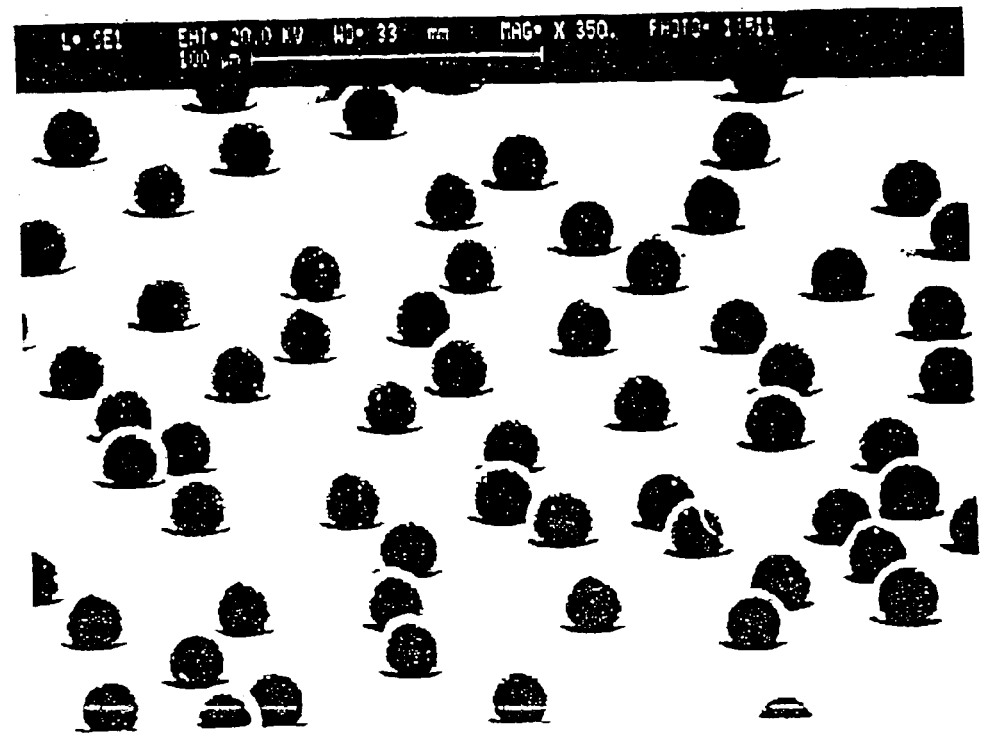
FIG. 2 is an electron micrograph at a magnification×350 of similar particles transferred to a pressure-sensitive adhesive tape as described in Example 2.
Figure 3:
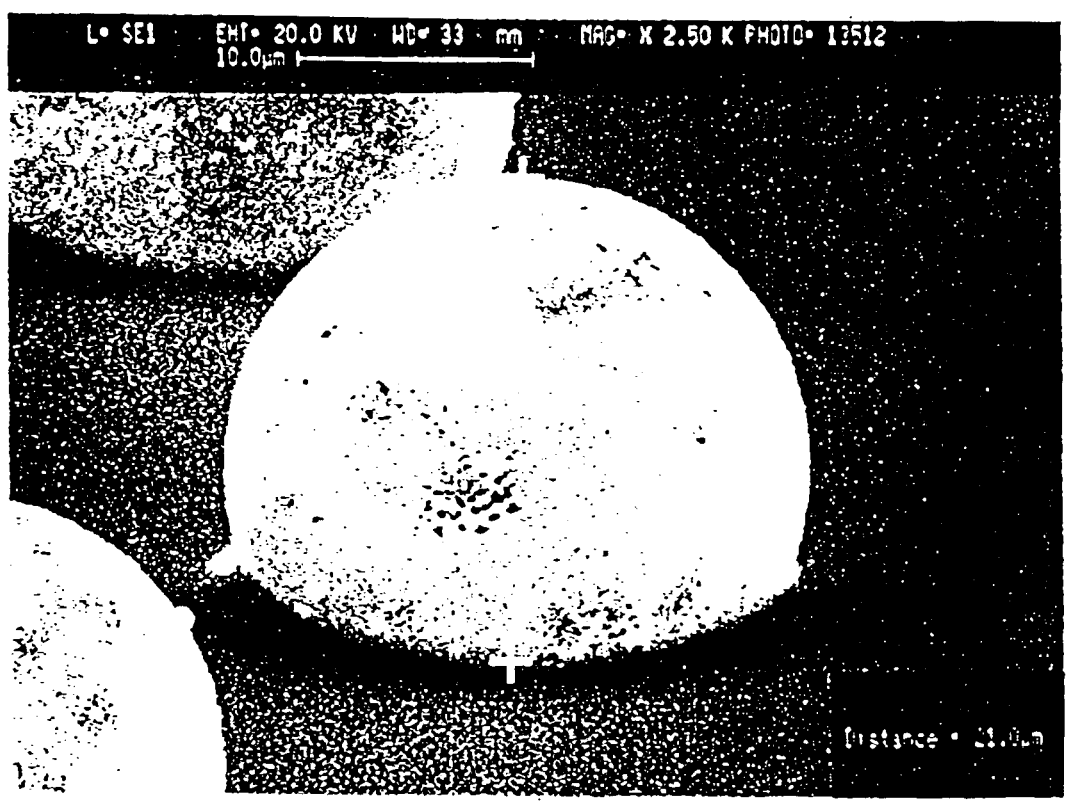
FIG. 3 is an enlarged view at a magnification×2,500 of similar particles to those of FIG. 2, showing in particular one of the particles embedded in the pressure-sensitive adhesive.
Figure 4:
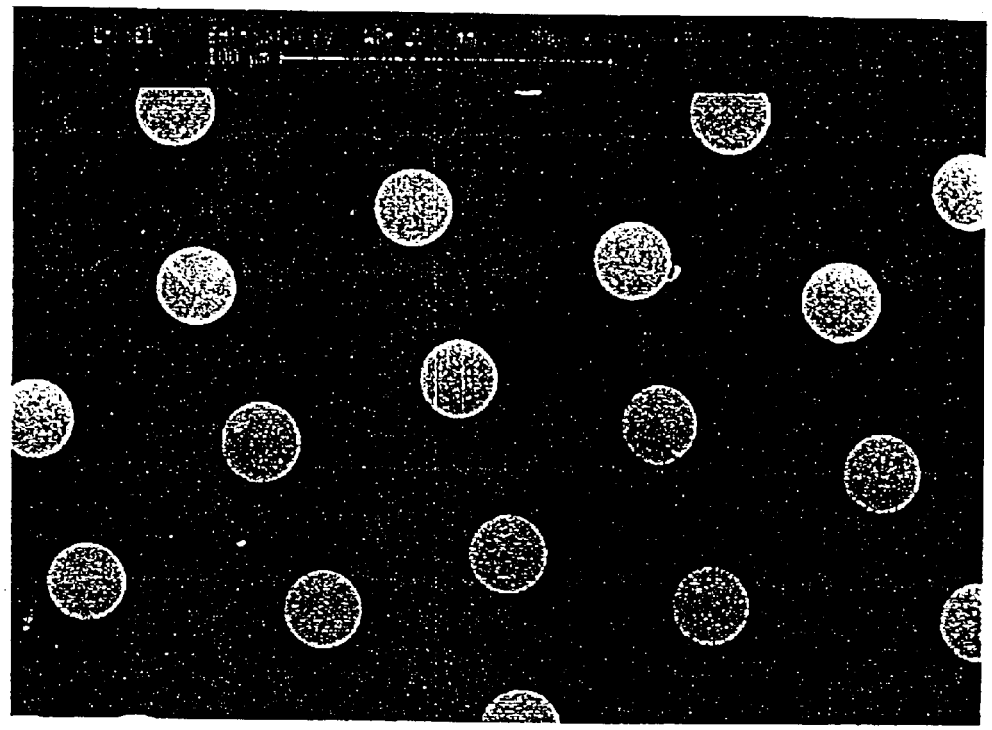
FIG. 4 is an electron micrograph at a magnification×400 of particles on a cured tack layer.

An identical experiment to that described in Example 1 was conducted up to the point where the ordered array was washed and left adhering to a cured layer of the ferroadhesive composition. Next a commercially available pressure sensitive adhesive (PSA) tape (SELLOTAPE) was used to transfer the ordered array of particles from the cured ferroadhesive layer directly on to the PSA while retaining order as shown by electron microscopy and illustrated in FIGS. 2 and 3. In this way the particles were set free from the cured ferroadhesive layer or tack layer. The top of the spheres shown in FIG. 2 corresponds to the bottom, or tacked portion, of the spheres shown in FIG. 1. Depending on the applied pressure the particles may be transferred into the PSA to different depths. FIG. 3 shows a 25 micrometer sphere embedded to a distance of 4 micrometers in the PSA. The particles supported on the PSA were backfilled and part cured (A-stage) in the same way and to the same effect as described in the previous example. The liner on the PSA tape was removed for test purposes, but otherwise supported the films and facilitated handling. The transfer operation left behind an array of craters in the ferroadhesive layer or tack layer remaining on the substrate. This ferroadhesive layer with the array of craters therein could be used for other purposes.

Example 3

Since the function of the ferroadhesive composition is to order and tack particles, it is not necessary that this material be formulated to impart dual stage cures or any specific strength characteristics. However it is advantageous if the ferroadhesive adheres better to the substrate than to the backfilled matrix of film-forming material. To this end acrylic acid was admixed with the commercially available ferrofluid APG 511A (Ferrofluidics Inc., NH, USA) in a 1:1 mix together with some 10% of photoinitiator IC 1700 (Ciba-Geigy, UK) (cf. WO 95/20820 Example 18–19). This produced a polymerizable fluid with a magnetic saturation of almost 90 G and with a viscosity considerably less than 40 mPa·s at room temperature (APG 511A alone has a room temperature viscosity of 40 mPa·s, whereas acrylic acid is of lower viscosity) which was extremely responsive to a magnetic field and capable of ordering included magnetic holes (i.e., particles) in one to three seconds at room temperature. Various other ratios of acrylic acid and APG511A were used to get greater magnetic strength or greater polymerization. Ordered arrays were established by the means described in Example 1 (photocure for 0.2 seconds). The ordered particles were washed on the cured polyacrylic acid layer with acetone and the tack layer remained intact.

The skeletal array of particles was backfilled with the non-ferroadhesive equivalent of the curable composition tabulated in Example 1. The backfilled adhesive was cured for ten seconds as previously described (A-stage) and stripped free from the cured polyacrylic acid film layer which remained tenaciously adhered to the substrate due to its rich polar structure. The free standing test film was completely transparent and uncoloured by ferrofluid and comprised an array of bright gold spheres. This was subjected to mechanical and electrical testing according to the methods already described. Mechanical testing showed die shear strengths of 10 mPa and electrical testing showed a Z axis contact resistance of some 500 mOhms. The backfilled matrix without particles was an electrical insulator.

Example 4

A commercial double-sided PSA tape (SELLOTAPE) was used to prepare a test substrate. One side was adhered to a glass microscope slide and the other side which faced upwards was stripped of its siliconized backing film. A commercially available (non-polymerizable) ferrofluid (APG 511A from Ferrofluidics Inc., NH, USA) containing 25 micrometer Au-coated uniform plastic spheres at approximately 10% w/w was prepared and applied on top of the PSA tape. A siliconized release paper was gently placed on top of the ferrofluid droplet taking care not to press so much that particles became stuck to the PSA before ordering. This was achieved by placing a glass cover slip on top of the siliconized paper to function as a low mass weight which would exert pressure over a given area. The sample was poled in a uniform magnetic field as described in the second parent application. After poling for one to three seconds the sample was removed and pressure was uniformly applied to the assembly to drive the particles onto the PSA surface. The siliconized paper was removed and the sample was washed free of ferrofluid with a brief acetone wash. Optical inspection revealed that an array of ordered particles remained on the PSA which could be backfilled by the method described in the previous examples.

Examples 5–11 illustrate further ferrofluid adhesive compositions useful in the invention and techniques for orienting particles in a magnetic field.

Example 5

Magnetite particles of average particle diameter 9.7 nanometers, (Liquids Research Limited, Unit 3, Mentech, Deiniol Road, Bangor, Gwynedd, U.K.) were coated with oleic acid and dispersed in heptane at an appropriate content (3.5% and 8.4%) by volume magnetite to produce fluids with magnetizable saturation of 100 G and 250 G as described below. Five milliliters of the above mentioned heptane-based material was added to 5 ml of butane diol dimethacrylate and a further 2 ml of a secondary surfactant was added which was an acid form of an aromatic phosphate ester sold under the Trade Mark GAFAC RE610 by GAF (Great Britain) Limited and now available as RHODAFAC RE610=GAFAC RE610 from Rhone Poulenc Chimie, France. This is described as nonoxynol-9-phosphate.

A good quality ferrofluid resulted with good stability. Fluids with magnetizable saturation of 100 G and 250 G were thus prepared. The saturation magnetization curve was steep and typical of superparamagnetic systems in that it exhibited no hysteresis. These fluids, even when formulated with radical initiators, were stable for periods of one year at room temperature when stored in air permeable polyethylene bottles such as those used for the storage of traditional anaerobic adhesives by those skilled in the art.

The butane diol dimethacrylate ferrofluids could be polymerized in the bulk with standard radical photo and/or thermal initiator systems.

To the butane diol dimethacrylate based ferrofluid of 100 G was added 10% weight/weight spherical gold-plated cross-linked polystyrene microparticles of 11 micrometer diameter and 6% w/w of photoinitiator 2,2-dimethoxy-2-phenyl acetophenone.

The particles are essentially monodisperse (i.e., of substantially uniform shape and diameter) and are an article of commerce from Sekisui Fine Chemical Co. Ltd., Osaka, Japan.

Example 6

Figure 6A:
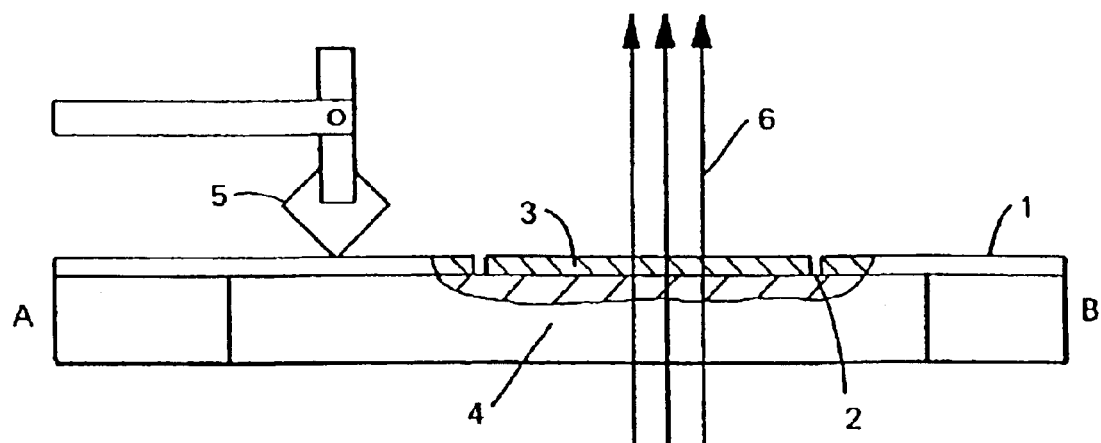
FIG. 6(a) is a diagram (side view) of apparatus for carrying out the coating method of Example 7.
Figure 6B:
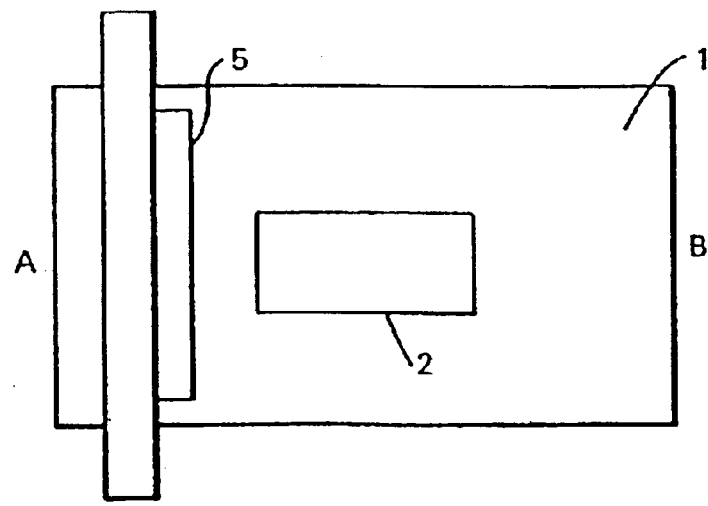
FIG. 6(b) is a top view diagram of the apparatus of FIG. 6(a).

(a) In order to demonstrate the in situ ordering of magnetic holes in a ferrofluid coating, the following experiment was conducted. A DEK 245 high performance multipurpose screen printer was modified in such a way that a substantially uniform magnetic field could be applied to a specific area of an overlying substrate, such that the direction of the magnetic field was orthogonal to the substrate and the so-called 'worktable' of the printer (DEK Printing Machines LTD, Dorset, England). As shown in FIGS. 6(a) and 6(b) the conventional worktable of the DEK 245 was replaced with a custom-built worktable which comprised a polished aluminum surface plate (320 mm×240 mm) (1) with a central milled depression (2) sufficient to accommodate a standard glass microscope slide (approximately 76 mm×25 mm) (3).

The polished plate was mounted over an array of flat permanent magnets arranged so that a stripe of magnetic material (4) some 170 mm long by 50 mm wide lay directly beneath the milled depression in the plate, the the depression being located approximately 70 mm from the squeegee (5) end of the stripe so that a magnetic field was developed in advance of the substrate (slide 3) with respect to the direction of print, the direction of print being that which moves squeegee blade (5) from left of FIG. 6(a) (A end) to the right of the FIG. 6(b)(B end). The magnetic stripe was constructed from a series of flat ferrite magnets each 40 mm×25 mm×8 mm (length×width×depth). These were poled across their thickness and collectively delivered approximately 400 Oe field strength, measured directly on the surface of the overlying polished plate. Each magnet had its flat face parallel to the face of polished worktable top plate (1) and was arranged so that the long dimension of each magnet was parallel to the long axis of the top plate. Flanking the central magnetic stripe on either side, were two similar stripes poled in the opposite direction to the central stripe. All three stripes were bonded together to complete a magnetic circuit with vertical flux lines rising up through the substrate coincident with the milled depression (2) in the top plate (1).

In comparative experiments where no magnetic field was required, the same polished top plate was used, but the array of underlying magnets was temporarily removed.

A particle-filled ferrofluid formulation was prepared based on a commercially available ferrofluid having a 1500 mPa·s (1.5 $Nm^{-2}s$) viscosity (APG 057 available from Ferrofluids Inc., NH, U.S.A.) and 10 weight percent of transparent 11 micrometer cross-linked polystyrene spheres (Sekisui Fine Chemical Co. Ltd., Osaka, Japan). The spheres were thoroughly dispersed in the formulation by vigorous mixing. The formulation was applied to the magnetic worktable (1) in a 20 mm stripe positioned about 20 mm in advance of the milled depression (2) which now contained a standard laboratory microscope slide (3). The worktable was raised to a position that would enable the printing of a thin coating of ferrofluid. The worktable position, printing speed, printing pressure, and squeegee type were adjusted in independent experiments to optimize coating for the particular formulation under consideration. The motorized squeegee blade pulled the formulation across the length of the microscope slide. During this coating action the filled fluid experienced a magnetic field. After the printing cycle the squeegee blade lifted free from the worktable surface and reverted to its original position in readiness for another operation.

The coated substrate (3) was examined optically using a microscope connected to an optical image analyzer. The latter equipment is capable of processing the image and assessing the quality of the field-induced ordering of particles in the ferrofluid. The particles order in the ferrofluid coating because they act as magnetic holes in the fluid matrix. The phenomenon of magnetic holes has been described by Skjeltorp [see e.g. "One and Two Dimensional Crystallization of Magnetic Holes" in Physical Review Letter, 51(25), 2306 (1983)] in fluid films which are confined in a cavity formed by two rigid substrates. In this case, the coating was unconfined.

Figure 7:
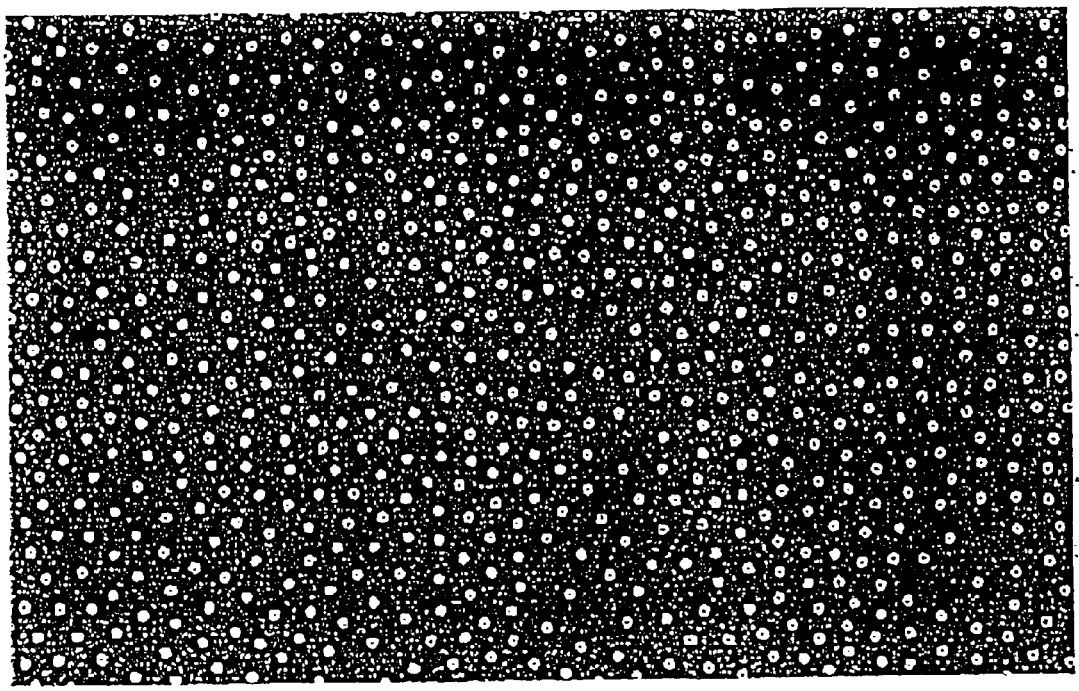
FIG. 7 is an optical photomicrograph of the coating of Example 6 at ×100 magnification, with the transmission field having the following dimensions: 730×490 micrometers, and the particles having a diameter of about 10 micrometers.

Image analysis of the coated substrate indicated that a substantially uniform film with discrete particles dispersed therein resulted as illustrated in FIG. 7.

Figure 8:
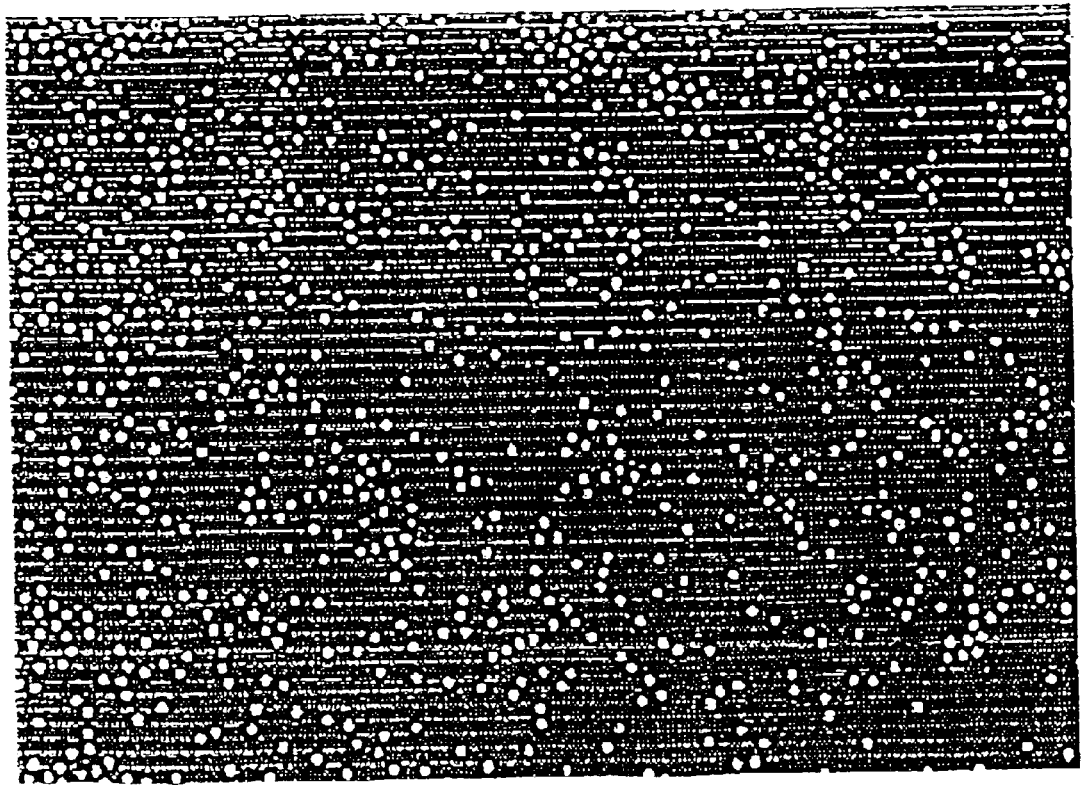
FIG. 8 is an optical photomicrograph similar to FIG. 7 of a coating prepared without the exposure to a magnetic field (comparative).

A comparative experiment was conducted using the above mentioned formulation and methodology except that the array of magnets was removed from the underside of the worktable. The results of this experiment are indicated in FIG. 8 and clearly show that the particles are not uniformly dispersed nor isolated as discrete particle entities.

Although this Example was carried out using a non-curable ferrofluid composition and non-conductive particles, the Example illustrates the method which can be used in drawing down a coating in accordance with the invention, as described elsewhere herein.

(b) In order to demonstrate the effect with polymer-based systems, epoxy-novolac ferrofluid solutions were developed. These essentially comprised resinous materials dissolved in volatile ferrofluids derived from methyl ethyl ketone (MEK) and toluene.

Ferrofluid solvents having $M_s$ values of 112 and 166 G in MEK and toluene respectively were prepared. These were used to dissolve epoxy-novolac DEN 438 EK85 (Dow Deutschland, Werk Rheinmuenster) and bisphenol F epoxy monomers at an overall concentration of 20 w/w. The relative percentage weight of each constituent and curatives are listed below. The concentration, $M_s$, and viscosity of these solutions could be adjusted by solvent evaporation.

| | |
|---|---|
| Epoxy Bisphenol F | 78% |
| DEN 438 EK85 (in ferrofluid solvent) | 13.9% |
| DICY (Dicyandiamide) | 7.0% |
| BDMA (benzyl dimethylamine) | 1.0% |

Conductive particles of 25 micrometer diameter were loaded at 10% w/w into the above-mentioned casting solutions and drawn down onto conductive substrates such as copper or gold clad FR4 boards. The boards were taped in place on an ACCU-LAB™ draw down coater (Industry-Tech., Oldsmar, Fla.) and the formulation was drawn down with Meyer rod to give a wet thickness of approximately 40 micrometers. The coated substrate was placed into a Halbach magnetic cylinder with the uniform field of 0.6 Tesla disposed normally to the sample plane. Poling was conducted when the film was still wet and solvent evaporation proceeded while the sample remained in the magnetic field until a tacky film was obtained. This was examined under the optical microscope and particle ordering was confirmed. The film was subsequently dried by warming at 80° C. for several hours (A-stage drying).

Example 7

An epoxy-based formulation was prepared based on the following composition:

| Component | Commercial name/Supplier | Weight % |
|---|---|---|
| Triglycidyl Aliphatic Ether Resin | HELOXY 5048 (Shell Chemicals) | 38% |
| Cycloaliphatic Epoxy Resin | CYRACURE UVR6351 (Union Carbide) | 10% |
| Bisphenol A Diglycidyl Ether Polymer | ARALDITE 6010 (Ciba) | 50% |
| Thermal and/or Photoinitiator 1 | IRGACURE 261 (Ciba) | 2%* |
| Photoinitiator 2 | GE1014 (General Electric) | 2%* |

*In both cases the initiators were as 50% solutions in propylene carbonate. Therefore 2% above refers to 1% actual initiator(i.e., a 50% solution).

A liquid film of the composition photocured in an 'A' stage (primary cure) after 2×60 second exposures (one per side), yielded a supple solid film. This film could be transferred to a metal lapshear and an adhesive bond formed by overlapping with a further metal lapshear. When this 'sandwich' structure was clamped and heated to approximately 115° C. for 30 minutes, the metal lapshear specimens were strongly bonded (secondary cure).

Figure 9:
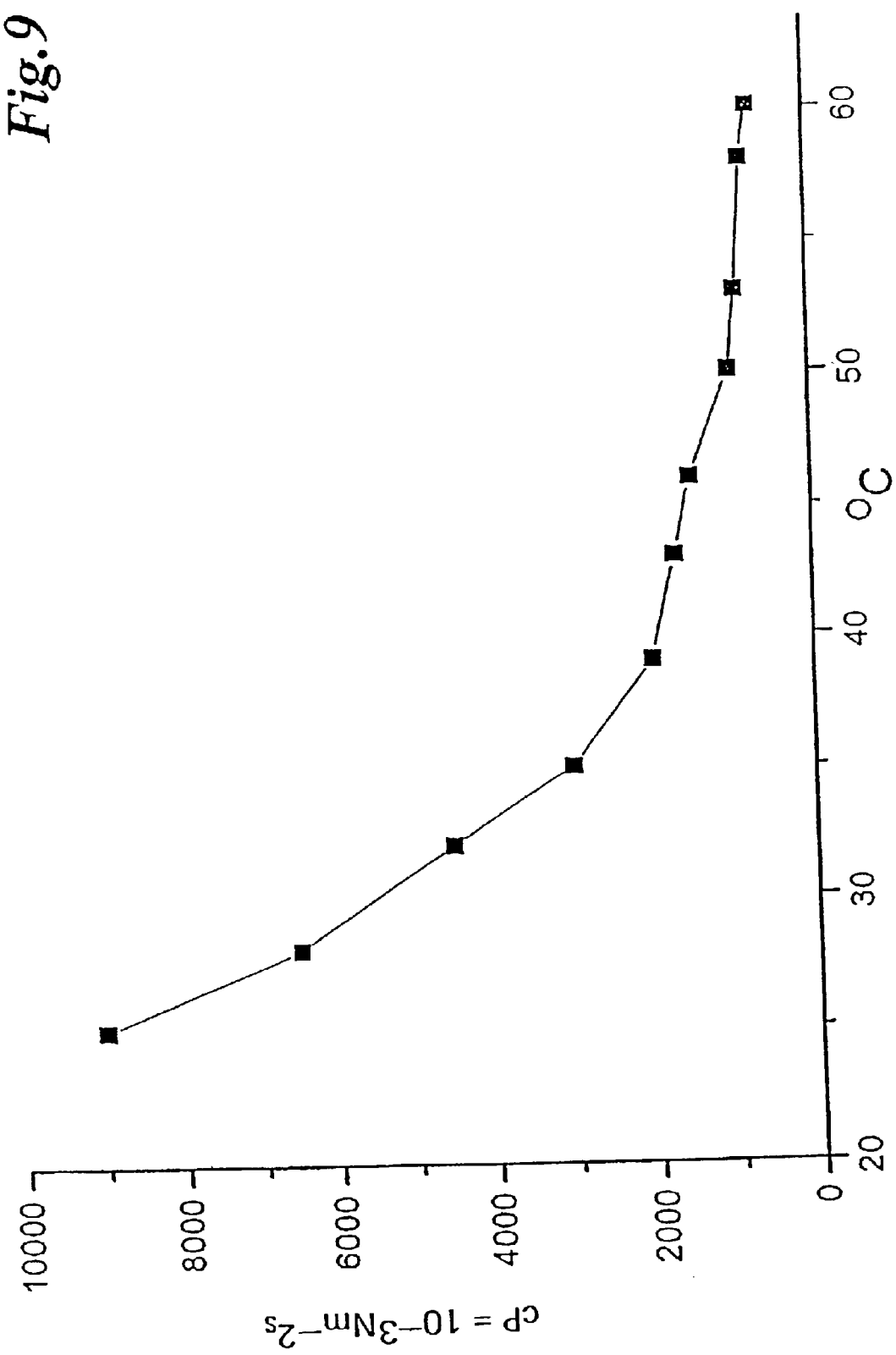
FIG. 9 is a magnetization curve as described in Example 7.
Figure 10:
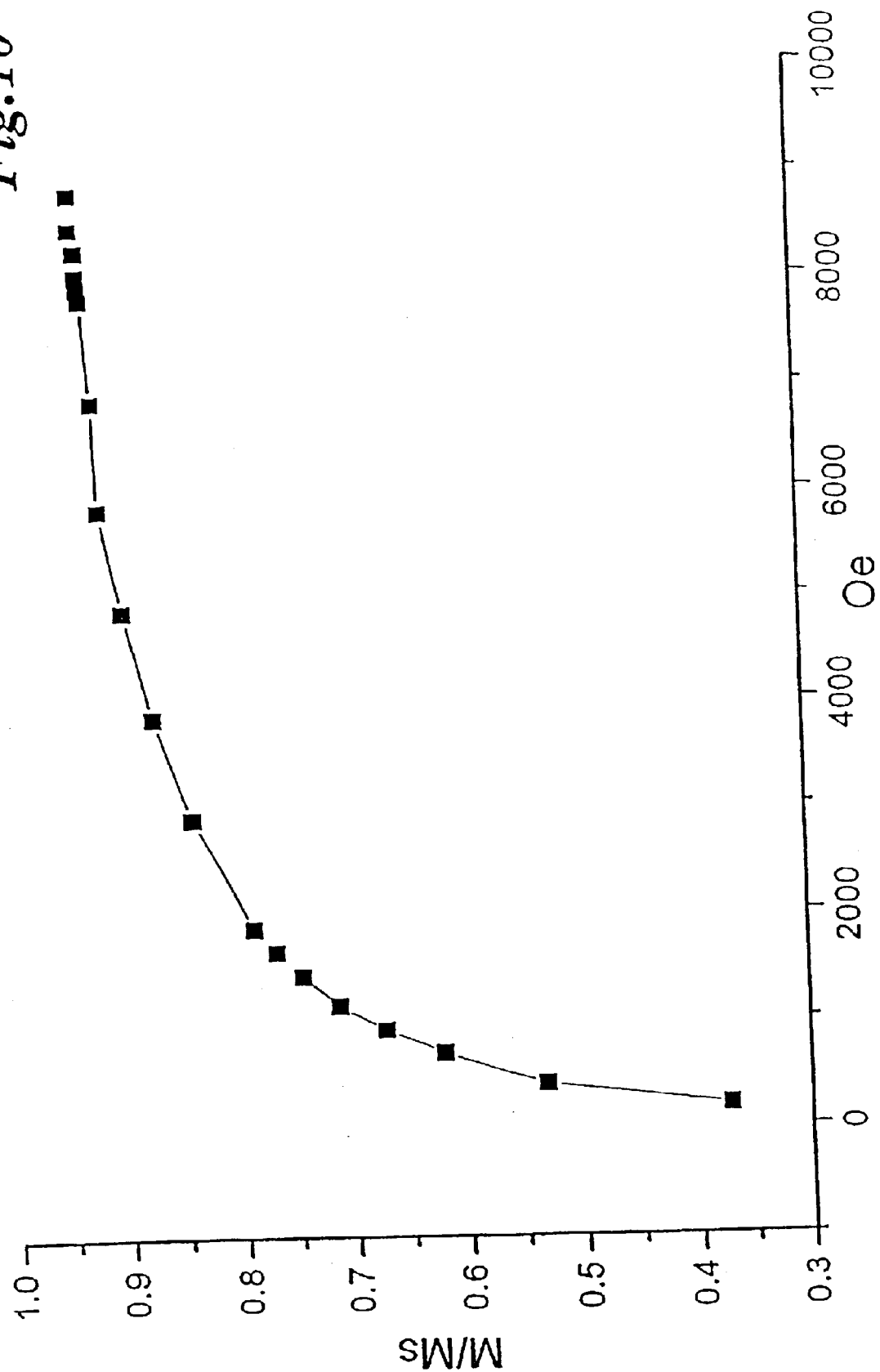
FIG. 10 is a viscosity-temperature profile as described in Example 7, viscosity being measured in centipoise ($Nm^{-2} \times 10^3$).

The composition described above was rendered into a ferrofluid by the addition of precoated magnetite using techniques known to those skilled in the ferrofluid art and alluded to in Example 5 of the application and also in the parent application. The magnetization curve for the epoxy ferrofluid is shown in FIG. 9. The magnetization saturation for this fluid was 97 gauss. The viscosity-temperature profile for this fluid (designated) LOC 22 is illustrated in FIG. 10.

The viscosity of the ferrofluid was further modified by dilution with 10% of the CYRACURE UVR6351 cycloaliphatic epoxy resin. A thin liquid film of this composition could be photocured to form a supple film as noted previously. However the ferrofluidized version had increased exposure times (2.5 minutes per side), even with increased levels of the photoinitiators.

To the liquid epoxy ferrofluid composition was added 15% (w/w) 11.5 micrometer gold-coated polymer monospheres available from Sekisui Fine Chemical Co. Ltd., Osaka, Japan.

Example 8

Adhesives derived from coatings or films can be made by B-staging a pre-cast material. In such cases, the primary solidification, or A-stage, may result from solvent evaporation and/or partially induced thermal cure. The A-stage, which has the function of locking conductor particle arrays in place, may equally be performed by chemical reactions which cause partial gelling at temperatures which are nevertheless well below the thermal threshold temperature required to trigger latent polymerization catalysts used to activate subsequent B-stages, e.g., <120° C. in the case of dicyandiamide (DICY). An example of a system that operates at room temperature involves reaction between multifunctional isocyanates and polyols to yield a polyurethane. The ferrofluid content of such a formulation may be derived from a ferrofluid polyol, a ferrofluid isocyanate or from some other monomeric system which does not enter into polyurethane formation but is present to provide subsequent heat cure, eg, ferrofluid epoxy or acrylic monomers. The formulation below has been used to order conductive particles and lock them in place by chemical reactions (polyurethane formation) at room temperature which were unassisted by light:

| | |
|---|---|
| Hexamethylene Diisocyanate | 1.1 g |
| Hydroxy Ethyl Methacrylate (HEMA) | 0.7 g |
| Ferrofluid - Butane Diol Diglycidyl Ether ($M_s$ = 343 G) | 1.47 g |
| DICY | 0.07 g |
| Benzyl Dimethylamine | 0.015 g |
| 25 micrometre Au-coated polystyrene spheres | 0.1 g |

An alternative approach to locking particles in ordered arrays in ferrofluid adhesives involves photochemistry. Thus the A-stage can be a photoinduced cationic or radical cure. Formulations which respond in this way may only partially cure with light, or may comprise two different types of reacting system which act independently (in the same or in different monomers). In the former cases a mixed cycloaliphatic and non-cycloaliphatic system may be partially cured with photocationic initiators and subsequently thermally cured in a B-stage process. In the latter case, a mixed acrylic-epoxy system may be designed and a photo-induced radical cure used to act on the acrylic functionalities to lock ordered conductor arrays in place. Examples which follow describe these approaches in detail.

Example 9

Figure 5:
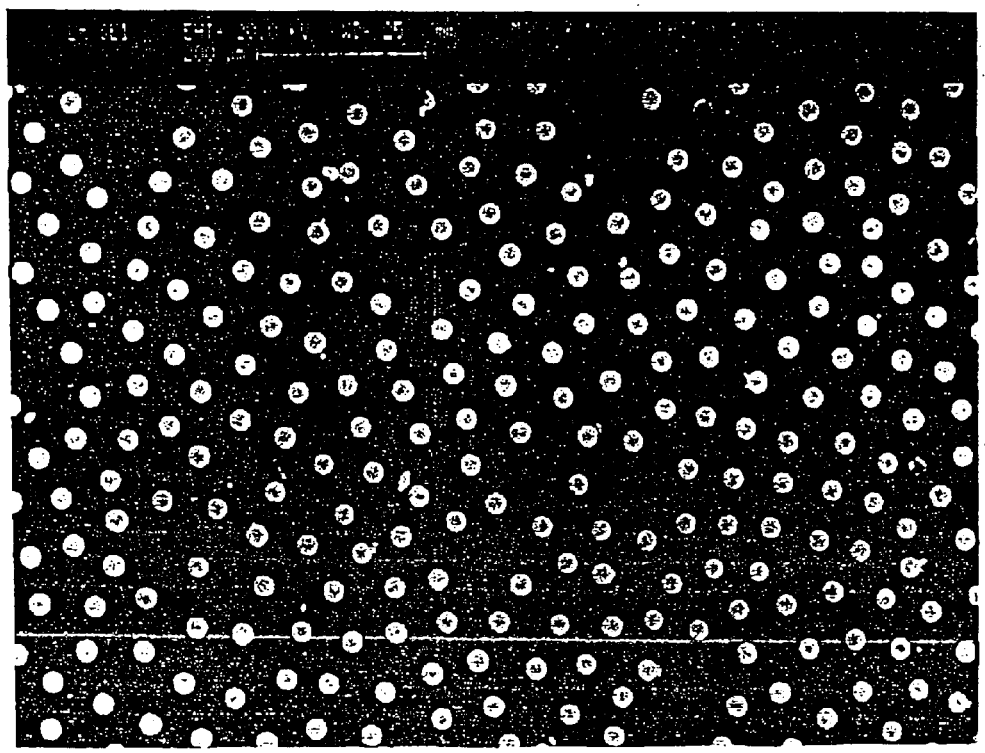
FIG. 5 is an electron micrograph at a magnification×100 of the same cured tack layer.
Figure 11A:
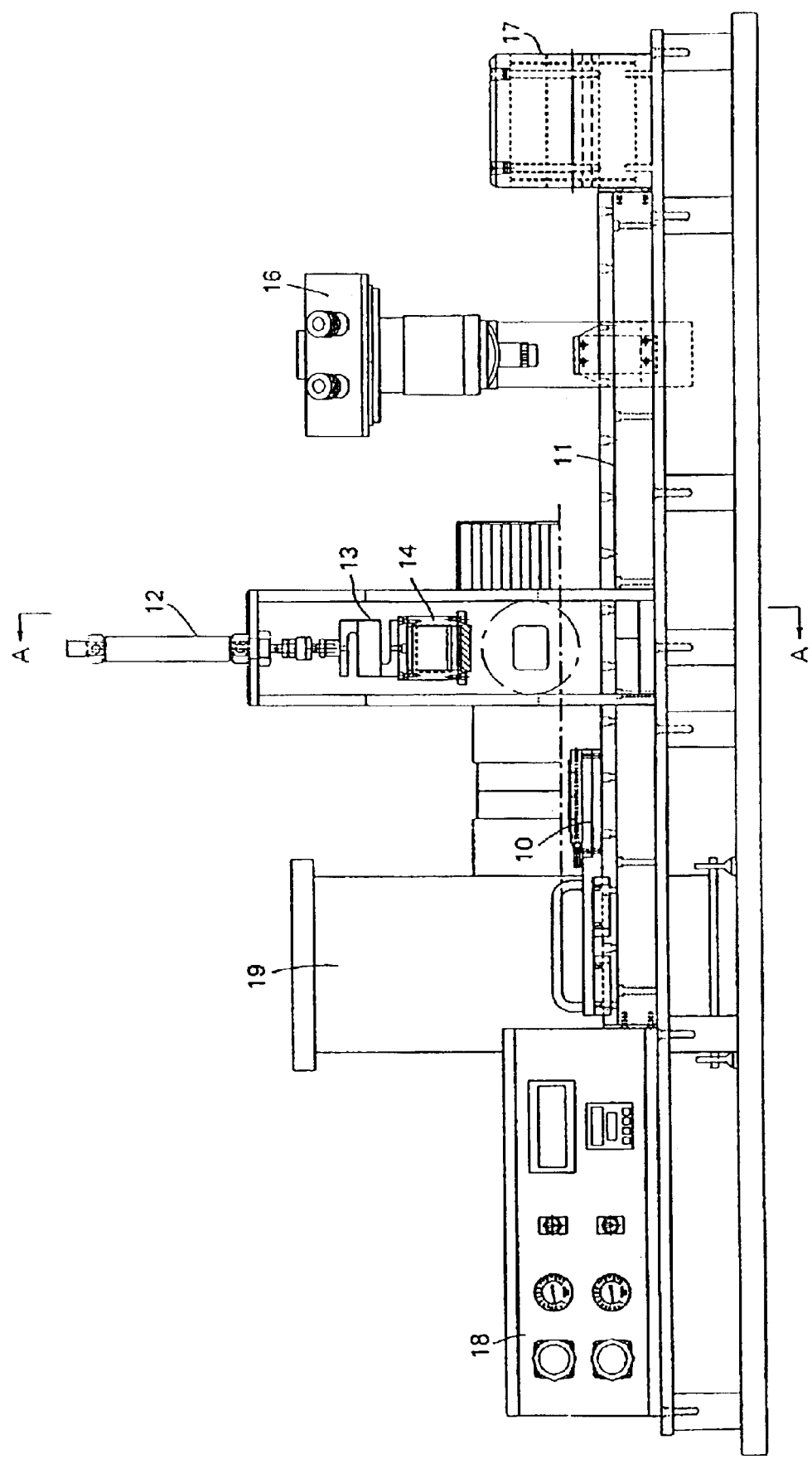
FIG. 11(a) is a diagram in side elevation of an apparatus designed and built to produce films having anisotropic conductive pathways.
Figure 11B:
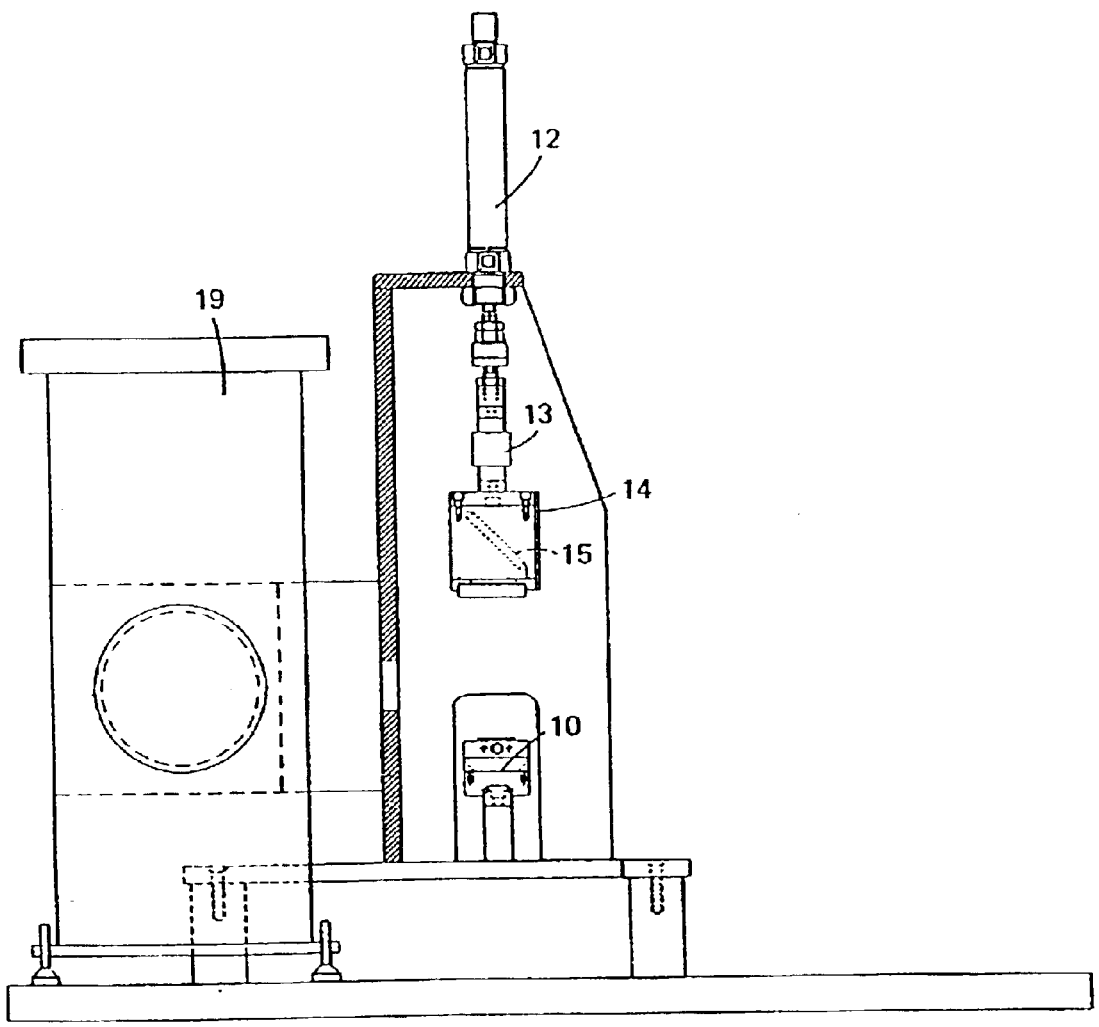
FIG. 11(b) is a diagram in elevation of the apparatus of FIG. 11(a), taken along the line A—A in FIG. 11(a).

In order to produce high quality anisotropically conductive adhesives or films (ACAs or ACFs respectively) it was necessary to design specialized formulations and specialized equipment. The film making equipment is illustrated in FIGS. 5, 11(a), and 11(b) and provides films up to approximately 20 square centimeters in area, although the test pieces routinely used were approximately 7.5 square centimeters in area. This example describes in detail the apparatus used to produce films and the processing steps involved.

As shown in FIG. 11(a), carriage 10 which is a flat platform constructed from polished non magnetic steel is used to hold the sample. The carriage includes a vacuum chuck to hold a substrate in place as well as a cartridge heater capable of raising the platform temperature to approximately 100° C., and a thermocouple for temperature sensing. The carriage is mounted on a Tufnal base to prevent any thermal transfer to the substructure on which it rests. The carriage rides on single track 11, again constructed from non magnetic material. The arrangement is such that the mounted carriage assembly can be moved to specific positions from the leftmost side of the apparatus to the right. On so doing it can be passed into the central plane of large magnetic (Halbach) cylinder 17. When processing is finished, the carriage can be retracted and moved from the right of the apparatus to the left.

The ferrofluid adhesive formulation containing a plurality of conductors is applied to a release coated substrate mounted on top of carriage 10. The the substrate is flat and may be reflective. A similarly treated substrate is placed over the top of the ferrofluid adhesive film. This substrate is UV transmissive When the ferrofluid adhesive composition comprising a plurality of conductors is confined by the two substrates the disposition of the conductive particles is initially random in three dimensions. The confined fluid is brought and locked into position in the next step of the film making process. If initial film assembly is considered step 1 of the process, the second step may be described as 'wet film thickness determination'. In this second step, the assembled film is compressed by apparatus identified by numerals 12–14 in FIG. 11(a). The object of this compression stage is to produce a homogeneous fluid film occupying the entire area of the confining top substrate with excessive liquid being squeezed out around the entire periphery of the top substrate. Not only does the compression achieve a substantially uniform fluid film, but pressure is applied which produces a fluid layer between the substrates such that the liquid layer is less than two conductive particle diameters in thickness. This situation is referred to as a monolayer of conductive particles. The fluid film is however thicker than a particle diameter so that the individual particles are free to move in the XY plane of the sample.

The hardware used in this second stage comprises an air driven cylinder 12 capable of delivering a continuously variable pressure up to 20 kgs per square centimeter, a pressure measuring device 13 and a specially designed cube 14 which eventually applies pressure to the film assembly. Cube 14 is open on one of its vertical faces to allow optical access for a UV beam. At a position corresponding approximately to the cube diagonal a high quality mirror 15, tuned to optimize UV reflection, is mounted at an angle of 45 degrees or less to deflect light downwards towards the underlying sample. The bottom face of the cube, i.e., that which is parallel to the sample plane, is a high quality fused silica optical flat 1 centimeter in thickness and approximately 5 centimeters on each side. This component is flat to 2/4 or better over 25 square millimeters measured at the green Ar ion laser line. The optical window in the cube base created by this component after mounting onto the cube assembly is 3 centimeters×3 centimeters. The optical flat sits proud from the base of the cube framework and hence applies pressure across an area up to 5 centimeters×5 centimeters. The entire assembly attached to the cylinder 12 can be made to appear weightless by differential pressure control to the cylinder regulated through precision controls in box 18. These controls also enable extremely gentle touch down of the assembly onto the sample below. Control box 18 further comprises heater control and feedback for the carriage cartridge heater. The remaining sides of the cube framework are polished metal optionally fitted with heat sinks on their outer surfaces. A heat sink may also be bonded to the rear side of the mirror within the cube to remove any heat generated by the lamp.

To generate a wet film having a thickness of approximately one conductive particle diameter, the pressure controls are regulated to compress the film assembly. This requires pressures typically in the order of a few kgs per square centimeter. The pressure is then removed and the film remains essentially at the compressed thickness. The carriage 10 bearing the compressed film is then inspected in step 3. Inspection is conducted with reflective mode microscope 16 usually operating at 200× magnification. The length of the film can be scanned. The image is relayed to a monitor by a video camera attached to the trinocular head of the microscope. When the operator is satisfied that the film is a monolayer with respect to thickness, the assembly can be sent to the next process step. If the film is not a monolayer, it may be sent back a step and recompressed under different conditions until a satisfactory result is observed. Once in monolayer configuration, the film is advanced into the poling gate 17 which comprises a large Halbach magnetic cylinder with a circular aperture of approximately 55 millimeters and a length of approximately 140 millimeters. This permanent magnet has been designed and constructed to deliver a substantially uniform magnetic field over the vast majority of its length. The Halbach cylinder delivers a field of 0.6 T, the orientation of which may be controlled by rotating it in its cup shaped housing. The strength of the magnetic field was selected to substantially saturate the ferrofluid compositions employed. To achieve a uniform dispersion of conductive particles such as that depicted in FIG. 7, the field will be applied normal to the sample. It has however been found helpful to achieve very high degrees of order to first pole the sample with the field direction parallel to the sample then subsequently redirect the field to a position normal to the sample. The period required for poling depends on a number of parameters such as the composition of the fluid with regard to magnetizable material, magnetization saturation of the fluid at the specific field applied, the viscosity of the formulation, the temperature of the sample, and the like. The sample temperature can be regulated by heating the mounting platform 10.

After the fourth step of poling, the sample is retracted from the magnet and re-inspected to check for conductor particle ordering. If ordering is not satisfactory, the sample may be re-poled. At this fifth stage or at the third inspection stage, the video camera output may be connected to an optical image analyzer, which provides quality control of the ordering process. The ordered fluid film is next retracted in step six back to the compression position. The ordered sample may be photocured at this point with or without pressure applied to the liquid film. In this process the sample is illuminated with UV light, item 19 in FIG. 11(a), to induce photocure and lock the arrayed conductors in place. An Oriel 1 kW XeHg arc lamp (LOT ORIEL, Leatherhead, Surrey, UK) with a 50 millimeter beam diameter and fitted with a dichroic mirror and electronic shutter was built into the film making fixture and used to partially cure, or A-stage, the ACFs. Following UV irradiation, the pressure, if applied, was released from the assembly and the cured film was carefully released from the substrates. The central section of the thus produced ACF, which was approximately 7.5 square centimeters in area, was used for physical testing.

Following cleaning or replacement of substrates, the operation could be repeated. The apparatus was designed to accommodate different types and sizes of conductor particles and different viscosity formulations. Process parameters could thus be obtained for continuous film making equipment.

Example 10

An example of a catalyzed formulation suitable for ACFs is described below:

| Component | Supplier | Description | Percentage w/w |
|---|---|---|---|
| Ebecryl Resin 604 | UCB Chemicals Drogenbos, Belgium | Acrylated Epoxy | 16.8 |
| Dihydrodicyclo Pentadienyl Oxyethyl Methacrylate | Rohm & Haas, Germany | Acrylate | 23.6 |
| Butane Diol Diglycidyl Ether (BDDGE) | Aldrich, US | Epoxy | 15.8 |
| Bisphenol F | Dow, US | Epoxy | 15.8 |
| Nadic Anhydride | Aldrich, US | Latent Hardener | 21.5 |
| IRGACURE 1700 | Ciba-Geigy, UK | Photoinitiator | 3.0 |
| HX3722 | Ashai, Japan | Catalyst | 3.9 |

Such a formulation photocures after 20 seconds irradiation by a medium pressure UV arc lamp at a film thickness of approximately 25 micrometers. A Si die of 36 mm² was placed on top of the photocured (A-staged) film and bonded to a FR4 board with 100 N force and 90 seconds heat treatment at approximately 180° C. Average die shear forces of around 450 N were recorded for this size of die.

A version of the above formulation was built up by mixing ferrofluid adhesive monomers with standard monomers as outlined below:

| Reference No. | Component | Percent w/w |
|---|---|---|
| 1 | FF* - Ebecryl Resin 604 | 7.3 |
| 2 | FF - Dihydrodicyclo Pentadienyl Oxyethyl Methacrylate | 3.0 |
| 3 | FF - Bisphenol F | 14.8 |
| 4 | Butane diol diglycidyl ether (BDDGE) | 15.0 |
| 5 | Ebecryl Resin 604 | 9.5 |
| 6 | Dihydrodicyclo Pentadienyl Oxyethyl Methacrylate | 19.5 |
| 7 | Nadic Anhydride | 24.5 |
| 8 | IRGACURE 1700 | 3.0 |
| 9 | HX3722 | 3.5 |

FF* refers to ferrofluid monomers prepared by Liquids Research Limited - see Example 1.

This can be performed either by adding two monomers to a third which has already been converted to a ferrofluid, or using a blend of monomers as a single polymerizable carrier. In the former case, the production of a typical ferrofluid based upon the low viscosity monomer Dihydrodicyclopentadienyloxyethyl Methacrylate (Ref. No. 2. above) is detailed below.

Heptane Intermediate:

Dissolve 404 g of Ferric Nitrate in pure water and make up to 500 mls. Dissolve 150 g of Ferrous Sulphate Heptahydrate in water and make up to 500 mls. Mix the above solutions together and add 450 mls of ammonia solution (specific gravity 0.88). Add 150 mls of oleic acid. Acidify the solution and separate the solid magnetite. Wash solids copiously with water and redisperse in heptane.

Production of Dihydrodicyclopentadienyloxyethyl Methacrylate ferrofluid using heptane stock:

Precipitate the required amount of heptane fluid and separate the solids. Add 0.3 ml/100 emu* of a phosphate ester surfactant such as GAFAC RE610 and 0.3 ml/100 emu of dispersant Bykanol-N from Byk-Chemie GmbH, D-4230 Wesel, Germany. Add the required amount of monomer and heat to evaporate the residual solvent. *emu is "electro magnetic unit" which is an alternative unit for the expression of magnetic saturation. 4×Pix ferrofluid density converts emu/g to Gauss units.

The approximate component percentages resulting from the above procedure are:

Dihydrodicyclopentadienyloxyethyl Methacrylate=80%
Oleic acid=5%
Magnetite=5%
Bykanol-N=<5%
Phosphate ester=5%

The above composition produces a ferrofluid of dihydrodicyclopentadienyloxyethyl methacrylate with a magnetization saturation of approximately 100 Gauss. Stronger fluids require additional loading of magnetite. The ultimate strength of the fully formulated adhesive composition is determined by dilution of high strength monomeric ferrofluids which are relatively easy to prepare, with more viscous non-ferrofluid monomers. The three constituents of the above-mentioned formulation, reference numbers 1–3, were derived from a single ferrofluid made up from these components in the appropriate ratios. A stable colloidal blend resulted with a viscosity at 27° C. of 1800 mPa·s (1.8 Nm$^{-2}$s) and an $M_s$ of 135 Gauss.

The ferrofluid adhesive formulation set out in the above-mentioned table was cured and mechanically tested in the same way as the non-ferrofluid version of the formulation. Average die shear strengths of approximately 260 N were recorded. Additionally when the formulation was loaded with 10% w/w 25 micrometer Au-coated polystyrene spheres and aligned in a magnetic field, then A and B-staged according to the invention, Z-axis contact resistance measurements using the four point probe method recorded 10 mOhms with an upper Cu substrate and a Au-coated FR4 lower substrate.

To minimize migration or exudation of a surfactant in the ferrofluid adhesive composition, it may be advantageous to utilize a reactive or polymeric surfactant such as available from Monomer-Polymer and Dajac Laboratories Inc. Trevose, Pa. 19047, U.S.A. [see also Wu, H. F. et al., Polymer Composites, 12(4), 281 (1993); and Rao, A. V. et al., Paint and Ink International, 15, 1995; Holmberg, K, Surface Coatings International, (12), 481 (1993)].

Example 11

In this example, photochemistry is also used to invoke A-stage cure, however the constituents of the formulation, which are responsive to photocure are derived from acrylic monomers rather than epoxies. The basic formulation is detailed below:

| Reference Number | Component | Percent w/w |
|---|---|---|
| 1 | Epoxy-Acrylate Resin IRR282, UCB Chemicals, Drogenbos, Belgium | 36.71 |
| 2 | Bisphenol F, Dow, US | 10.84 |
| 3 | Irgacure 1700, Ciba-Geigy, UK | 3.85 |
| 4 | Butane diol diacrylate | 26.92 |
| 5 | DICY | 5.24 |
| 6 | Benzyl dimethylamine | 0.35 |
| 7 | Au-coated spheres, Sekisui KK, Osaka, Japan | 16.08 |

In order to optimize viscosity and magnetic strength of the formulation, item 1 was derived from an IRR282 based ferrofluid ($M_s$ 115 G; viscosity at 27° C. of 115 mPa·s=0.115 Nm$^{-2}$s) and 29.86% of item 4 was derived from a butane diol diacrylate based ferrofluid ($M_s$ 116 G; viscosity at 27° C. of 12 mPa·s=0.012 Nm$^{-2}$s). The ferrofluids were prepared by Liquids Research Limited—see Examples 1 and 10. The residual balance of item 4 was derived from pure butane diol diacrylate monomer. The formulation formed a stable colloid when all ingredients were admixed. The magnetic strength of the resulting low viscosity formulation was approximately 50 G. The gold-coated spheres were either exclusively 12, or exclusively 25 micrometers in diameter.

Formulations of this type have been designed to A-stage cure to a handleable solid form which may be either supported or unsupported. In this case the films were unsupported or free standing.

Example 12

A formulation similar to that described in Example 11 was prepared according to the details set out below:

| Reference No. | Component | Percent w/w |
|---|---|---|
| 1 | FF* - Epoxy-Acrylate Resin IRR282, UCB Chemicals, Drogenbos, Belgium | 26.8 |
| 2 | Bisphenol F, Dow, US | 12.5 |
| 3 | IRGACURE 1700, Ciba-Geigy, UK | 4.5 |
| 4 | Butane diol diacrylate | 20.4 |
| 5 | Nadic Anhydride, Aldrich, UK | 18.36 |
| 6 | HX3722 | 2.5 |
| 7 | Au-coated spheres, Sekisui KK, Osaka, Japan | 15.0 |

FF* refers to ferrofluid monomer prepared by Liquids Research Limited - see Examples 1 and 10.

The formulation had a magnetic strength of approximately 31 G. Alignment of conductor particles was facilitated by gentle heating before photocure. Free standing 25 micrometer films were produced after 20 seconds of UV irradiation. Si die 36 mm$^2$ in area were bonded in a B-stage operation on the photocured film which entailed 90 seconds of thermal treatment at 180° C. and 100 N force applied to the die with flip-chip bonding equipment ('Fineplacer', FINETECH electronic, Berlin, Germany). Average die shear strengths of 140 N were recorded. Electrical measurements in the Z-axis show the film to have 120 mOhm resistance after B-staging.

Examples 13–27 further illustrate the present invention.

Example 13

A series of ferroadhesives were prepared. The formulation details are described below:

| | Type I Formulations | | | | | | |
|---|---|---|---|---|---|---|---|
| | | | | | | Characteristics | |
| | Formulation Composition % w/w | | | | | | Approx. $\eta$(MPa·s) |
| Entry | APG511A | APG513A | Acrylic acid | IC1700 | KR-55 | Ms(G) | @ RT |
| 1 | 75 | — | 10 | 10 | 5 | 150 | 30 |
| 2 | 60 | — | 20 | 15 | 5 | 120 | 24 |
| 3 | 50 | — | 30 | 15 | 5 | 100 | 20 |
| 4 | — | 60 | 20 | 15 | 5 | 240 | 90 |
| 5 | — | 50 | 30 | 15 | 5 | 200 | 75 |
| 6 | — | 40 | 30 | 20 | 10 | 160 | 60 |

Note:
APG511A and APG513A are ferrofluid products available from Ferrofluidics Inc.

Type II Formulations

| Entry | Formulation Composition % w/w | | | | | Characteristics | |
|---|---|---|---|---|---|---|---|
| | | | | | | | Approx. (mPa·s) @ |
| | LOC249 | LOC259 | HDDA | Acrylic Acid | IC1700 | KR-55 | Ms (G) | RT |
| 1 | 70 | — | — | 20 | 10 | — | 95 | 18 |
| 2 | 60 | — | 10 | 15 | 10 | 5 | 81 | 15 |
| 3 | 80 | — | — | 10 | 10 | — | 108 | 20 |
| 4 | — | 50 | 30 | 10 | 10 | — | 148 | 35 |
| 5 | — | 60 | — | 17.5 | 12.5 | 10 | 177 | 42 |
| 6 | — | 40 | 25 | 20 | 10 | 5 | 118 | 28 |

LOC 249 and 259 are custom prepared ferroadhesives prepared in hexanediol diacrylate (HDDA) polymerisable carriers.

These formulations may be classified into two general classes: those in which the conventional ferrofluids are not in themselves polymerisable, but are formulated with various levels and types of monomer(s) which are polymerisable (Type I), and those derived from 100% polymerisable ferrofluid carriers (Type II). In each case the formulations contained various levels of initiator systems, such as a photoinitiator (IC 1700). The formulations may further contain specialized adhesion promoters for specific substrates, for example, KR-55 is an adhesion promoter for polyester available from Kennrich Petrochemicals, Inc., NJ which is compatible with ferrocolloids of either Type I or II.

In a typical procedure, a formulation containing approximately 10% w/w of 18 micron Au coated crosslinked polystyrene spheres (Sekisui KK, Japan) was applied to a polyester film. The liquid sample was laminated with a second polyester film or a thin glass cover slip. In the case where polyester films formed both sides of the laminate, rigid substrates, such microscope slides, were applied above and below the polyester films to keep the whole assembly flat and convenient to handle. The samples were poled in a 0.6 T uniform magnetic field generated by a permanent magnet configured in a Halbach cylinder arrangement. The direction of the field was perpendicular to the plane of the samples. Poling time was in the order of a few seconds. Following field poling the samples were irradiated from one specific side, for example, the underside, for approximately 0.3 seconds or less. The laminate was subsequently split apart by peeling the top polyester film off, to reveal a material which was only partially cured. The sample was washed or 'developed' with an organic solvent, to reveal an array of bright golden spheres adhered to the lower substrate by a thin carpet of cured ferroadhesive which uniformly covered the area which the lamp exposed. The organic solvent was chosen so as not to damage the thin cured layer of ferroadhesive. The washings removed all uncured ferroadhesive. Electron microscopic examination of the final cured layer revealed that the tacked spheres were held in place by a layer of cured ferroadhesive, approximately 1.5 microns in thickness.

Experiments were also conducted with particles of different sizes, types as well as with different concentrations of particles. Thus, for example, 7 micron Au coated crosslinked polystyrene spheres at 15% w/w were locked in arrays on the surface of a thin cured ferroadhesive. Non-conductive 25 micron uncoated polystyrene spheres were similarly adhered to the surfaces as were 15 micron regular hexagonal zeolite crystals, and the like. Solder particles were also locked onto surfaces using the abovementioned methods.

Example 14

Tacked array samples were prepared according to the general descriptions in Example 13 with the lower flexible substrate having release properties. Suitable substrates included oriented polypropylene (OPP) films siliconised OPP and polyester available from Sterling Coated Materials Ltd, Cheshire, UK. Care had to be exercised in the development of tacked array samples which adhered on substrates with release properties to avoid debonding the tacked array prematurely. Nevertheless robust samples could be prepared by optimising exposure conditions particularly with the OPP substrates. Siliconised polyester substrates have the advantage of greater dimensional stability at elevated temperature relative to OPP which can be important in downstream drying operations aimed at solvent removal from adhesive compositions cast atop the tacked array of particles.

Example 15

Tacked array samples prepared on release conferring flexible substrates were backfilled with different types of adhesive compositions to produce final transfer tape embodiments. In these embodiments the entire adhesive film, complete with particle arrays, may be transferred from their supporting substrates to substrates such as those comprising the device to be assembled, for example. In all cases the adhesive transfer tape had a built in B-stage capability; it thus contained a latent thermal hardener. The latter was essential to effect subsequent cure in end use.

In order to form a tape capable of transfer in the first instance, adhesives were formulated to produce an initial solid product form. This so-called A-staged film, was either completely uncured but derived from solid film forming resin mixtures after evaporation from a casting solvent, or, was initially partially cured, for example by photochemistry, to a solid like product form. The former approach has the advantage of presenting a film which can be completely cured by the end user, while the latter approach is completely solventless. Typical adhesive formulations suitable for backfilling tacked array samples from each type of sample are described below:

A typical solvent cast system comprised the following ingredients:

| Bisphenol A | EPIKOTE 1001 (ex. Shell) | 57% |
| --- | --- | --- |
| Bisphenol F | YDF-170 (ex Tohto Kasei) | 28% |
| Epoxy diluent | Heloxy 505 (ex. Dow) | 10% |
| Wetting agent | FC-430 (ex. 3M) | 2% |
| Fumed silica | (ex. Degussa) | 3% |

To this formulation a latent expoxy curing agent could be added. The amount of latent curatives is to be added depends on curative type as well as the final cure profile required in the B-stage and are readily adjusted by those skilled in the art. Optimization of the B-stage cure was effected using Differential Scanning Calorimetry (DSC) analysis, hot stage optical microscopy, and Dynamic Mechanical Thermal Analysis (DMTA) of final cured coatings. The casting formulations were typically 50% solids. Films were prepared at approximately 40 micron dry film thickness. Standard draw down techniques and Meyer rod applicator bars (Industry Tech Inc., USA) were used to apply the films to tacked array substrates which were taped on glass sheets during the backfilling operation. Toluene and or MEK were used as casting solvent systems. The films were dried in a fan assisted laboratory oven.

A typical UV A-staging system comprised the following ingredients:

| Bisphenol A | Epikote 828 (ex. Shell) | 46% |
| --- | --- | --- |
| Epoxy-Acrylate | Ebercryl 3201 (ex. UCB) | 46% |
| Wetting agent | FC-430 (ex. 3M) | 2% |
| Photoinitiator | IC1700 (ex. Ciba-Geigy) | 2% |
| Latent Hardener | Casamid 783 (ex. Swan) | 4% |

In the abovementioned example a specific DICY type hardener (Casamid 783) is described. This is not meant to limit the example. Other latent hardeners were also used.

In this case no solvent was used and films of comparable thickness to the aforementioned could be prepared by draw down. In some cases it was found helpful to laminate over the liquid film before curing with some flexible release coated material. Exposures of approximately 5 seconds or less at about 100 mW/cm$^2$ effected A-stage cure. Subsequent mechanical testing of lap shear joints prepared by placing a patch of thus cured (A-staged) backfiller itself (i.e., independent from a tacked array sample) between two metal lapshear specimens then heat curing the assembly at temperatures in excess of 150° C. for 10 minutes indicated that much additional curing occurred and strong bonds resulted.

Example 16

Hot melt adhesive films (reactive types available from Sika Werke GmbH, Liepzig, Germany) and passive types available from Samatech-Xiro Ltd., CH-3185, Schmitten, Switzerland) were individually placed atop a tacked array sample as described in Examples 13 and/or 14. The tacked array—Adhesive film assembly was placed between the rollers of a desktop office laminating machine, of the type used to make Membership or Visitor card badges (Ibico ML-4). The machine heated the assembly and applied pressure to it. After passage through the machine, the ordered array of spheres had completely transferred into the hot melt film, which could be peeled away. The spheres could be further depressed into the hot melt film if necessary by further laminating the film between two release coated substrates. In these experiments, the relative adhesion between the tacked layer to its initial substrate, e.g., polyester as in Example 13, and the adhesive film which was applied atop, was controlled with various treatments. Thus polyester adhesion promoters in the initial ferroadhesive formulation (cf. Example 13) encouraged the tack layer to remain on the initial substrate after the transfer operation into the hot melt film. Adhesion of the tack layer to the hot melt film was discouraged by incorporating a release agent in the developing solvent used to wash away excess ferroadhesive (cf. Example 13). Suitable release agents included the RA10 series and RA-95H available from Mayzo Inc., Georgia, U.S.A., and SILWET (ex. Witco). Alternatively one or more release agents were sprayed atop the tacked array before laminating with a hot melt film. In some cases ferroadhesive compatible release agents were included in the initial formulation prepared for the process. Examples of ferroadhesives compatible release agents included RAD 2200 available from Tego Chemie Service GmbH, Essen, Germany, which was compatible with diacrylate (Type II) ferrofluids.

In cases where cured ferroadhesive from the tack layer had transferred to the adhesive film as a result of lamination and the ferroadhesive layer was not required in the final product, the ferroadhesive layer could be removed easily from the final adhesive film by rubbing the sample with a moist tissue. With ferroadhesives derived from acrylic acid, moistening with aqueous solutions was particularly effective. In cases employing predominantly diacrylate based ferroadhesives, moistening with acetone solutions was particularly effective. Cleaning solvents were chosen on the basis of their non, or very limited, reaction with the surface layer of the adhesive matrix forming material. In either case, the fact that the ferroadhesive film was so thin (approximately 1.5 microns) meant that it was easily and quickly removed. Removal of the colour associated with the film gave a simple method for gauging when the cleaning process was complete. This process further enhanced the optical clarity of the resulting ACF.

The use of non reactive hot melt films provided a means of producing thermoplastic transfer adhesives. The films may also be used as anisotropically conductive test films when their bonding capability is not activated. The latter also is true of fully cured backfill matrices, or backfilled UV curing matrices which purposely do not have a B-stage capability.

Example 17

Formulations similar to those described in Example 15 were used to form B-stageable transfer tape or films on release coated flexible substrates without incorporating any particles therein. Particle arrays from tack layer samples were then transferred to these tapes via lamination as in Example 16. The tackiness of the films was adjusted to facilitate array transfer by including or adjusting epoxy diluent monomer (Heloxy 505) concentrations, and/or through the use of conventional tacifiers known to those skilled in the art (for example, Unitac types available from Union Camp, Vistanex available from Exxon, Vylons available from Toyobo). Thus the backfilling matrix could be applied to the particle array chassis by either backfilling with a wet formulation (Example 15), or, with a dry or preapplied film, in this case derived from essentially the same formulations modified for tack.

The dry lamination option in advantageous in that already formed commercially available B-stageable transfer tapes may be used as a matrix. It further permits a greater level of control of inventory management in the production of ACF type products which may require user defined specific particle types, concentrations, sizes, matrix types, and product formats. The process of transferring particle arrays into preformed films permits separation of the two key processes in the formation of ordered ACFs: (1) the process of forming a tacked array which involves ferroadhesive coating, temporary laminating, field aligning, UV exposure, delaminating and solvent developing, and (2) the backfilling operation which entails application and A-stage formation of the adhesive matrix to produce a solid form transfer tape. Where these processes are integrated, the rate determining step of the process is the field aligning step, which by default, would dictate the coating speed of wet backfilling operations. In certain cases it may be desirable to control the backfilling rate independently from the formation of the tacked array.

Example 18

Tacked array samples were prepared on polyester substrates as described in Example 13. These were used in lamination experiments using the equipment and methods described in Example 16. Polyethylene coated paper, however, was used as a second substrate. A tacked array sample was placed, array side down, atop a polyethylene coated paper (Sterling Coated Materials Ltd, Cheshire, UK), with the polyethylene side facing towards the array of gold spheres. The thus configured substrates was laminated as in Example 13 and the polyester substrate bearing the original array of spheres peeled away from the lower paper substrate immediately after lamination, the entire array of gold spheres, from the tack layer substrate, had transferred onto the paper substrate in perfect registration with the original. This experiment thus describes the use of a tacked array sample as a master in a transfer-replication process employing a substrate with a surface which can be rendered tacky, for example by heat. The particles in this experiment were transferred to the polyethylene coated paper substrate in by a processing of heating and pressing during the lamination process. Similar experiments were performed on transparent polyethylene coated polyester substrates, low density polyethylene films, wax coated polyester, and hot melt (ethylene vinyl acetate) coated polyesters.

Samples prepared in this way may be used in a variety of ways. Since the substrates mentioned above are release substrates, the particle arrays on polyethylene coated paper form a convenient structure for assembling a transfer anisotropically conducting adhesive tape. The interstitial spaces between the arrayed particles were backfilled using both the wet and dry methods described in Examples 15 and 16 respectively to produce ACFs already formed on a release substrate. Thus formed ACFs were heat de-tacked onto parts, e.g., glass microscope slides, ITO coupons or metalised boards, by gently heating the back side of the paper release liner, for example, whereupon the active adhesive matrix material complete with included particle arrays was deposited cleanly onto the receiving substrate without actually physically handling the thin adhesive polymer film.

Example 19

Tack array samples were produced according to the method described in Example 13 and used to prepare replica arrays on polyethylene coated paper according to the method described in Example 18. To an ITO-coated glass substrate coupon, such as the type used in the production of liquid crystal displays (LCDs) oriented with the ITO side facing upwards. A few drops of Loctite 358, a UV curing adhesive, were applied to an ITO-coated glass substrate coupon. The array of gold spheres on the release coated paper substrate was presented release side down to the liquid adhesive on the ITO substrate, and was tightly held in position. The assembly was irradiated briefly with UV light from the glass substrate side and the paper layer subsequently removed. Inspection showed that the array of golden spheres had transferred from the paper substrate onto the ITO-coated substrate and was locked-in-place by the cured adhesive, which nevertheless did not completely cover the spheres. A further drop of the liquid adhesive was dispensed atop the array of spheres located on the ITO-coated substrate and a flexible edge connector circuit was brought into contact with this and held tightly in place the adhesive was UV cured from the underside. This procedure enabled the array of golden spheres to be located in part between two conductive substrates. The assembly procedure furthermore did not displace the particle array as it had been locked in position in the first step of the two step cure-on-part procedure. Contact resistance measurements were performed to demonstrate reliable electrical interconnection between the flex circuit and the ITO mediated through the formed-in-place ACF.

Example 20

Tack array samples were prepared and replicas prepared therefrom as described in Examples 13 and 18. A few drops of a UV curable adhesive with a B-stage capability such as the second formulation described in Example 15, were placed on an opaque substrate such as metalised glass, the adhesive being in direct contact with the metal. The release coated paper substrate with particle arrays thereon was placed atop the liquid adhesive and the assembly clamped together. The assembly was irradiated from the paper side with radiation passing through the paper and curing or partially curing the adhesive. Upon removal of the release-coated paper, the adhesive had adhered to the opaque substrate and the array of golden spheres had also transferred from the paper to the opaque substrate. The substrate complete with pre-applied ACF was used to form a joint on another metal clad substrate by the action of heat and pressure with the joint displaying anisotropic electrical conductivity through the bondline.

Identical experiments were conducted on polyethylene and wax-coated polyesters in place of the polyethylene coated paper. These substrates had better optical clarity than the paper samples. The experiments described in this example indicate the feasibility of preparing pre-applied ACF to opaque (to UV light) electronic devices or parts such as unbumped integrated circuits, flex connectors and metal substrates.

Example 21

Tack array samples were used to prepare replica samples on release coated paper as described in previous examples. Samples on polyethylene coated papers were used to form instant anisotropically conductive joints by employing an instant cyanoacrylate adhesive to replace the UV, or UV plus heat, curing adhesives described in the previous two examples. While cyanoacrylate bonds are not known for their particular durability, they can be used in less demanding environments or in temporary ACF joints.

Example 22

An experiment was conducted as described in Example 19 up to the point where particles had been locked-in-place in arrays on the ITO-coated glass substrate (to simulate an LCD). Instead of applying the same liquid adhesive, which was used to adhere the particles to the part, a different adhesive was applied atop the structure on the part. Thus, for example, a hot melt film was applied and a flexible circuit was brought to bear on the film using pressure and elevated temperature to unite the assembly. Low contact resistance measurements and optical inspection through the ITO-glass substrate indicated good electrical continuity and no particle movement on the part after bonding. The joint could be subsequently reworked by remelting the hot melt film.

The joint could alternatively made permanent by application of a second liquid or paste adhesive atop the array which was locked on the part. Examples of suitable adhesives include two part epoxies which are highly durable, structural acrylics, and polyurethane adhesives with high peel strengths. Adhesive selection was based on application type, e.g., edge connection or chip mount, as well as whether rework was desirable or not.

Similar experiments were conducted on opaque substrates such as metalised Si wafers, FR4 circuit boards and the like using the methods described in Examples 19 and 20.

Example 23

Customized test circuit boards were designed to accommodate a single test chip. The test chip comprised an approximately 5×5 mm$^2$ silicon substrate on which was deposited a metallic seed layer used to promote adhesion to a copper overlayer which was deposited electrodlessly. The test die had a peripheral array of 54 bumps grown on the copper layer. The square bumps measured approximately 100 microns on edge and approximately 14 microns tall and were gold plated. Bump separation was approximately 80 microns. The circuit boards had a matching electrode pattern with gold plated metalisation. The board tracks fanned out to a pad array on the periphery of the square board which was convenient for manual testing with electrical probes using the four point probe test methodology know to those skilled in the art. The measuring device employed was a GenRad precision digibridge. Chips were assembled on a 'Finetec' Flip Chip placement machine.

Bonding conditions depended on the adhesive employed but generally bondline temperatures of approximately 180° C. were employed for approximately 60 seconds. The joints were assembled under approximately 100 N pressure applied across the entire test die. Anisotropically conductive adhesive films prepared according to the methods described in Examples 15, 16, 17, 19, 20 and 21 were employed in flip chip assembly. Overall electrical measurements typically averaged approximately 300–700 m per joint in laboratory tests.

Electrical measurements were also made on chip-on-board, chip-on-glass, chip-on-flex, flex-on-board, flex-on-glass and flex-on-flex assemblies demonstrating comparable joint resistances.

Example 24

Multiple layer anisotropically conductive adhesive films were prepared, either on flexible or rigid substrates, and on either passive (from an electrical conducting point of view) or device forming substrates according to methods outlined in previous examples (Examples 13, 14, 16, 18, 19, 20 and 22). Thus an array of particles was established on the substrates by way of forming a tack array and transferring the array via pressing or heat and pressing array into the substrates. A bilayer structure was established through the thickness of the film by irradiating the film with UV radiation, partially curing a backfilling matrix such as that described in Example 15. Over the top of the particle array, which was partially covered with the adhesive composition was added a second covering of adhesive formulation of a different type to the first. The second covering could be applied in either liquid or dry form, either on a flexible substrate or on a rigid substrate such as a part. In the second liquid coat option, the liquid may be solidified in a bilayer tape format or else may be solidified by curing on the part. The bilayer structure is advantageous in that it allows the formulator to tune the adhesiveness of each side of the applied film in accordance with substrate type.

Example 25

Multiple component anisotropically conductive films were prepared by establishing a particle array by the means described in previous examples and backfilling the array with formulations such those described in Example 15. In this example, however, stripe or stripes of B-stageable formulations, which did not contain particles, were formed in juxtaposition to the array loaded material.

Similar experiments, which essentially create areas of different adhesives side-by-side, were performed in more sophisticated patterns using masking techniques. Thus, for example, the photocurable, B-staging composition in Example 15 was used to surround a square pattern of particles established by transferring the tack array either by pressing alone or by a combination of heating and pressing. The square area was subsequently backfilled with a different matrix. These methods were also used to create structures in which the particle arrays were not backfilled, but walls of fully cured materials were established around the uncovered arrays.

Example 26

Particle array samples were prepared on various substrates according to the methods described in Examples 13, 14 and 18. A solvent casting formulation similar to that described in Example 14 was prepared, it differed in that no latent B-stage epoxy catalyst was included. Transfer tape embodiments of the depleted formulation were prepared and used in a lamination operation as described in Example 17. Before laminating with a tacked array (with or without the use of heat) a latent epoxy catalyst such as DICY was sprinkled liberally atop the samples. Film inspection using polarized light optical microscopy after laminating with the previously prepared transfer tape illustrated that the (birefringent) latent catalyst had transferred across into the body of the film along with the particles. This technique facilitates thermal management of films during processing.

Example 27

Samples were prepared according to the methods described in Examples 13 and 14 but were placed on a platform which could be driven at various speeds through the central bore of a 0.6 T Halbach cylinder. The particles in the ferroadhesive formulations were randomly disposed before entering the leading edge of the magnet but were uniformly distributed throughout the sample after leaving the magnet. In addition to uniform particle separation according to the general principles of magnetic hole alignment, an additional ordering dimension (axial ordering) was achieved through the dynamics of the sample movement in the static field which tended to cause further ordering of the separated particles in lines parallel to the direction of movement of the sample. The ordering was more evident the faster the sample was traversed through the field. Axial ordering in the direction of movement of the sample for example was observed at a speed of approximately 4 m/min, for Type I, formulation 4 from Example 13. High degrees of ordering were captured by photocuring in situ in the magnetic field, i.e., by passage of the ordered sample across a beam of light.

Example 28

A photosensitive ferroadhesive was prepared as previously described (Example 1). The ferroadhesive may be prepared so that it contains customer specified loadings of conductive spheres in the range 3–70 um. The particles are monodisperse in diameter within any size in the specified range. Thus 5 um particles have a diameter variation of approximately 0.2 um. (Also available would be 30 um monodisperse particles with similar tolerances.) The conductive particles used are commercially available from Sekisui KK, Osaka, Japan under the Micropearl™ brand.

The particle loaded ferroadhesive mixture was applied to a continuously moving (0.5 m/min) polyester web where it became laminated with another identical web moving under identical tension and at the same speed. A confined monolayer of particles resulted due to the pressure of the laminating nip that brings the two films together. The confined monolayer contains a random dispersion of particles at this point. As the confined monolayer of particle progresses, it enters a magnetic tunnel where the magnetic field is oriented normally to the plane of the laminate. This separates the non-magnetic conductive particles by virtue of induced magnetic moments. The separated particles are then pinned to one substrate and are thereby locked in place so they cannot randomise after the web leaves the magnetic tunnel, i.e., after the samples can feel the influence of the magnetic field. The particle arrays are locked in place by continuously photoexposing the laminate as it passes under an EFOS UV curing unit. The light is piped into a cavity in the magnetic tunnel from an EFOS liquid light guide and the light fans out to span the width of the laminate (approximately 100 mm) by means of an EFOS optical fibre lightline. A striped pattern is created by inserting a shadow mask between the output of the lightline and the laminate whilst inside the magnet. The mask is held in place with a mechanical fixture. The mask used may comprise a standard laboratory microscope slide with regions taped off with black pressure sensitive adhesive tape. The striped pattern runs parallel to the short axis of the microscope slide. The long axis of the slide runs parallel to the short axis of the web, i.e. parallel to the web width. The web is off wound from rolls approx. 500 m in length.

Following masked photoexposure of the laminate, tacked uniformly separated particle arrays emerge from the magnet on one web substrate only, the laminate being continuously split open. The non-particle bearing web is spooled continuously on a rewind station and is discarded subsequent to the end of the process. This is optionally washed before spooling and any untacked particles may be recovered. The particle bearing web progresses to a spray tank where any residual uncured monomer is washed free. Such material contains untacked particles from regions that were not photoexposed due to shadow masking. The spray tank is designed with a conical base and a centrally located catchpot where unused particles can be recovered.

Stripes of particle arrays are transferred to hotmelt preformed films, such as Smart melt 039, available from Henkel KgaA, Dusseldorf, Germany in a laminating nip that unites the particle carrying web and the preform film web. The film bearing the striped particle array is stripped of its particles and the waste re-spooled and discarded. The film preform web now has a pattern of arrayed particles therein and is respooled. This may be slit from the original 100 mm wide format to narrower customer specified widths. Thus, for example, a customer may require a 10 mm wide reel with 2×2 mm stripes of conductors running continously along a 50 m length with the conductor stripes being separate from one another by 2 mm of particle free adhesive. In this example there would be 2 mm margins of particle free adhesive on the outer edges of the slit film. Such slit films may be wound on customer specified bobbins compatible with reel-to-reel processing equipment operated by the end user.

Example 29

In this example an ACF was produced having a dashed pattern. The process was carried out as described above except the light source was linked to a function generator that controls an electromagnetic shutter so that the masked light is additionally chopped. The resulting product has a dashed pattern impressed therein comprising 2 mm stripes of conductors interrupted by 10 mm zones free of particles. This resulted when the light source used for phototacking the particles was repeatedly switched on for 1.2 seconds and off for 1.2 seconds when the web speed was 0.5 m/minute.

Example 30

This example illustrates the process involving embossed transfer. An embossing roller was prepared by coating a 100 m diameter roller with a hard rubber and machining a pattern into it. The pattern comprised squares with 4 mm edges and the center of each was drilled out with a 1.5 mm drill bit. The raised pattern was approximately 2 mm high.

The process was set up and carried out as detailed in Example 28, except that a shadow mask was not used. Following washing of the particle-carrying web, selective transfer of the tacked particles held in the polymerised ferrofluid ("tack") layer to an epoxy preformed film was carried out. The embossed roller was used for the transfer of tacked particles. During transfer to the host preform film, only the raised regions on the embossed roller impressed particles to the film. Particles in pattern depressions remained on the particle bearing web after the transfer process. The resulting 100 mm web of epoxy preform was patterned with replica squares comprising ordered arrays of conductive particles. The 100 mm wide roll, 50 m in length may then be slit and reeled to customer requirements.

Example 31

A ferroadhesive formulation was made up comprising 70% w/w of a toluene based ferrofluid (Liquids Research Ltd, Bangor, Wales) with magnetisation saturation typically of 409 G and room temperature (approximately 23° C.) viscosity of typically 8 cps, 15% w/w acrylic acid, and 15% w/w UV photoinitiator IC1700 (Ciba Speciality Chemicals). To this was added a quantity of monodisperse, conductive microspheres at an overall concentration of 36%–50% w/w. The quantity of conductive particles comprised two different sizes of spheres in different proportions, thus:

Example 31a: conductive particles forming an overall 50% w/w portion of the formulation comprised 25% w/w of 4.6 micron diameter conductive spheres 24GNR4.6-EH (Nippon Chemical Industrial Co. Ltd, Tokyo, Japan) which have a crosslinked benzoguanidine polymeric core, and 25% w/w 3 micron diameter conductive spheres Micropearl™ Au203 (Sekisui KK, Osaka, Japan) which have a divinylbenzene crosslinked polystyrene core.

Example 31b: as in Example 31a except that conductive particles forming an overall 36% w/w portion of the formulation comprised 11% w/w of the 4.6 micron particles, and 25% w/w of the 3 micron particles.

In each case the formulation comprising ferrofluid, polymerisable monomer, photoinitiator, and microparticles, was thoroughly stirred before and during dispensing onto a 90 mm wide polyester film that was subsequently laminated against a second polyester film by way of laminating rollers. The liquid particle containing laminate was passed at approximately 0.5 m/min through a magnetic poling field of approximately 0.6T strength disposed orthogonally to the sample plane in a continuous feed reel-to-reel operation. The magnetic field functions to separate the microparticles according to magnetic hole theory. The laminate was photocured on a continuous basis so that once separated, the microparticles were locked in place by curing the acrylic acid monomer to a sufficient depth, taking account of the fact that there are particles of two different sizes. The spacing between the film substrates was determined by the larger particles, while the smaller particles would be likely to lie along the mid-line between the substrates (see FIG. 17). With particles of 4.6 and 3 micrometer diameters, the particles of 3 micrometer diameter would be likely to be spaced about 0.8 micrometers from each substrate. The depth of cure in the "tack layer" should therefore be sufficient to reach and hold the smaller particles, for example a depth of about 1.5 micrometers, which would allow an overlap with the smaller particles for about 0.7 micrometers. The depth of cure was controlled by the speed of travel of the laminate and the intensity of the photocuring illumination.

The laminate was subsequently split apart in such a way that separated particles adhered to one polyester substrate only. Unpolymerised monomer and other excess liquid components were subsequently washed away by an acetone spray and the sample dried. Image analysis techniques based on optical microscopy were then used to characterise particle density on the sample in terms of particles per square millimeter (p/mm$^2$). Alternatively image analysis was conducted on a sample which comprises the separated particles replicated, or transferred into a second substrate, such as an epoxy adhesive film, hot melt film, and the like.

Image analysis results indicated typical densities measured over several optical 0.5 mm$^2$ fields, of 25,000 p/mm$^2$ in Example 31a, and typically 20,000 p/mm$^2$ in Example 31(b).

When Example 31(b) was repeated with 4.6 micron spheres only, particle densities of around 6,000–6,500 p/mm$^2$ were achieved. When the aforementioned 4.6 micron spheres were replaced with 5 micron particles with a more compressible core material such as polystyrene crosslinked with divinylbenzene and known as Micropearl™ Au203 (Sekisui KK, Osaka, Japan), particle densities of 8,000–8,500 p/mm$^2$ were achieved. These values were not substantially different if the overall concentration of microparticles was increased above 36% w/w. When Example 31b was repeated with 3 micron diameter spheres only, particle densities of 14,000–20,000 p/mm$^2$ were achieved.

Thus, whereas use of pure 3 micron spheres can achieve particle densities up to approximately 20,000 p/mm$^2$ when the initial loading is 36% w/w or greater, similar or greater densities can be achieved when 3 micron spheres are used in conjunction with larger spheres such as 24GNR4.6-EH using concentrations of the 3 micron spheres as low as 26% w/w. Further the use of one type of sphere only will dictate the ultimate limit for particle density for the particular diameter of sphere used irrespective of concentration so that it is unlikely that densities of 25,000 p/mm$^2$ and higher can be achieved through the use of 3 micron particles alone. Similarly it is unlikely that densities much greater than 8,500 particles/mm$^2$ can be achieved through the use of 5 micron particles alone.

Where density measurements are referred to in this specification and in the claims, it is understood that particle densities relate to those measured when the particles are uniformly separated and reside in a single layer not substantially thicker than the diameter of the larger particle in the mixed particle case, or determined by the particle diameter of the particle itself in the cases where only one type of particle is employed, that is, for a monolayer of separated particles.

Example 32

In Example 31 the smaller particle in mixed particle experiments was 3 microns in diameter. Example 31 however indicates that particle density is limited with 4.6 or 5 micron diameter particles, when used alone, to between approximately 6,000 and 8,500 particles/square millimeter respectively at concentrations of 36% w/w or higher. To demonstrate that these limits may be exceeded with these particular particle diameters, mixed particle experiments were conducted and results were compared with those derived from the equivalent single particle type experiment.

Example 32a: A ferroadhesive formulation was prepared as described in Example 31. To this formulation were added 35% w/w of 5 micron diameter particles (as in Example 31) and 10% w/w of 7.25 micron diameter particles known as Micropearl™ CB-20725, available from Sekisui KK, Osaka, Japan. The formulation was applied as before in the system described in Example 31, but at approximately half the line speed. Image analysis revealed that a particle count of approximately 12,000 particles/mm$^2$ had been achieved. When 35% w/w of the 5 micron particles were used alone the measured particle density was 8,520 particles/mm$^2$; this density was not significantly increased (only a few hundred particles/mm$^2$) even at concentrations as high as 40% w/w.

Example 32b: An experiment similar to Example 32a was performed under the same conditions except that 35% w/w of the previously described 4.6 micron particles were used in conjunction with 10% w/w of the abovementioned 7.25 micron particles. Image analysis revealed that a particle count of approximately 9,200 particles/mm$^2$ had been achieved. When 35% w/w of the 4.6 micron particles were used alone the measured particle density was approximately 6,700 particles/mm$^2$, this density was not significantly increased even at concentrations as high as 40% w/w.

The mixed particle approach can hence achieve particle densities in excess of the maximum achievable with a single particle approach, particularly when the smallest particle is greater than 3 microns in diameter and therefore is not capable of achieving densities higher than about 8,500 particles/mm$^2$ when used alone.

Example 33

In certain cases it may be desirable to augment achievable particle density in the way described in Example 31, i.e., by using two particles where a large particle essentially provides a self-spacing function in a liquid laminate enabling unimpeded access and high densities of smaller particles, but it may be preferable to remove the larger particle from the system before tacked particles are transferred to a second substrate. Whereas removal of the larger particles will subtract from the final particle density, judicious choice of concentrations and particles sizes still enables achievement of the overall objective of enhancing the particle density above a value achievable by use of the smaller particle alone.

One means of exemplifying the abovementioned goal is by selective dissolution. Thus for example uncoated, uncrosslinked or very lightly crosslinked polystyrene spheres have been formulated with ferrofluid adhesive formulations known not to solvate polystyrene (cf. formulations 1, 3 and 5 of the Type II formulations in Example 13), held on substrates by photo-cured tack layers that were passed before an acetone spray. After drying the substrate by evaporation of solvent, the substrate was inspected and found to be devoid of particles. However the carpet layer that had tacked these particles indicated their former presence since dimples or craters on this layer were visible. Similarly in mixed particle experiments, smaller metal-coated crosslinked particles were present in the formulation at 2–3 times the weight/weight concentration of the larger uncoated, uncrosslinked particles. The smaller metal-coated crosslinked particles remained on the web after acetone wash whereas the larger particles were not present. This situation was reflected in subsequent articles prepared by transfer of collection of particles to a second substrate. The voids created by the absence of larger particles then appeared as minor defects in an array comprising smaller particles only. Because of the tiny area occupied by discrete particles (approximately 20 square micrometers per particle for a 5 micrometer diameter large particle) and the fact that these are randomly dispersed throughout a much higher concentration of smaller particles, it is not thought to be disadvantageous in end use (because, for example, typical pad areas on flip chip devices on basic mobile phone displays have areas of approximately 3,000 square micrometers) to accept isolated microvoids for an overall gain in particle density at relatively low concentrations of the smaller particles achieved through use of a mixed particle strategy.

What is claimed is:

1. A method of forming a monolayer of substantive particles the method comprising the steps of:
   (a) applying to a substrate a curable composition having substantive particles contained therein, the substantive particles having a particle size on at least one dimension thereof of at least 1 micrometer and being in two or more groups of different sizes;
   (b) applying a second substrate over the curable composition to confine the curable composition between the substrates;
   (c) applying pressure to the assembled substrates to produce a monolayer of particles of the different sizes;
   (d) exposing the substantive particle-containing curable composition to a source of energy suitable for effecting polymerization of the curable composition for a sufficient time to effect polymerization of a layer of the curable composition in the discrete regions having a thickness of no more than 50% of the height of the largest substantive particles; and
   (e) optionally, after separating the substrates, removing uncured curable composition.

2. A method of forming a monolayer of substantive particles the method comprising the steps of:
   (a) applying to a substrate a curable composition having substantive particles contained therein, the substantive particles having a particle size on at least one dimension thereof of at least 1 micrometer and being in two or more groups of different sizes but of substantially uniform size within the group of larger size;
   (b) applying a second substrate over the curable composition to confine the curable composition between the substrates;
   (c) applying pressure to the assembled substrates to produce a monolayer of particles of the different sizes;
   (d) selectively exposing discrete regions of the substantive particle-containing curable composition to a source of energy suitable for effecting polymerization of the curable composition for a sufficient time to effect polymerization of a layer of the curable composition in the discrete regions having a thickness of no more than 50% of the height of the largest substantive particles thus also creating regions wherein the curable composition remains substantially uncured; and
   (e) optionally, removing uncured curable composition.

3. A method according to claim 1 wherein the curable composition comprises a curable ferrofluid composition.

4. A method according to claim 3 further comprising the step of subjecting the particle-containing curable ferro-fluid composition to a magnetic field for a sufficient time to array the particles in a non-random manner in the composition prior to exposure.

5. A method according to claim 1 further comprising the step of:
   (f) selectively transferring particles held in the layer of polymerized composition to a second substrate.

6. A method according to claim 1 wherein the particles in a group of larger size particles have a size on at least one dimension thereof from about 4 to about 10 micrometers.

7. A method according to claim 1 wherein the particles in a group of larger size particles are less compressible than the particles of the other group or groups.

8. A method according to claim 1 wherein the particles of one group have a particle size from about 2 to about 5 micrometers.

9. A method according to claim 1 wherein two groups of spherical particles are used, the particles in one group having a diameter from about 4.6 to about 5.0 micrometers and the particles in the second group having a diameter of about 3.0 micrometers.

10. A method according to claim 1 wherein two groups of spherical particles are used, the particles in one group having a diameter from about 6.5 to about 7.5 micrometers and the particles in the second group having a diameter from about 4.5 micrometers to about 5.0 micrometers.

11. A method according to claim 1 wherein the concentration of substantive particles in the curable matrix is in the range from about 20 to about 50% w/w.

12. A method according to claim 11 wherein the concentration of particles of the smaller size group is in the range from about 10 to about 40% w/w.

13. A method according to claim 12 wherein the concentration of particles of the smaller size group is in the range from about 15 to about 35% w/w.

14. A method according to claim 1 wherein particles of a size in the range from about 2 to about 4 micrometers have a density on the substrate of at least about 15,000 particles/$mm^2$.

15. A method according to claim 14 wherein the density of the particles on the substrate is in the range from about 15,000 to about 30,000 particles/mm².

16. A method according to claim 1 wherein particles of a size in the range from about 4.5 to about 5 micrometers have a density on the substrate of at least about 9,000 particles/mm².

17. A method according to claim 16 wherein the density of the particles on the substrate is in the range from about 9,000 to about 12,500 particles/mm².

18. A substrate having an array of monolayered substantive particles made according to the method of claim 1.

19. A substrate having a repeated pattern array of monolayered substantive particles made according to the method of claim 2.

20. A method of forming a monolayer of substantive particles, the method comprising the steps of:
(a) applying to a substrate a curable composition having substantive particles contained therein, the substantive particles having a particle size on at least one dimension thereof of at least 1 micrometer and being in two or more groups of different sizes, the particles in one group being larger than the other particles and being of soluble material;
(b) applying a second substrate over the curable composition to confine the curable composition between the substrates;
(c) applying pressure to the assembled substrates to produce a monolayer of particles of the different sizes;
(d) exposing the substantive particle-containing curable composition to a source of energy suitable for effecting polymerization of the curable composition for a sufficient time to effect polymerization of a layer of the curable composition in the discrete regions having a thickness of no more than 50% of the height of the largest substantive particles;
(e) separating the substrates; and
(f) applying a solvent to remove uncured curable composition and to dissolve the particles of the group of larger size.

21. A method according to claim 20, wherein the two groups of different sized particles are:
(a) a group of particles of larger size and of soluble material, and
(b) a group of particles of a smaller size having a particle size about 3 micrometers, present in a concentration below about 30% w/w of the curable composition, to produce particle densities on the substrate in excess of 15,000 particles/mm² after dissolution of the particles of larger size.

22. A substrate having an array of monolayered substantive particles made according to the method of claim 20.

23. A substrate made according to the method of claim 21 having an array of monolayered substantive particles of a particle size of about 3 micrometers, the array of monolayered substantive particles being present at a density in excess of 15,000 particles/mm².

24. A substrate having an array of monolayered substantive particles of a particle size of about 3 micrometers, the array of monolayered substantive particles being present at a density in excess of 15,000 particles/mm² made with a curable composition in which the particles present in a concentration below about 30% w/w of the curable composition.

25. A substrate having an array of monolayered substantive particles of a particle size from about 4.5 to about 5.0 micrometers, the array of monolayered substantive particles being present at a density in excess of 9,000 particles/mm².

* * * * *